(12) United States Patent
Toda et al.

(10) Patent No.: US 7,890,843 B2
(45) Date of Patent: Feb. 15, 2011

(54) SEMICONDUCTOR MEMORY DEVICE

(75) Inventors: Haruki Toda, Yokohama (JP); Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1024 days.

(21) Appl. No.: 11/674,342

(22) Filed: Feb. 13, 2007

(65) Prior Publication Data

US 2007/0220400 A1 Sep. 20, 2007

(30) Foreign Application Priority Data

Feb. 27, 2006 (JP) .............................. 2006-051199

(51) Int. Cl.
*H03M 13/00* (2006.01)

(52) U.S. Cl. ...................................... 714/782

(58) Field of Classification Search ................. 714/746, 714/755, 782, 799
See application file for complete search history.

(56) References Cited

U.S. PATENT DOCUMENTS

| | | | |
|---|---|---|---|
| 5,459,740 A | 10/1995 | Glaise | 714/755 |
| 6,185,134 B1 | 2/2001 | Tanaka | 365/185.33 |
| 6,611,938 B1 * | 8/2003 | Tanaka et al. | 714/763 |
| 7,096,313 B1 | 8/2006 | Chang et al. | 711/103 |
| 7,308,567 B2 * | 12/2007 | Yamamoto et al. | 713/1 |
| 7,369,433 B2 | 5/2008 | Toda | 365/210 |
| 7,552,378 B2 * | 6/2009 | Kawagoe et al. | 714/773 |
| 2004/0083334 A1 | 4/2004 | Chang et al. | 711/103 |
| 2007/0220400 A1 | 9/2007 | Toda et al. | |
| 2008/0082901 A1 | 4/2008 | Toda | |
| 2010/0115383 A1 | 5/2010 | Toda | |

FOREIGN PATENT DOCUMENTS

JP 2004-152300 5/2004

* cited by examiner

*Primary Examiner*—Shelly A Chase
(74) *Attorney, Agent, or Firm*—Oblon, Spivak, McClelland, Maier & Neustadt, L.L.P.

(57) ABSTRACT

A memory device includes an error detection and correction system with an error correcting code over Galois field $GF(2^n)$, which has an operation circuit configured to execute addition/subtraction with modulo $2^n-1$, wherein the operation circuit includes first and second operation parts for performing addition/subtraction with modulo M and modulo N (where, M and N are integers, which are prime with each other as being obtained by factorizing $2^n-1$), the first and second operation parts being for performing addition/subtraction simultaneously in parallel with each other to output an operation result of the addition/subtraction with modulo $2^n-1$, and wherein the first and second operation parts each includes an adder circuit.

15 Claims, 49 Drawing Sheets

$\nu(x)$ 
$\begin{cases} \vdots \\ d_{143} \otimes P^{143}_7 \; P^{143}_6 \; P^{143}_5 \; P^{143}_4 \; P^{143}_3 \; P^{143}_2 \; P^{143}_1 \; P^{143}_0 \quad \leftarrow p^{143}(x) \\ \oplus \\ d_{142} \otimes P^{142}_7 \; P^{142}_6 \; P^{142}_5 \; P^{142}_4 \; P^{142}_3 \; P^{142}_2 \; P^{142}_1 \; P^{142}_0 \quad \leftarrow p^{142}(x) \\ \oplus \\ d_{141} \otimes P^{141}_7 \; P^{141}_6 \; P^{141}_5 \; P^{141}_4 \; P^{141}_3 \; P^{141}_2 \; P^{141}_1 \; P^{141}_0 \quad \leftarrow p^{141}(x) \\ \oplus \\ d_{140} \otimes P^{140}_7 \; P^{140}_6 \; P^{140}_5 \; P^{140}_4 \; P^{140}_3 \; P^{140}_2 \; P^{140}_1 \; P^{140}_0 \quad \leftarrow p^{140}(x) \\ \oplus \\ \vdots \\ \oplus \\ d_2 \otimes P^2_7 \; P^2_6 \; P^2_5 \; P^2_4 \; P^2_3 \; P^2_2 \; P^2_1 \; P^2_0 \quad \leftarrow p^2(x) \\ \oplus \\ d_1 \otimes P^1_7 \; P^1_6 \; P^1_5 \; P^1_4 \; P^1_3 \; P^1_2 \; P^1_1 \; P^1_0 \quad \leftarrow p^1(x) \\ \oplus \\ d_0 \otimes P^0_7 \; P^0_6 \; P^0_5 \; P^0_4 \; P^0_3 \; P^0_2 \; P^0_1 \; P^0_0 \quad \leftarrow p^0(x) \end{cases}$ $S_1(x)$  $\quad\;\; \downarrow \;\; \downarrow \;\; \downarrow \;\; \downarrow \;\; \downarrow \;\; \downarrow \;\; \downarrow \;\; \downarrow$
$\quad\quad\;\;\; x^7 \; x^6 \; x^5 \; x^4 \; x^3 \; x^2 \; x \; 1$

FIG. 10

$$\nu(x) \begin{cases} d_n \\ \vdots \\ d_{143} \otimes P^{174}_7\ P^{174}_6\ P^{174}_5\ P^{174}_4\ P^{174}_3\ P^{174}_2\ P^{174}_1\ P^{174}_0 \leftarrow p^{429}(x)=p^{174}(x) \\ \phantom{d_{143} \otimes} \oplus \\ d_{142} \otimes P^{171}_7\ P^{171}_6\ P^{171}_5\ P^{171}_4\ P^{171}_3\ P^{171}_2\ P^{171}_1\ P^{171}_0 \leftarrow p^{426}(x)=p^{171}(x) \\ \phantom{d_{142} \otimes} \oplus \\ d_{141} \otimes P^{168}_7\ P^{168}_6\ P^{168}_5\ P^{168}_4\ P^{168}_3\ P^{168}_2\ P^{168}_1\ P^{168}_0 \leftarrow p^{423}(x)=p^{168}(x) \\ \phantom{d_{141} \otimes} \oplus \\ d_{140} \otimes P^{165}_7\ P^{165}_6\ P^{165}_5\ P^{165}_4\ P^{165}_3\ P^{165}_2\ P^{165}_1\ P^{165}_0 \leftarrow p^{420}(x)=p^{165}(x) \\ \vdots \\ d_2 \otimes P^6_7\ P^6_6\ P^6_5\ P^6_4\ P^6_3\ P^6_2\ P^6_1\ P^6_0 \leftarrow p^6(x) \\ \phantom{d_2 \otimes} \oplus \\ d_1 \otimes P^3_7\ P^3_6\ P^3_5\ P^3_4\ P^3_3\ P^3_2\ P^3_1\ P^3_0 \leftarrow p^3(x) \\ \phantom{d_1 \otimes} \oplus \\ d_0 \otimes P^0_7\ P^0_6\ P^0_5\ P^0_4\ P^0_3\ P^0_2\ P^0_1\ P^0_0 \leftarrow p^0(x) \end{cases}$$

$S_3(x^3)\qquad x^7\ x^6\ x^5\ x^4\ x^3\ x^2\ x\ 1$

FIG. 11

| data bit | n of xn | data bit | n of xn | data bit | n of xn | data bit | n of xn |
|---|---|---|---|---|---|---|---|
| 1 | 0 | 37 | 48 | 73 | 121 | 109 | 183 |
| 2 | 1 | 38 | 49 | 74 | 126 | 110 | 185 |
| 3 | 2 | 39 | 50 | 75 | 127 | 111 | 186 |
| 4 | 3 | 40 | 51 | 76 | 128 | 112 | 187 |
| 5 | 4 | 41 | 52 | 77 | 129 | 113 | 188 |
| 6 | 5 | 42 | 53 | 78 | 130 | 114 | 191 |
| 7 | 6 | 43 | 55 | 79 | 131 | 115 | 192 |
| 8 | 7 | 44 | 64 | 80 | 132 | 116 | 193 |
| 9 | 8 | 45 | 66 | 81 | 133 | 117 | 194 |
| 10 | 9 | 46 | 67 | 82 | 134 | 118 | 195 |
| 11 | 10 | 47 | 72 | 83 | 135 | 119 | 196 |
| 12 | 11 | 48 | 73 | 84 | 136 | 120 | 198 |
| 13 | 12 | 49 | 74 | 85 | 138 | 121 | 201 |
| 14 | 13 | 50 | 75 | 86 | 140 | 122 | 202 |
| 15 | 14 | 51 | 79 | 87 | 142 | 123 | 203 |
| 16 | 15 | 52 | 85 | 88 | 143 | 124 | 205 |
| 17 | 16 | 53 | 86 | 89 | 145 | 125 | 206 |
| 18 | 17 | 54 | 87 | 90 | 146 | 126 | 208 |
| 19 | 18 | 55 | 91 | 91 | 148 | 127 | 216 |
| 20 | 21 | 56 | 94 | 92 | 149 | 128 | 218 |
| 21 | 22 | 57 | 95 | 93 | 150 | 129 | 219 |
| 22 | 25 | 58 | 98 | 94 | 151 | 130 | 221 |
| 23 | 26 | 59 | 99 | 95 | 152 | 131 | 222 |
| 24 | 27 | 60 | 100 | 96 | 154 | 132 | 223 |
| 25 | 28 | 61 | 101 | 97 | 155 | 133 | 225 |
| 26 | 31 | 62 | 102 | 98 | 159 | 134 | 226 |
| 27 | 33 | 63 | 103 | 99 | 160 | 135 | 227 |
| 28 | 34 | 64 | 104 | 100 | 164 | 136 | 237 |
| 29 | 35 | 65 | 105 | 101 | 165 | 137 | 239 |
| 30 | 36 | 66 | 106 | 102 | 170 | 138 | 240 |
| 31 | 37 | 67 | 107 | 103 | 171 | 139 | 241 |
| 32 | 38 | 68 | 108 | 104 | 172 | 140 | 242 |
| 33 | 41 | 69 | 112 | 105 | 179 | 141 | 245 |
| 34 | 45 | 70 | 118 | 106 | 180 | 142 | 249 |
| 35 | 46 | 71 | 119 | 107 | 181 | 143 | 250 |
| 36 | 47 | 72 | 120 | 108 | 182 | 144 | 253 |

| number of "1" | pn(x)=x**n mod m1(x) | | | | | | | |
|---|---|---|---|---|---|---|---|---|
| | m= | 7 | 6 | 5 | 4 | 3 | 2 | 1 | 0 |
| | | 56 | 66 | 59 | 57 | 58 | 66 | 65 | 62 |
| 1 | | 7 | 6 | 5 | 4 | 3 | 2 | 1 | 0 |
| 2 | | 11 | 10 | 9 | 8 | 8 | 8 | 9 | 8 |
| 3 | | 12 | 11 | 10 | 9 | 9 | 10 | 13 | 12 |
| 4 | | 13 | 12 | 11 | 10 | 11 | 12 | 14 | 13 |
| 5 | | 17 | 16 | 15 | 14 | 12 | 13 | 15 | 14 |
| 6 | | 22 | 21 | 18 | 17 | 16 | 15 | 22 | 18 |
| 7 | | 31 | 22 | 21 | 21 | 17 | 16 | 25 | 21 |
| 8 | | 35 | 31 | 22 | 28 | 18 | 18 | 26 | 25 |
| 9 | | 38 | 34 | 33 | 35 | 22 | 21 | 33 | 33 |
| 10 | | 41 | 37 | 36 | 38 | 27 | 26 | 34 | 36 |
| 11 | | 45 | 41 | 47 | 41 | 28 | 27 | 37 | 45 |
| 12 | | 46 | 45 | 53 | 46 | 34 | 33 | 46 | 46 |
| 13 | | 49 | 48 | 55 | 52 | 35 | 34 | 47 | 47 |
| 14 | | 55 | 64 | 66 | 64 | 37 | 35 | 48 | 50 |
| 15 | | 67 | 66 | 72 | 79 | 46 | 36 | 51 | 64 |
| 16 | | 73 | 67 | 79 | 85 | 49 | 38 | 64 | 66 |
| 17 | | 74 | 72 | 86 | 86 | 51 | 41 | 67 | 72 |
| 18 | | 79 | 73 | 87 | 87 | 53 | 46 | 73 | 74 |
| 19 | | 85 | 79 | 91 | 94 | 64 | 48 | 75 | 75 |
| 20 | | 86 | 85 | 94 | 100 | 73 | 49 | 85 | 86 |
| 21 | | 91 | 87 | 95 | 105 | 74 | 50 | 87 | 87 |
| 22 | | 95 | 94 | 101 | 106 | 75 | 52 | 91 | 91 |
| 23 | | 99 | 95 | 106 | 108 | 87 | 64 | 95 | 94 |
| 24 | | 103 | 98 | 107 | 119 | 103 | 72 | 98 | 98 |
| 25 | | 108 | 102 | 120 | 120 | 104 | 75 | 99 | 100 |
| 26 | | 112 | 107 | 121 | 121 | 105 | 85 | 101 | 104 |
| 27 | | 118 | 108 | 126 | 129 | 107 | 87 | 105 | 112 |
| 28 | | 119 | 118 | 130 | 131 | 120 | 99 | 118 | 118 |
| 29 | | 127 | 121 | 132 | 132 | 127 | 102 | 119 | 119 |
| 30 | | 128 | 126 | 133 | 134 | 130 | 104 | 120 | 120 |
| 31 | | 132 | 127 | 135 | 143 | 131 | 106 | 121 | 128 |
| 32 | | 134 | 131 | 138 | 146 | 132 | 118 | 126 | 129 |
| 33 | | 135 | 133 | 142 | 148 | 133 | 121 | 129 | 133 |

| number of "1" | pn(x)=x**n mod m1(x) | | | | | | | |
|---|---|---|---|---|---|---|---|---|
| | m= | 7 | 6 | 5 | 4 | 3 | 2 | 1 | 0 |
| | | 56 | 66 | 59 | 57 | 58 | 66 | 65 | 62 |
| 34 | | 140 | 134 | 148 | 150 | 134 | 126 | 130 | 135 |
| 35 | | 146 | 136 | 151 | 154 | 135 | 127 | 134 | 136 |
| 36 | | 149 | 143 | 154 | 155 | 136 | 128 | 136 | 138 |
| 37 | | 151 | 145 | 155 | 159 | 142 | 129 | 142 | 145 |
| 38 | | 160 | 148 | 159 | 165 | 145 | 130 | 146 | 150 |
| 39 | | 164 | 150 | 160 | 170 | 146 | 131 | 148 | 152 |
| 40 | | 165 | 152 | 171 | 171 | 151 | 133 | 151 | 154 |
| 41 | | 170 | 155 | 172 | 172 | 152 | 136 | 155 | 159 |
| 42 | | 171 | 159 | 181 | 180 | 154 | 140 | 159 | 165 |
| 43 | | 180 | 160 | 182 | 181 | 172 | 143 | 160 | 170 |
| 44 | | 183 | 164 | 185 | 185 | 179 | 145 | 164 | 171 |
| 45 | | 187 | 170 | 186 | 187 | 186 | 149 | 170 | 172 |
| 46 | | 188 | 172 | 188 | 193 | 187 | 150 | 171 | 179 |
| 47 | | 192 | 179 | 194 | 194 | 193 | 160 | 172 | 181 |
| 48 | | 196 | 182 | 195 | 201 | 196 | 164 | 179 | 185 |
| 49 | | 203 | 183 | 201 | 202 | 201 | 170 | 180 | 188 |
| 50 | | 205 | 186 | 202 | 206 | 218 | 180 | 182 | 191 |
| 51 | | 216 | 187 | 203 | 208 | 222 | 183 | 185 | 193 |
| 52 | | 222 | 191 | 205 | 219 | 223 | 185 | 186 | 198 |
| 53 | | 227 | 195 | 218 | 227 | 226 | 186 | 192 | 205 |
| 54 | | 237 | 196 | 225 | 239 | 237 | 187 | 194 | 206 |
| 55 | | 242 | 202 | 240 | 241 | 240 | 188 | 198 | 208 |
| 56 | | 245 | 203 | 242 | 242 | 241 | 195 | 205 | 216 |
| 57 | | | 206 | 245 | 249 | 245 | 198 | 206 | 218 |
| 58 | | | 208 | 249 | | 250 | 205 | 216 | 221 |
| 59 | | | 216 | 250 | | | 219 | 218 | 223 |
| 60 | | | 219 | | | | 221 | 219 | 237 |
| 61 | | | 221 | | | | 225 | 222 | 245 |
| 62 | | | 226 | | | | 239 | 237 | 253 |
| 63 | | | 241 | | | | 240 | 239 | |
| 64 | | | 245 | | | | 249 | 249 | |
| 65 | | | 250 | | | | 250 | 253 | |
| 66 | | | 253 | | | | 253 | | |

FIG. 16

| number of "1" | p3n(x)=x3n mod m1(x) | | | | | | | | number of "1" | p3n(x)=x3n mod m1(x) | | | | | | | |
|---|---|---|---|---|---|---|---|---|---|---|---|---|---|---|---|---|---|
| | m= 7 | 6 | 5 | 4 | 3 | 2 | 1 | 0 | | m= 7 | 6 | 5 | 4 | 3 | 2 | 1 | 0 |
| | 58 | 55 | 73 | 54 | 53 | 64 | 59 | 71 | | 58 | 55 | 73 | 54 | 53 | 64 | 59 | 71 |
| 1 | 4 | 2 | 3 | 3 | 1 | 4 | 3 | 0 | 38 | 146 | 155 | 131 | 183 | 179 | 132 | 151 | 128 |
| 2 | 8 | 4 | 5 | 7 | 3 | 5 | 5 | 4 | 39 | 149 | 172 | 133 | 188 | 187 | 135 | 154 | 130 |
| 3 | 14 | 7 | 6 | 13 | 4 | 6 | 8 | 6 | 40 | 154 | 180 | 134 | 196 | 193 | 145 | 159 | 131 |
| 4 | 15 | 10 | 7 | 14 | 6 | 7 | 11 | 7 | 41 | 159 | 185 | 138 | 201 | 195 | 146 | 164 | 132 |
| 5 | 21 | 15 | 10 | 18 | 8 | 8 | 16 | 8 | 42 | 164 | 186 | 142 | 202 | 196 | 148 | 181 | 134 |
| 6 | 27 | 16 | 11 | 26 | 9 | 9 | 17 | 11 | 43 | 185 | 188 | 143 | 205 | 198 | 150 | 186 | 135 |
| 7 | 31 | 18 | 12 | 31 | 17 | 11 | 25 | 12 | 44 | 191 | 192 | 150 | 206 | 202 | 151 | 187 | 138 |
| 8 | 33 | 22 | 13 | 35 | 25 | 12 | 27 | 13 | 45 | 201 | 194 | 152 | 208 | 205 | 154 | 193 | 140 |
| 9 | 36 | 26 | 14 | 36 | 26 | 13 | 28 | 14 | 46 | 202 | 196 | 154 | 221 | 208 | 160 | 195 | 142 |
| 10 | 37 | 27 | 21 | 38 | 28 | 14 | 31 | 15 | 47 | 203 | 198 | 160 | 223 | 218 | 165 | 198 | 143 |
| 11 | 41 | 28 | 22 | 47 | 35 | 16 | 33 | 21 | 48 | 206 | 202 | 165 | 225 | 219 | 179 | 201 | 148 |
| 12 | 45 | 34 | 26 | 50 | 37 | 25 | 35 | 22 | 49 | 218 | 206 | 180 | 226 | 226 | 181 | 203 | 151 |
| 13 | 48 | 36 | 27 | 51 | 38 | 27 | 37 | 25 | 50 | 221 | 222 | 181 | 227 | 237 | 182 | 205 | 155 |
| 14 | 51 | 37 | 28 | 53 | 45 | 31 | 38 | 27 | 51 | 222 | 223 | 182 | 237 | 240 | 183 | 208 | 164 |
| 15 | 52 | 41 | 31 | 55 | 48 | 33 | 51 | 28 | 52 | 225 | 226 | 183 | 240 | 249 | 186 | 221 | 170 |
| 16 | 55 | 50 | 38 | 67 | 49 | 34 | 53 | 41 | 53 | 226 | 240 | 191 | 241 | 250 | 193 | 223 | 181 |
| 17 | 64 | 52 | 45 | 73 | 67 | 37 | 64 | 45 | 54 | 227 | 241 | 192 | 253 | | 194 | 227 | 182 |
| 18 | 72 | 53 | 46 | 98 | 74 | 38 | 66 | 46 | 55 | 239 | 242 | 193 | | | 195 | 239 | 183 |
| 19 | 74 | 72 | 48 | 99 | 79 | 41 | 72 | 47 | 56 | 241 | | 194 | | | 201 | 241 | 185 |
| 20 | 79 | 73 | 49 | 103 | 86 | 47 | 73 | 49 | 57 | 242 | | 196 | | | 203 | 242 | 191 |
| 21 | 99 | 87 | 52 | 104 | 91 | 50 | 74 | 50 | 58 | 249 | | 198 | | | 208 | 249 | 192 |
| 22 | 100 | 95 | 53 | 105 | 94 | 52 | 79 | 53 | 59 | | | 201 | | | 222 | 253 | 193 |
| 23 | 104 | 100 | 67 | 120 | 102 | 66 | 101 | 55 | 60 | | | 208 | | | 226 | | 194 |
| 24 | 105 | 101 | 75 | 121 | 104 | 73 | 102 | 66 | 61 | | | 216 | | | 239 | | 195 |
| 25 | 106 | 103 | 91 | 128 | 105 | 75 | 104 | 72 | 62 | | | 218 | | | 245 | | 198 |
| 26 | 112 | 107 | 95 | 129 | 108 | 91 | 108 | 79 | 63 | | | 219 | | | 250 | | 202 |
| 27 | 118 | 112 | 98 | 132 | 120 | 94 | 112 | 85 | 64 | | | 222 | | | 253 | | 216 |
| 28 | 121 | 119 | 99 | 135 | 129 | 98 | 118 | 91 | 65 | | | 223 | | | | | 219 |
| 29 | 126 | 121 | 104 | 136 | 130 | 99 | 120 | 98 | 66 | | | 226 | | | | | 223 |
| 30 | 129 | 125 | 105 | 138 | 133 | 101 | 127 | 99 | 67 | | | 227 | | | | | 225 |
| 31 | 130 | 127 | 106 | 140 | 134 | 108 | 128 | 100 | 68 | | | 237 | | | | | 227 |
| 32 | 133 | 135 | 107 | 142 | 152 | 112 | 136 | 105 | 69 | | | 239 | | | | | 240 |
| 33 | 136 | 138 | 108 | 143 | 155 | 118 | 138 | 106 | 70 | | | 241 | | | | | 242 |
| 34 | 140 | 143 | 112 | 145 | 159 | 119 | 142 | 107 | 71 | | | 245 | | | | | 249 |
| 35 | 142 | 146 | 127 | 148 | 164 | 126 | 145 | 108 | 72 | | | 250 | | | | | |
| 36 | 143 | 148 | 129 | 152 | 165 | 127 | 148 | 112 | 73 | | | 253 | | | | | |
| 37 | 145 | 150 | 130 | 155 | 171 | 128 | 149 | 126 | 74 | | | | | | | | |

| αn n | m=7 | 6 | 5 | 4 | 3 | 2 | 1 | 0 | hex. | αyn yn | Error # ↓ | n | αn n | m=7 | 6 | 5 | 4 | 3 | 2 | 1 | 0 | hex. | αyn yn | Error # ↓ | n |
|---|---|---|---|---|---|---|---|---|---|---|---|---|---|---|---|---|---|---|---|---|---|---|---|---|
| 156 | 0 | 1 | 0 | 1 | 1 | 1 | 1 | 1 | 5F | 64 | 2 | 169 | 208 | 1 | 0 | 0 | 0 | 0 | 0 | 0 | 1 | 81 | 112 | 2 | 54 |
| 157 | 0 | 0 | 0 | 0 | 0 | 1 | 1 | 0 | 06 | 26 | 2 | 41 | 209 | 1 | 1 | 0 | 0 | 0 | 0 | 0 | 0 | C0 | 31 | 2 | 91 |
| 158 | 1 | 1 | 0 | 1 | 1 | 0 | 0 | 1 | D9 | 96 | 2 | 93 | 210 | 1 | 1 | 0 | 0 | 1 | 0 | 0 | 1 | C9 | 23 | 2 | 241 |
| 159 | 1 | 1 | 0 | 1 | 0 | 0 | 1 | 1 | D3 | 82 | 2 | 155 | 211 | 1 | 1 | 0 | 0 | 1 | 1 | 0 | 1 | CD | 12 | 2 | 171 |
| 160 | 0 | 1 | 0 | 1 | 1 | 0 | 0 | 1 | 59 | 210 | 2 | 81 | 212 | 1 | 0 | 0 | 1 | 1 | 1 | 0 | 1 | 9D | 32 | 2 | 78 |
| 161 | 0 | 0 | 0 | 1 | 0 | 0 | 1 | 0 | 12 | 224 | 2 | 108 | 213 | 0 | 1 | 0 | 0 | 0 | 0 | 0 | 0 | 40 | 6 | 2 | 233 |
| 162 | 1 | 0 | 0 | 1 | 0 | 0 | 0 | 1 | 91 | 165 | 2 | 65 | 214 | 0 | 0 | 0 | 0 | 1 | 1 | 1 | 0 | 0E | 199 | 2 | 116 |
| 163 | 1 | 1 | 0 | 1 | 1 | 1 | 1 | 0 | DE | 62 | 2 | 182 | 215 | 0 | 0 | 0 | 1 | 0 | 0 | 0 | 1 | 11 | 100 | 2 | 44 |
| 164 | 0 | 0 | 0 | 0 | 1 | 1 | 0 | 1 | 0D | 104 | 2 | 118 | 216 | 0 | 0 | 0 | 1 | 1 | 0 | 0 | 1 | 19 | 193 | 2 | 67 |
| 165 | 1 | 0 | 0 | 1 | 1 | 1 | 1 | 1 | 9F | 46 | 2 | 227 | 217 | 1 | 1 | 0 | 1 | 0 | 0 | 0 | 1 | D1 | 161 | 2 | 146 |
| 166 | 0 | 0 | 0 | 0 | 0 | 0 | 1 | 0 | 02 | 1 | 2 | 114 | 218 | 0 | 0 | 0 | 1 | 1 | 0 | 1 | 1 | 1B | 248 | 2 | 142 |
| 167 | 1 | 0 | 0 | 0 | 1 | 1 | 1 | 1 | 8F | 24 | 2 | 87 | 219 | 1 | 0 | 0 | 1 | 0 | 0 | 1 | 1 | 93 | 119 | 2 | 189 |
| 168 | 0 | 0 | 0 | 1 | 1 | 0 | 1 | 0 | 1A | 105 | 2 | 80 | 220 | 1 | 0 | 0 | 1 | 1 | 0 | 1 | 0 | 9A | 146 | 2 | 252 |
| 169 | 0 | 1 | 0 | 1 | 1 | 1 | 1 | 1 | 5F | 64 | 2 | 156 | 221 | 1 | 0 | 0 | 1 | 1 | 0 | 0 | 0 | 98 | 17 | 2 | 102 |
| 170 | 0 | 0 | 0 | 0 | 0 | 0 | 0 | 0 | 00 |  | 0 |  | 222 | 1 | 1 | 0 | 1 | 1 | 1 | 0 | 0 | DC | 187 | 2 | 237 |
| 171 | 1 | 1 | 0 | 0 | 1 | 1 | 0 | 1 | CD | 12 | 2 | 211 | 223 | 0 | 1 | 0 | 0 | 1 | 0 | 0 | 1 | 49 | 152 | 2 | 3 |
| 172 | 1 | 0 | 0 | 1 | 1 | 0 | 1 | 1 | 9B | 217 | 2 | 229 | 224 | 0 | 0 | 0 | 0 | 1 | 0 | 1 | 0 | 0A | 51 | 2 | 14 |
| 173 | 0 | 1 | 0 | 1 | 0 | 1 | 0 | 0 | 54 | 143 | 2 | 232 | 225 | 0 | 1 | 0 | 0 | 0 | 0 | 0 | 1 | 41 | 191 | 2 | 36 |
| 174 | 0 | 1 | 0 | 0 | 0 | 1 | 1 | 0 | 46 | 48 | 2 | 79 | 226 | 1 | 1 | 0 | 0 | 0 | 1 | 0 | 0 | C4 | 183 | 2 | 152 |
| 175 | 0 | 0 | 0 | 1 | 1 | 1 | 0 | 0 | 1C | 200 | 2 | 88 | 227 | 1 | 0 | 0 | 1 | 1 | 1 | 1 | 1 | 9F | 46 | 2 | 165 |
| 176 | 0 | 1 | 0 | 0 | 1 | 1 | 0 | 1 | 4D | 145 | 2 | 95 | 228 | 0 | 0 | 0 | 0 | 0 | 1 | 0 | 0 | 04 | 2 | 2 | 77 |
| 177 | 0 | 1 | 0 | 1 | 1 | 1 | 0 | 0 | 5C | 131 | 2 | 134 | 229 | 1 | 0 | 0 | 1 | 1 | 0 | 1 | 1 | 9B | 217 | 2 | 172 |
| 178 | 1 | 0 | 0 | 0 | 1 | 0 | 0 | 0 | 88 | 103 | 2 | 151 | 230 | 0 | 1 | 0 | 1 | 0 | 0 | 1 | 0 | 52 | 148 | 2 | 231 |
| 179 | 1 | 1 | 0 | 0 | 0 | 0 | 1 | 0 | C2 | 67 | 2 | 37 | 231 | 0 | 1 | 0 | 1 | 0 | 0 | 1 | 0 | 52 | 148 | 2 | 230 |
| 180 | 1 | 0 | 0 | 0 | 1 | 1 | 0 | 1 | 8D | 197 | 2 | 124 | 232 | 0 | 1 | 0 | 1 | 0 | 1 | 0 | 0 | 54 | 143 | 2 | 173 |
| 181 | 0 | 1 | 0 | 1 | 1 | 0 | 0 | 0 | 58 | 241 | 2 | 29 | 233 | 0 | 1 | 0 | 0 | 0 | 0 | 0 | 0 | 40 | 6 | 2 | 213 |
| 182 | 1 | 1 | 0 | 1 | 1 | 1 | 1 | 0 | DE | 62 | 2 | 163 | 234 | 0 | 0 | 0 | 0 | 1 | 0 | 0 | 0 | 08 | 3 | 2 | 244 |
| 183 | 0 | 0 | 0 | 0 | 1 | 0 | 1 | 1 | 0B | 238 | 2 | 123 | 235 | 0 | 0 | 0 | 0 | 0 | 1 | 0 | 1 | 05 | 50 | 2 | 22 |
| 184 | 1 | 0 | 0 | 0 | 1 | 0 | 1 | 1 | 8B | 237 | 2 | 38 | 236 | 0 | 1 | 0 | 1 | 0 | 0 | 0 | 1 | 51 | 208 | 2 | 73 |
| 185 | 0 | 1 | 0 | 0 | 1 | 0 | 1 | 0 | 4A | 37 | 2 | 249 | 237 | 1 | 1 | 0 | 1 | 1 | 1 | 0 | 0 | DC | 187 | 2 | 222 |
| 186 | 1 | 0 | 0 | 0 | 0 | 0 | 1 | 0 | 82 | 192 | 2 | 61 | 238 | 0 | 1 | 0 | 0 | 1 | 1 | 1 | 1 | 4F | 136 | 2 | 51 |
| 187 | 0 | 1 | 0 | 0 | 1 | 1 | 1 | 0 | 4E | 34 | 2 | 204 | 239 | 0 | 0 | 0 | 1 | 1 | 1 | 1 | 0 | 1E | 76 | 2 | 129 |
| 188 | 1 | 1 | 0 | 1 | 0 | 0 | 1 | 0 | D2 | 59 | 2 | 149 | 240 | 0 | 0 | 0 | 0 | 1 | 0 | 0 | 1 | 09 | 223 | 2 | 18 |
| 189 | 1 | 0 | 0 | 1 | 0 | 0 | 1 | 1 | 93 | 119 | 2 | 219 | 241 | 1 | 1 | 0 | 0 | 1 | 0 | 0 | 1 | C9 | 23 | 2 | 210 |
| 190 | 1 | 0 | 0 | 1 | 1 | 1 | 0 | 0 | 9C | 35 | 2 | 97 | 242 | 1 | 1 | 0 | 0 | 1 | 0 | 1 | 1 | CB | 236 | 2 | 86 |
| 191 | 1 | 0 | 0 | 0 | 1 | 1 | 0 | 0 | 8C | 49 | 2 | 6 | 243 | 1 | 0 | 0 | 0 | 1 | 0 | 0 | 1 | 89 | 74 | 2 | 115 |
| 192 | 1 | 0 | 0 | 1 | 0 | 1 | 0 | 0 | 94 | 38 | 2 | 247 | 244 | 0 | 0 | 0 | 0 | 1 | 0 | 0 | 0 | 08 | 3 | 2 | 234 |
| 193 | 0 | 1 | 0 | 0 | 0 | 1 | 0 | 0 | 44 | 102 | 2 | 28 | 245 | 0 | 0 | 0 | 0 | 0 | 0 | 1 | 1 | 03 | 25 | 2 | 11 |
| 194 | 0 | 1 | 0 | 1 | 1 | 1 | 1 | 0 | 5E | 70 | 2 | 125 | 246 | 0 | 1 | 0 | 0 | 0 | 1 | 0 | 1 | 45 | 221 | 2 | 111 |
| 195 | 1 | 1 | 0 | 0 | 1 | 1 | 0 | 0 | CC | 127 | 2 | 72 | 247 | 1 | 0 | 0 | 1 | 0 | 1 | 0 | 0 | 94 | 38 | 2 | 192 |
| 196 | 0 | 1 | 0 | 1 | 0 | 1 | 1 | 1 | 57 | 189 | 2 | 23 | 248 | 0 | 1 | 0 | 0 | 0 | 0 | 1 | 0 | 42 | 139 | 2 | 105 |
| 197 | 1 | 1 | 0 | 0 | 1 | 1 | 1 | 0 | CE | 111 | 2 | 49 | 249 | 0 | 1 | 0 | 0 | 1 | 0 | 1 | 0 | 4A | 37 | 2 | 185 |
| 198 | 0 | 0 | 0 | 1 | 0 | 0 | 1 | 1 | 13 | 14 | 2 | 26 | 250 | 1 | 0 | 0 | 0 | 0 | 1 | 0 | 0 | 84 | 140 | 2 | 133 |
| 199 | 0 | 1 | 0 | 1 | 1 | 0 | 1 | 1 | 5B | 92 | 2 | 75 | 251 | 0 | 1 | 0 | 1 | 1 | 0 | 1 | 0 | 5A | 19 | 2 | 96 |
| 200 | 0 | 1 | 0 | 1 | 0 | 0 | 0 | 0 | 50 | 54 | 2 | 8 | 252 | 1 | 0 | 0 | 1 | 1 | 0 | 1 | 0 | 9A | 146 | 2 | 220 |
| 201 | 0 | 0 | 0 | 1 | 0 | 0 | 0 | 0 | 10 | 4 | 2 | 154 | 253 | 1 | 0 | 0 | 1 | 1 | 1 | 1 | 0 | 9E | 137 | 2 | 48 |
| 202 | 1 | 1 | 0 | 1 | 0 | 1 | 0 | 1 | D5 | 157 | 2 | 94 | 254 | 1 | 1 | 0 | 0 | 1 | 0 | 0 | 0 | C8 | 196 | 2 | 24 |
| 203 | 0 | 1 | 0 | 0 | 1 | 0 | 1 | 1 | 4B | 179 | 2 | 89 | | | | | | | | | | | | | |
| 204 | 0 | 1 | 0 | 0 | 1 | 1 | 1 | 0 | 4E | 34 | 2 | 187 | | | | | | | | | | | | | |
| 205 | 1 | 1 | 0 | 1 | 0 | 1 | 0 | 0 | D4 | 41 | 2 | 207 | | | | | | | | | | | | | |
| 206 | 1 | 0 | 0 | 0 | 0 | 1 | 1 | 1 | 87 | 13 | 2 | 148 | | | | | | | | | | | | | |
| 207 | 1 | 1 | 0 | 1 | 0 | 1 | 0 | 0 | D4 | 41 | 2 | 205 | | | | | | | | | | | | | |

| data bit i of x**i | | | |
|---|---|---|---|
| k | i | 15i(17) | 17i(15) |
| 0 | 0 | 0 | 0 |
| 1 | 1 | 15 | 2 |
| 2 | 2 | 13 | 4 |
| 3 | 3 | 11 | 6 |
| 4 | 4 | 9 | 8 |
| 5 | 5 | 7 | 10 |
| 6 | 6 | 5 | 12 |
| 7 | 7 | 3 | 14 |
| 8 | 8 | 1 | 1 |
| 9 | 9 | 16 | 3 |
| 10 | 10 | 14 | 5 |
| 11 | 11 | 12 | 7 |
| 12 | 12 | 10 | 9 |
| 13 | 13 | 8 | 11 |
| 14 | 14 | 6 | 13 |
| 15 | 15 | 4 | 0 |
| 16 | 16 | 2 | 2 |
| 17 | 17 | 0 | 4 |
| 18 | 18 | 15 | 6 |
| 19 | 21 | 9 | 8 |
| 20 | 22 | 7 | 10 |
| 21 | 25 | 1 | 12 |
| 22 | 26 | 16 | 14 |
| 23 | 27 | 14 | 5 |
| 24 | 28 | 12 | 7 |
| 25 | 31 | 6 | 9 |
| 26 | 33 | 2 | 11 |
| 27 | 34 | 0 | 13 |
| 28 | 35 | 15 | 0 |
| 29 | 36 | 13 | 2 |
| 30 | 37 | 11 | 4 |
| 31 | 38 | 9 | 6 |
| 32 | 41 | 3 | 8 |
| 33 | 45 | 12 | 10 |
| 34 | 46 | 10 | 12 |
| 35 | 47 | 8 | 14 |

| data bit i of x**i | | | |
|---|---|---|---|
| k | i | 15i(17) | 17i(15) |
| 36 | 48 | 6 | 6 |
| 37 | 49 | 4 | 8 |
| 38 | 50 | 2 | 10 |
| 39 | 51 | 0 | 12 |
| 40 | 52 | 15 | 14 |
| 41 | 53 | 13 | 1 |
| 42 | 55 | 9 | 5 |
| 43 | 64 | 8 | 8 |
| 44 | 66 | 4 | 12 |
| 45 | 67 | 2 | 14 |
| 46 | 72 | 9 | 9 |
| 47 | 73 | 7 | 11 |
| 48 | 74 | 5 | 13 |
| 49 | 75 | 3 | 0 |
| 50 | 79 | 12 | 8 |
| 51 | 85 | 0 | 5 |
| 52 | 86 | 15 | 7 |
| 53 | 87 | 13 | 9 |
| 54 | 91 | 5 | 2 |
| 55 | 94 | 16 | 8 |
| 56 | 95 | 14 | 10 |
| 57 | 98 | 8 | 1 |
| 58 | 99 | 6 | 3 |
| 59 | 100 | 4 | 5 |
| 60 | 101 | 2 | 7 |
| 61 | 102 | 0 | 9 |
| 62 | 103 | 15 | 11 |
| 63 | 104 | 13 | 13 |
| 64 | 105 | 11 | 0 |
| 65 | 106 | 9 | 2 |
| 66 | 107 | 7 | 4 |
| 67 | 108 | 5 | 6 |
| 68 | 112 | 14 | 14 |
| 69 | 118 | 2 | 11 |
| 70 | 119 | 0 | 13 |
| 71 | 120 | 15 | 0 |

| data bit i of x**i | | | |
|---|---|---|---|
| k | i | 15i(17) | 17i(15) |
| 72 | 121 | 13 | 2 |
| 73 | 126 | 3 | 12 |
| 74 | 127 | 1 | 14 |
| 75 | 128 | 16 | 1 |
| 76 | 129 | 14 | 3 |
| 77 | 130 | 12 | 5 |
| 78 | 131 | 10 | 7 |
| 79 | 132 | 8 | 9 |
| 80 | 133 | 6 | 11 |
| 81 | 134 | 4 | 13 |
| 82 | 135 | 2 | 0 |
| 83 | 136 | 0 | 2 |
| 84 | 138 | 13 | 6 |
| 85 | 140 | 9 | 10 |
| 86 | 142 | 5 | 14 |
| 87 | 143 | 3 | 1 |
| 88 | 145 | 16 | 5 |
| 89 | 146 | 14 | 7 |
| 90 | 148 | 10 | 11 |
| 91 | 149 | 8 | 13 |
| 92 | 150 | 6 | 0 |
| 93 | 151 | 4 | 2 |
| 94 | 152 | 2 | 4 |
| 95 | 154 | 15 | 8 |
| 96 | 155 | 13 | 10 |
| 97 | 159 | 5 | 3 |
| 98 | 160 | 3 | 5 |
| 99 | 164 | 12 | 13 |
| 100 | 165 | 10 | 0 |
| 101 | 170 | 0 | 10 |
| 102 | 171 | 15 | 12 |
| 103 | 172 | 13 | 14 |
| 104 | 179 | 16 | 13 |
| 105 | 180 | 14 | 0 |
| 106 | 181 | 12 | 2 |
| 107 | 182 | 10 | 4 |

| data bit i of x**i | | | |
|---|---|---|---|
| k | i | 15i(17) | 17i(15) |
| 108 | 183 | 8 | 6 |
| 109 | 185 | 4 | 10 |
| 110 | 186 | 2 | 12 |
| 111 | 187 | 0 | 14 |
| 112 | 188 | 15 | 1 |
| 113 | 191 | 9 | 7 |
| 114 | 192 | 7 | 9 |
| 115 | 193 | 5 | 11 |
| 116 | 194 | 3 | 13 |
| 117 | 195 | 1 | 0 |
| 118 | 196 | 16 | 2 |
| 119 | 198 | 12 | 6 |
| 120 | 201 | 6 | 12 |
| 121 | 202 | 4 | 14 |
| 122 | 203 | 2 | 1 |
| 123 | 205 | 15 | 5 |
| 124 | 206 | 13 | 7 |
| 125 | 208 | 9 | 11 |
| 126 | 216 | 10 | 12 |
| 127 | 218 | 6 | 1 |
| 128 | 219 | 4 | 3 |
| 129 | 221 | 0 | 7 |
| 130 | 222 | 15 | 9 |
| 131 | 223 | 13 | 11 |
| 132 | 225 | 9 | 0 |
| 133 | 226 | 7 | 2 |
| 134 | 227 | 5 | 4 |
| 135 | 237 | 2 | 9 |
| 136 | 239 | 15 | 13 |
| 137 | 240 | 13 | 0 |
| 138 | 241 | 11 | 2 |
| 139 | 242 | 9 | 4 |
| 140 | 245 | 3 | 10 |
| 141 | 249 | 12 | 3 |
| 142 | 250 | 10 | 5 |
| 143 | 253 | 4 | 11 |

SEMICONDUCTOR MEMORY DEVICE

CROSS-REFERENCE TO RELATED APPLICATION

This application is based on and claims the benefit of priority from the prior Japanese Patent Application No. 2006-051199, filed on Feb. 27, 2006, the entire contents of which are incorporated herein by reference.

BACKGROUND OF THE INVENTION

1. Field of the Invention

This invention relates to a semiconductor memory device and, more particularly, to an on-chip error detection and correction system adaptable for use therein.

2. Description of the Related Art

Electrically rewritable nonvolatile semiconductor memory devices, i.e., flash memories, increase in error rate with an increase in number of data rewrite operations. In particular, the quest for larger storage capacity and further enhanced miniaturization results in an increase in error rate. In view of this, an attempt is made to mount or "embed" a built-in error correcting code (ECC) circuit on flash memory chips or, alternatively, in memory controllers for control of these chips. An exemplary device using this technique is disclosed, for example, in JP-A-2000-173289.

A host device side using more than one flash memory is designable to have an ECC system which detects and corrects errors occurring in the flash memory. In this case, however, the host device increases in its workload when the error rate increases. For example, it is known that a two-bit error correctable ECC system becomes greater in calculation scale, as suggested by JP-A-2004-152300.

Accordingly, in order to cope with such error rate increase while suppressing the load increase of the host device, it is desired to build a 2-bit error correctable ECC system in the flash memory. What is needed in this case is to meet the conflicting requirements: i.e., increasing the ECC system's arithmetic operation speed, and yet lessening possible penalties of read/write speed reduction of the flash memory.

SUMMARY OF THE INVENTION

According to one aspect of the present invention, there is provided a semiconductor memory device including an error detection and correction system with an error correcting code over Galois field GF ($2^n$), wherein the error detection and correction system includes an operation circuit configured to execute addition/subtraction with modulo $2^n-1$, and wherein the operation circuit includes a first operation part for performing addition/subtraction with modulo M and a second operation part for performing addition/subtraction with modulo N (where, M and N are integers, which are prime with each other as being obtained by factorizing $2^n-1$), the first and second operation parts being for performing addition/subtraction simultaneously in parallel with each other to output an operation result of the addition/subtraction with modulo $2^n-1$, and wherein the first and second operation parts each includes an adder circuit, which is configured to output a sum of two numbers to-be-added as a remainder of modulus thereof.

According to another aspect of the present invention, there is provided a semiconductor memory device including a cell array with electrically rewritable and non-volatile memory cells arranged therein, and an error detection and correction system, which is correctable up to 2-bit errors for read out data of the cell array by use of a BCH code over Galois field GF(256), wherein the error detection and correction system includes:

an encoding part configured to generate check bits to be written into the cell array together with to-be-written data;

a syndrome operating part configured to execute syndrome operation for read out data of the cell array;

an error location searching part configured to search error locations in the read out data based on the operation result of the syndrome operating part; and an error correcting part configured to invert an error bit in the read out data detected in the error location searching part, and output it, and wherein the error location searching part includes an operation circuit configured to execute index addition/subtraction with modulo 255, and wherein the operation circuit includes a first adder circuit for performing addition/subtraction with modulo 17 and a second adder circuit for performing addition/subtraction with modulo 15, which perform addition/subtraction simultaneously in parallel with each other to output an operation result of the index addition/subtraction with modulo 255.

BRIEF DESCRIPTION OF THE DRAWINGS

FIG. 8 is a diagram showing a check bit calculation method in the encoding part in the ECC circuit.

FIG. 9 is a diagram showing a calculation method of a syndrome polynomial $S_1(x)$ in the decoding part in the ECC circuit.

FIG. 10 is a diagram showing a calculation method of syndrome polynomial $S_3(x^3)$ in the same.

FIG. 11 is a diagram showing 144 degrees as selected from an information polynomial in order to be used as data bits.

FIG. 12 is a table of "n"s with the coefficient of each degree of the 15-degree remainder polynomial being of "1".

FIG. 14 is a table of n's with the coefficient of each order of "1" at the selected n's of remainder polynomial $p''(x)$ as used in calculation of the syndrome polynomial $S_1(x)$.

FIG. 16 is a table of n's with each degree coefficient "1" at chosen n's of a remainder polynomial $p^{3\prime\prime}(x)$ for use in calculation of a syndrome polynomial $S_3(x^3)$.

FIG. 18 is a coefficient table of remainder polynomial $p''(x)$ as need in decoding.

FIGS. 19A and 19B are tables for showing the relationships between indexes n and $y_n$.

FIG. 20 shows the summarized relationships between n and $y_n$.

FIG. 21 is a table showing classification of index $y_n$ based on $15y_n(17)$ and $17y_n(15)$.

FIG. 22 is a table showing the relationships between index i and the corresponding physical data bit position k.

FIG. 30 is a table showing index n as the remainder class index $15n(17)$.

FIG. 31 is a table showing index n as the remainder class index $-45n(17)$.

FIG. 33 is a table showing index n as the remainder class index $17n(15)$.

FIG. 34 is a table showing index n as the remainder class index $-17n(15)$.

FIG. 38 is a table showing the relationships between $15y_n(17)$, $17y_n(15)$ and $15n(17)$.

FIG. 40 is a code table of the decode circuit in FIG. 39.

FIG. 43 is a table showing the relationships between $15i(17)$, $17i(15)$, i and k.

DETAILED DESCRIPTION OF THE EMBODIMENTS

Figure 1:
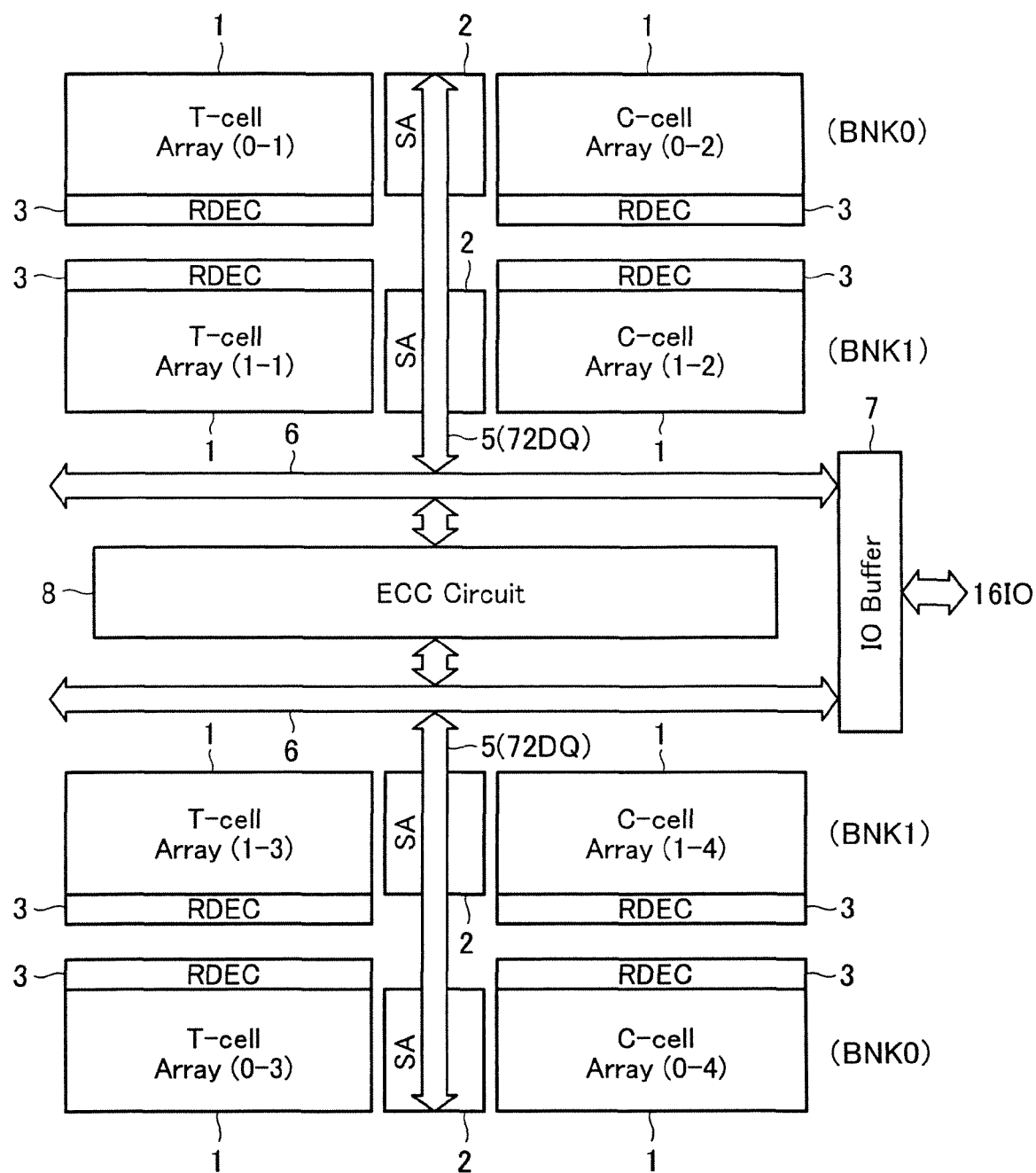
FIG. 1 is a diagram showing a configuration of main part of a flash memory in accordance with an embodiment of this invention.

Some embodiments of this invention will be described with reference to the accompanying figures of the drawing below.

Referring to FIG. 1, there is illustrated a block diagram showing main parts of a flash memory embodying the invention. This flash memory includes a couple of banks BNK0 and BNK1. Bank BNK0 is formed of four separate memory cell arrays 1—i.e., T-cell array (0-1), C-cell array (0-2), T-cell array (0-3), and C-cell array (0-4). The other bank BNK1 also is formed of four cell arrays 1, i.e., T-cell array (1-1), C-cell array (1-2), T-cell array (1-3), and C-cell array (1-4).

Each cell array 1 is associated with a row decoder (RDEC) 3 for performing word-line selection. Sense amplifier (SA) circuits 2 are provided, each of which is commonly owned or "shared" by neighboring T-cell array and C-cell array. These T-cell and C-cell arrays have a plurality of information cells, T-cells and C-cells, respectively, each having at least one reference cell R-cell as will be described later in detail.

The information cells T-cell and C-cell are the same in structure as the reference cell R-cell. Upon selection of an information cell T-cell from T-cell array, a reference cell R-cell is selected from a C-cell array that makes a pair with this T-cell array. Similarly, when an information cell C-cell is selected from C-cell array, a reference cell R-cell is selected from a T-cell array that makes a pair therewith.

Read/write data of upper and lower cell array groups each having four separate cell arrays 1 are transferred between sense amplifier circuits 2 and external input/output (I/O) nodes through data buses 5 and 6 via an I/O buffer 7. Between the upper and lower cell array groups each having four cell arrays 1, an error correcting code (ECC) circuit 8 is provided as an error detection and correction system, which is operable to detect and correct errors of read data.

Figure 2:
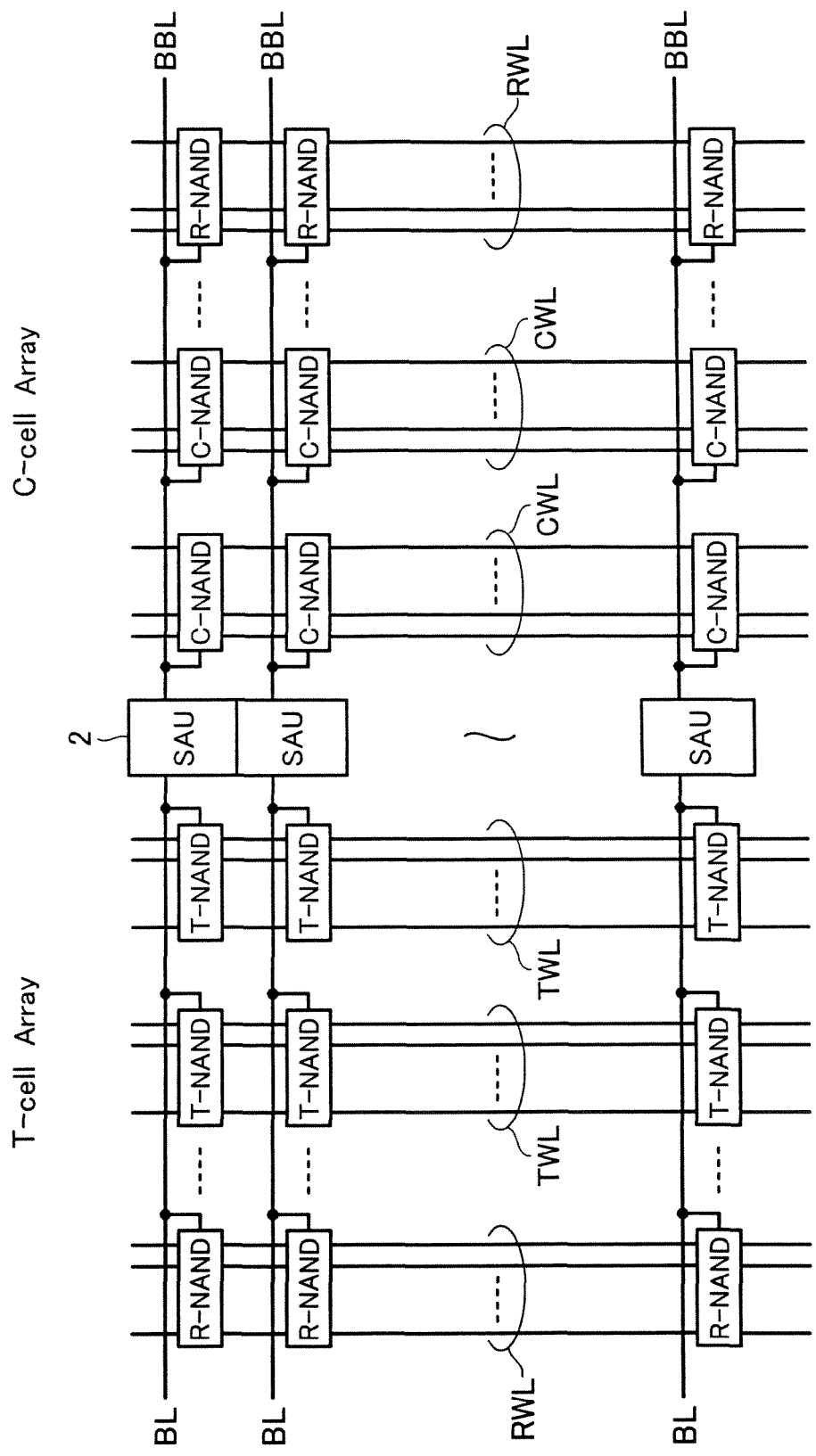
FIG. 2 is a diagram showing a detailed arrangement of a cell array in the flash memory.

Referring next to FIG. 2, a detailed configuration of a pair of T-cell array and C-cell array with their shared sense amp circuit 2 is shown. T-cell array has parallel extending bit lines BL, each of which is connected to a plurality of information cell NAND strings, T-NAND, and at least one reference cell NAND string, R-NAND. Similarly C-cell array has parallel bit lines BBL, to each of which are connected a plurality of information cell NAND strings, C-NAND, and at least one reference cell NAND string, R-NAND. Bit line BL of T-cell array and its corresponding bit line BBL in C-cell array constitute a pair.

The sense amp circuit 2 has sense units SAU of a current detection type, each of which is for detecting a difference between currents flowing in a pair of bit lines BL and BBL to sense data. Although in FIG. 2 a sense unit SAU is disposed one by one between paired bit lines BL and BBL, there is usually employed a scheme for causing a single sense unit to be shared by more than two bit line pairs.

A prespecified number of serial combinations of the information cell NAND strings T-NAND, C-NAND and reference cell NAND string R-NAND are laid out in the direction at right angles to the bit lines, thereby constituting cell blocks. In the respective cell blocks, word lines TWL, CWL and RWL are disposed. More specifically, these cell blocks each has a plurality of groups of parallel word lines which insulatively cross or "intersect" the bit lines BL and BBL—i.e., bundles of word lines TWL associated with respective columns of information cell NAND strings T-NAND, sets of word lines CWL connected to respective columns of information cell NAND strings C-NAND, and word lines RWL coupled to each column of reference cell NAND strings R-NAND.

Figure 3:
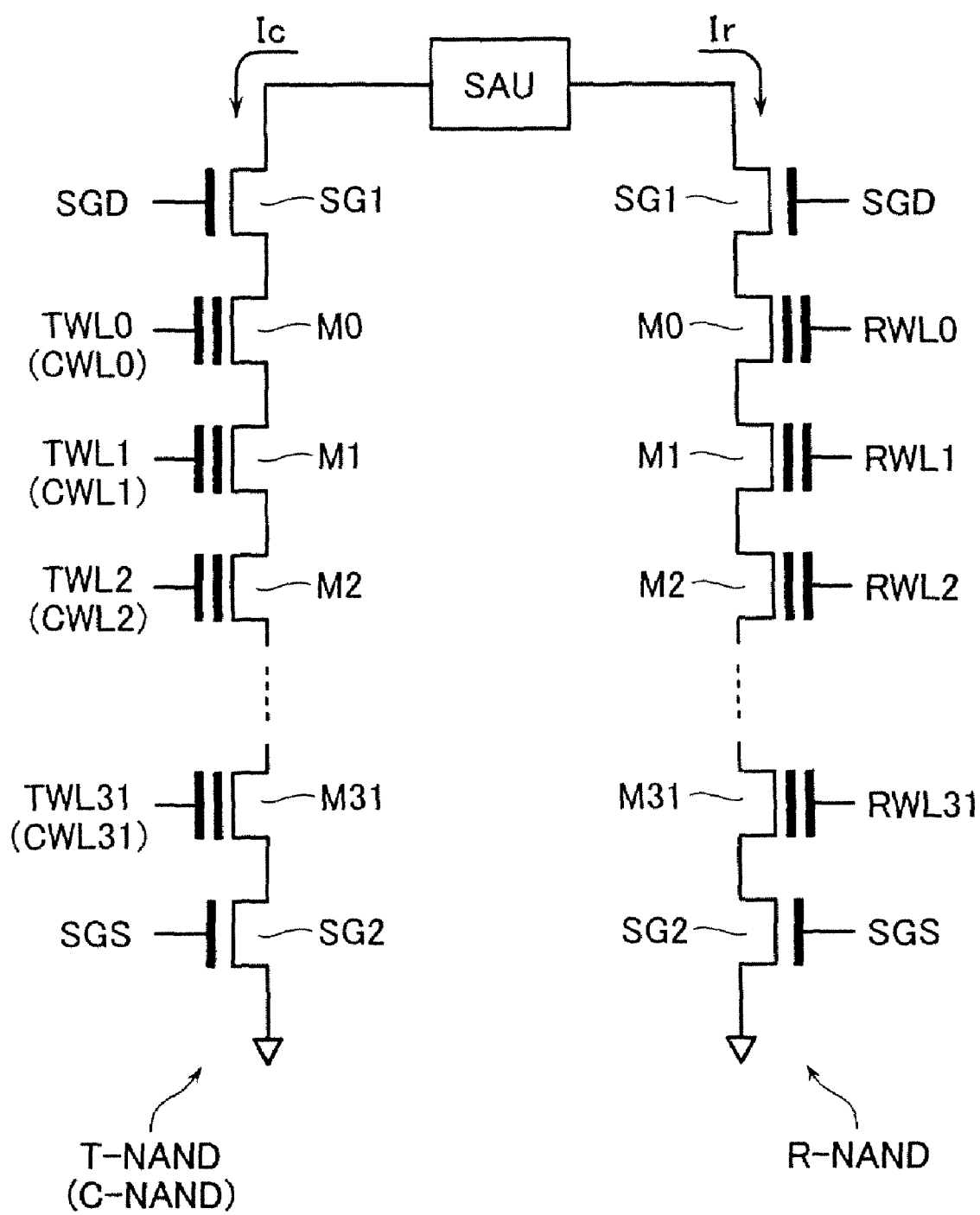
FIG. 3 is a diagram showing a further detailed configuration of the cell array.

FIG. 3 shows a detailed configuration of circuitry which includes a sense unit SAU and an information cell NAND string T-NAND (or C-NAND) and a reference cell NAND string R-NAND as connected to the sense unit. Each of these NAND strings has a serial connection of electrically rewritable nonvolatile memory cells M0 to M31 and a couple of select transistors SG1 and SG2 at opposite ends thereof. While the nonvolatile memory cells M0-M31 used are the same in transistor structure, these may function as the information cells T-cell (or C-cell) in information cell NAND string T-NAND (or C-NAND) or act as the reference cell R-cell in reference cell NAND string R-NAND.

In a data sense event, a memory cell of the information cell NAND string T-NAND (or C-NAND) and its corresponding cell in reference cell NAND string R-NAND are selected together at a time. This simultaneous data/reference cell selection results in currents Ic and Ir flowing in these cell strings, respectively. The sense unit SAU detects a difference between these cell currents Ic and Ir to sense data.

Figure 4:
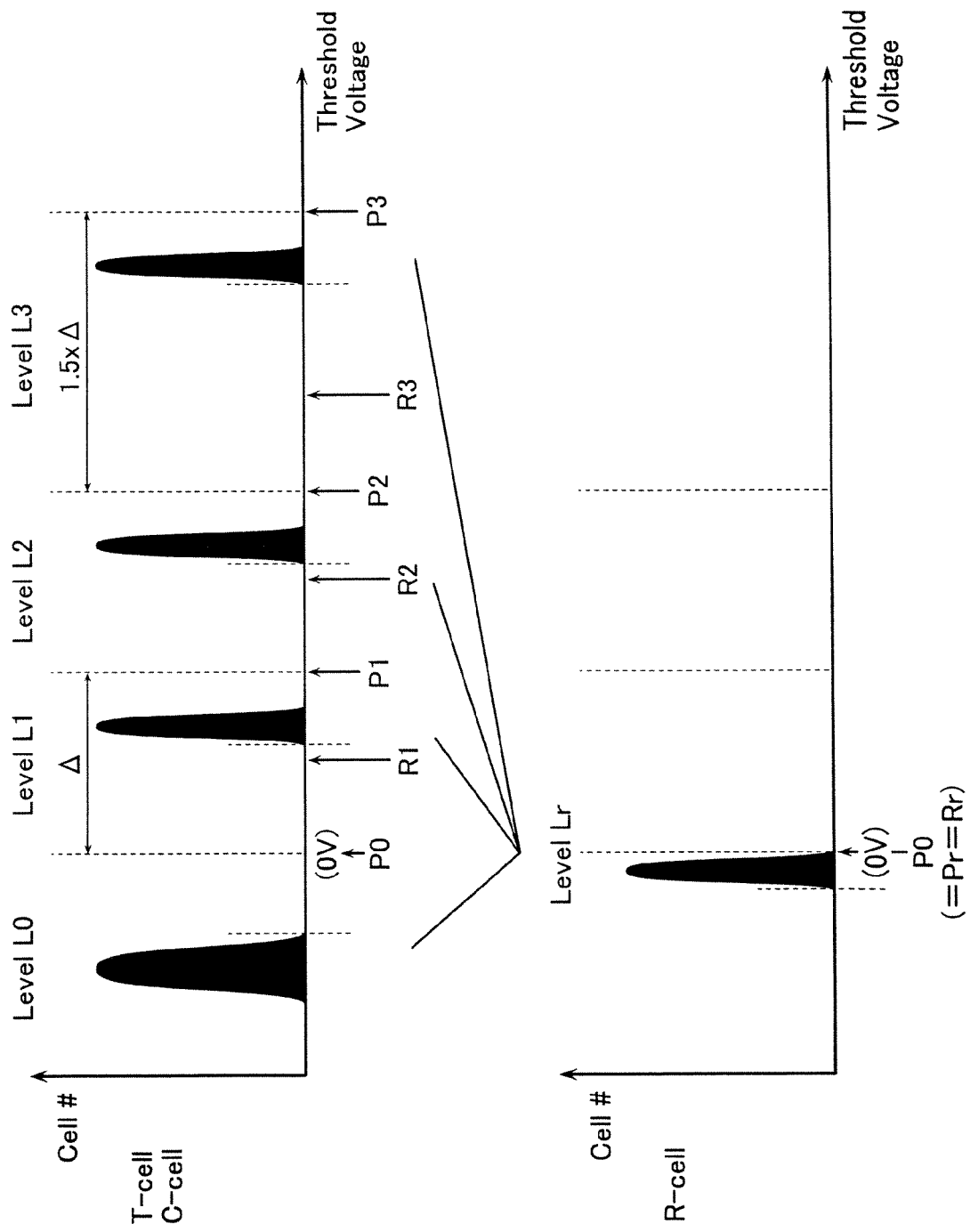
FIG. 4 is a diagram showing a data level relationship of the flash memory.

FIG. 4 shows a distribution of memory cell data levels (threshold levels) in case of four-level storage scheme. Any one of four different data levels L0, L1, L2 and L3 is written into an information cell T-cell, C-cell. A reference level Lr is written into reference cell R-cell, which level is set to have a potential between the data levels L0 and L1 for example.

Bit allocation of four data levels L0-L3 is different between the information cells T-cell and C-cell. For example, suppose that four-level data is represented by (HB, LB), where HB is the upper-level bit; and LB lower-level bit. In an information cell T-cell on the T-cell array side, data bits are assigned as follows: L0=(1,0), L1=(1,1), L2=(0,1), and L3=(0,0). While, in an information cell C-cell on the C-cell array side, data bits are assigned as follows: L0=(0,0), L1=(0,1), L2=(1,1), and L3=(1,0).

In FIG. 4, there are shown read voltages R1 to R3 given to information cell T-cell, C-cell during reading in a way pursuant to the data to be read, and a read voltage Rr applied to reference cell R-cell. Also shown here are write-verify voltages P1 to P3 to be given to the information cell T-cell, C-cell during write-verifying, and a write-verify voltage Pr applied to the reference cell R-cell.

Although, in the example, four-level data storage scheme has been explained, it will be used in general such a multi-level data storage scheme that two or more bits are stored in each memory cell.

An explanation will now be given of a technique used in this embodiment for mounting the ECC circuit 8 and its access mode in a case where a 1 gigabit (Gb) of memory is configured using two 512-megabit (Mb) banks BNK0 and BNK1.

The memory as discussed here is of a x16IO configuration, in which address generation is in common to all the banks although each bank's page address is settable independently and wherein allocation is made to each bank by designating which page address is applied to which bank. Accordingly, interleaving is done between the banks for page address utilization.

Each bank has 1,024k pages. The page length defined in common for 16 IOs of each bank is 32 bits, which may be output 8 bits by 8 bits in a parallel way. The page length is the maximum or "longest" data length per bank with respect to one IO readable by a sense operation with one-time word line address setting.

With such an arrangement, 128 bits of data are output outside by one-time data transmission from the sense amp circuit 2. In other words, this design permits $2^k$ data bits to be transferred together, where k is an integer.

The ECC circuit 8 built in the flash memory is arranged to employ Bose-Chaudhuri-Hocquenghem (BCH) code with 2-bit error correctability-that is, double error correction BCH code system, which will be referred to as "2EC-BCH" code hereinafter. To enable 2-bit error correction, a need is felt to use a simultaneous equation having different roots. The 2EC-BCH code is a cyclic code generated with a code generation polynomial as denoted by a product of two primitive polynomials.

The bit length used here is given by $2^n-1$. Data bits usable as information are $2^n-1-2n$ bits. To deal with $2^n$ bits of data, let n=m+1. This makes it inevitable to use a data length that is approximately two times greater than the quantity required.

In the memory configuration of FIG. 1, 2EC-BCH code used for execution of 2-bit error correction in 128-bit information data is one over Galois field $GF(2^8)$. In this case, usable bit length is $2^8-1=255$, which requires the use of 16 bits as error check bits. Thus, in case 144 bits are used for 16 check bits and 128 information data bits, the remaining 111 bits become extra ones. In this case, as shown in FIG. 1, the data buses 5 extending from upper and lower cells which bisect each bank are 72 DQ lines, respectively, resulting in a total of 144 bits of data being transferred together at a time.

The ECC system is variable in efficiency depending upon the handling of useless extra 111 bits and how information bit selection is performed in the BCH code system. Thus, it is necessary to take into consideration a method for configuring the best suited ECC system.

Although in some cases the required bit number becomes greater than 128 bits when considered also including the redundancy for replacement of a defective cell(s), this may readily be analogously extendable from the case of the 128-bit data length discussed here. In general, the number L of data bits to be error-corrected in the 2EC-BCH system is selected in the range of $L \leqq =255-16=239$.

(Data Encoding)

An explanation will be given of the outline of 2EC-BCH over Galois field $GF(2^8)$. Letting a primitive root (element) of GF(256) be α, 8-degree primitive polynomial $m_1(x)$ on the ground field GF(2) with this element a being as its own root is represented by Expression 1. In other words, irreducible polynomials of a power of α and a power of x due to $m_1(x)$ become mutually corresponding elements in GF(256).

Additionally, as an 8-degree irreducible polynomial with a cubic of a being as its root, polynomial $m_3(x)$ that is relatively prime with $m_1(x)$ is used as shown in the following Expression 1.

$$\alpha : m_1(x) = x^8 + x^4 + x^3 + x^2 + x + 1$$

$$\alpha_3 : m_3(x) = x^8 + x^6 + x^5 + x^4 + x^2 + x + 1 \quad \text{[Exp. 1]}$$

Based on these two primitive polynomials, a 2-bit error correctable ECC system (i.e., 2EC-BCH code system) will be configured. To perform encoding with check bits added to the data being written, prepare a product polynomial g(x) of $m_1(x)$ and $m_3(x)$ as a code generation polynomial, as shown in Expression 2 below.

$$\begin{aligned} g(x) &= m_1(x)m_3(x) \\ &= x^{16} + x^{14} + x^{13} + x^{11} + x^{10} + x^9 + \\ &\quad x^8 + x^6 + x^5 + x + 1 \end{aligned} \quad \text{[Exp. 2]}$$

A maximal number of two-bit error correctable bits capable of being utilized as information bits is 239, which is obtained by subtracting check bit numbers, 16, from $2^8-1$ (=255). Based on these bits, while letting coefficients from bit positions 16 to 254 be $a_{16}$ to $a_{254}$, make a 238-degree information polynomial f(x) as indicated by Expression 3.

$$f(x) = a_{254}x^{238} + a_{253}x^{237} + \ldots + a_{18}x^2 + a_{17}x + a_{16} \quad \text{[Exp. 3]}$$

For example, 128 bits are actually used in the 239 terms. In this case, letting the remaining coefficients of 111 bits be fixed to "0", the information polynomial becomes one with the lack of those terms of corresponding degrees. Depending upon which degree numbers are selected as the 111 terms with such "0"-fixed coefficients from the information polynomial f(x) having 239 terms, the computation amount of syndrome calculation becomes different, which is to be executed during decoding as described later. Thus, this selection technique becomes important. This will be explained later.

From the information polynomial f(x), form a data polynomial $f(x)x^{16}$ that contains 16 check bits. To make such check bits from this data polynomial, the data polynomial $f(x)x^{16}$ will be divided by the code generation polynomial g(x) to obtain 15-degree remainder polynomial r(x) as shown in the following Expression 4.

$$f(x)x^{16} = q(x)g(x) + r(x)$$

$$r(x) = b_{15}x^{15} + b_{14}x^{14} + \ldots + b_1x + b_0 \quad [\text{Exp. 4}]$$

Use the coefficients $b_{15}$ to $b_0$ of this remainder polynomial r(x) as the check bits. In other words, 128 coefficients $a_{i(128)}$ to $a_{i(1)}$ selected from 239 ones serve as "information bits" while 16 bits of $b_{15}$ to $b_0$ serve as "check bits", thereby resulting in that a total of 144 bits become "data bits" to be stored in the memory as shown in the following Expression 5.

$$a_{i(128)} a_{i(127)} \ldots a_{i(3)} a_{i(2)} a_{i(1)} b_{15} b_{14} \ldots b_1 b_0 \quad [\text{Exp. 5}]$$

Here, $a_{i(k)}$ is the data to be externally written into the memory. Based on this data, a check bit $b_j$ is created in the chip-embedded ECC system, which bit will be simultaneously written into the cell array.

(Data Decoding)

Next, an explanation will be given of a method for detecting errors from 144 bits of data read out of the cell array and for correcting up to 2 bits of errors.

Supposing that errors take place when the memory stores the coefficients of 254-degree data polynomial $f(x)x^{16}$, such errors also are expressed by 254-degree polynomial. This error polynomial being e(x), the data read from the memory may be given by a polynomial v(x) with a structure shown in Expression 6 as follows.

$$v(x) = f(x)x^{16} + r(x) + e(x) \quad [\text{Exp. 6}]$$

A term with the coefficient of this error polynomial e(x) in Expression 6 being at "1" is identical to an error. In other words, detecting e(x) is equivalent to performing error detection and correction.

What is to be done first is to divide the readout data polynomial v(x) by the primitive polynomials $m_1(x)$ and $m_3(x)$ to obtain the respective remainders, which are given as $S_1(x)$, $S_3(X)$. As shown in Expression 7, it is apparent from the structure of v(x) that each is equal to the remainder of e(x) divided by $m_1(x)$, $m_3(x)$.

$$v(x) \equiv S_1(x) \bmod m_1(x)$$
$$\rightarrow e(x) \equiv S_1(x) \bmod m_1(x)$$
$$v(x) \equiv S_3(x) \bmod m_3(x)$$
$$\rightarrow e(x) \equiv S_3(x) \bmod m_3(x) \quad [\text{Exp. 7}]$$

These division remainders $S_1(x)$ and $S_3(x)$ are referred to as syndrome polynomials.

Assuming that 2-bit errors are present at i-th and j-th bits, e(x) will be expressed as follows: $e(x) = x^i + x^j$. These values i and j are obtainable by calculation of the index "n" of $x = \alpha^n$, i.e., a root of $m_1(x)$ that is an element in GF(256). More specifically, when letting a remainder, which is obtained by dividing $x^n$ by $m_1(x)$, be $p^n(x)$, $\alpha^n = p^n(x)$. As shown in the following Expression 8, let $\alpha^i$ and $\alpha^j$ corresponding to error degrees be $X_1$ and $X_2$, respectively; let the indexes corresponding to $S_1(\alpha)$ and $S_3(\alpha^3)$ with respect to syndromes $S_1(x)$ and $S_3(x)$ be $\sigma_1$ and $\sigma_3$; and let $S_1(\alpha)$ and $S_3(\alpha^3)$ be $S_1$ and $S_3$, respectively.

$$X_1 = p^i(\alpha) = \alpha^i$$
$$X_2 = p^j(\alpha) = \alpha^j$$
$$S_1(\alpha) = S_1 = \alpha^{\sigma_1}$$
$$S_3(\alpha^3) = S_3 = \alpha^{\sigma_3} \quad [\text{Exp. 8}]$$

Since $m_3(\alpha^3) = 0$, we obtain the following Expression 9.

$$S_1 = X_1 + X_2 = e(\alpha)$$
$$S_3 = X_1^3 + X_2^3 = e(\alpha^3) \quad [\text{Exp. 9}]$$

At the second stage, consider polynomial $\Lambda^R(x)$ with unknown quantities $X_1$ and $X_2$ as its roots, product $X_1X_2$ is representable by $S_1$ and $S_3$ as in Expression 10, so that the coefficients involved are calculable from the syndrome polynomials.

$$\begin{aligned}
S_3/S_1 &= (X_1^3 + X_2^3)/(X_1 + X_2) \\
&= X_1^2 + X_1X_2 + X_2^2 \\
&= (X_1 + X_2)^2 + X_1X_2 \\
&= S_1^2 + X_1X_2
\end{aligned} \quad [\text{Exp. 10}]$$

$$X_1X_2 = (S_3 + S_1^3)/S_1$$

$$\begin{aligned}
\Lambda^R(x) &= (x - X_1)(x - X_2) \\
&= x^2 + S_1x + (S_3 + S_1^3)/S_1 \\
&= x^2 + \alpha^{\sigma_1}x + \alpha^{\sigma_3 - \sigma_1} + \alpha^{2\sigma_1}
\end{aligned}$$

At the third stage, finding $\alpha^n$, i.e., a root of $\Lambda^R(x)$ in GF(256), it becomes possible to obtain the error bit locations i and j as "n" of $\alpha^n$ from $X_1, X_2 = \alpha^n$. In other words, searching $\Lambda^R(\alpha^n) = 0$ for n=0, 1, 2, ..., 254, a hit number "n" will be specified as an error bit.

As shown in Expression 11 below, in case of a 1-bit error, we obtain $X_1 = S_1$, $X_1^3 = S_3 = S_1^3$. Thus, the error location is defined from $S_1$. If there are no errors, we obtain $S_1 = S_3 = 0$. In case there are 3 bits or more errors and its position is incomputable, either one of $S_1$ and $S_3$ becomes 0.

(a) If 1-bit error, $X_1 = S_1$ and $X_1^3 = S_3 = S_1^3$.

(b) If 0-bit error, $S_1 = S_3 = 0$.

(c) If more than 3-bit error, $S_1$ or $S_3$ is equal to 0. [Exp. 11]

As described above, error location searching is for obtaining index "n" of $\alpha^n$ that satisfies $\Lambda^R(x) = 0$. For the purpose, in this embodiment, change $\Lambda^R(x)$ shown in Expression 10, and make possible to obtain "n" by use of only index relationships. In detail, using the variable conversion of: $x = \alpha^{\sigma_1} y$, to solve $\Lambda^R(x) = 0$, and to obtain variable "y" shown in the following Expression 12, it becomes equal to each other.

$$y^2 + y + 1 + \alpha^{\sigma_3 - 3\sigma_1} = 0 \quad [\text{Exp. 12}]$$

By use of this Expression 12, directly comparing the index obtained by variable calculation with that defined by syndrome calculation, it is possible to find a coincident variable. In detail, to solve the Expression 12, substitute $\alpha^n$ for y to obtain the index $y_n$ shown in Expression 13.

$$y^2+y+1=\alpha^{2n}+\alpha+1=\alpha^{y_n} \quad \text{[Exp. 13]}$$

As shown in the following Expression 14, comparing the index $\sigma_3$-$3\sigma_1$ obtained by the syndrome calculation with that $y_n$ obtained by the variable calculation, coincident "n" becomes the index of "y" corresponding to the error location.

$$\sigma_3-3\sigma_1 \equiv y_n \bmod 255 \quad \text{[Exp. 14]}$$

To restore the index of variable "y" to that of the real variable "x", as shown in Expression 15, multiply $\alpha^{\sigma_1}$ into "y".

$$x=\alpha^{\sigma_1}y=\alpha^{\sigma_1+n} \quad \text{[Exp. 15]}$$

The index $\sigma_1$+n of a as shown in Expression 15 is that of "x" corresponding to the error location, and this "x" will satisfy the error searching equation of: $\Lambda^R(x)=0$.

Essentials for execution of actual calculations are summarized as follows.

What is needed in encoding is a remainder table, i.e., a table of coefficients of remainder polynomial r(x), which is generated by code generation polynomial g(x) from 128 terms selected as data bits from the data polynomial $f(x)x^{16}$ of degree 254 in maximum. For check bit calculation, select those coefficients corresponding to the data bit-selected terms, followed by execution of addition over GF(2) using two-element code of "0" or "1".

In decoding, when performing calculation of the syndrome polynomials $S_1(x)$ and $S_3(x^3)$, a remainder table is necessary, which is a table of coefficients of remainder p″(x) obtained by primitive polynomial $m_1(x)$ from 254 to 0 degree. Based on this table, the calculation is done as similar to the check bit calculation.

To shorten an ECC calculation time in the memory system which does not use all of the 239 data bits usable in 2EC-BCH using GF(256), it is in need of employing a practical selection method for selecting actually used terms (degrees) from the information polynomial. Especially for the syndrome calculation, it is necessary to choose specific terms (degrees) capable of efficiently obtaining the remainder.

An explanation will first be given of a practical remainder calculation method.

In calculations over GF(2), both multiplication and division are carried out by addition of polynomial coefficients—that is, based on even/odd judgment of the numbers of "1". Thus a calculator circuit used here is principally designed to perform parity check in a way as follows: if the number of terms, coefficient of which is "1", is an even number, output a computation result "0"; if it is an odd number then its calculation result becomes "1".

Two kinds of parity check (PC) circuits with simplified configurations used in this embodiment will be explained below.

Figure 5A:
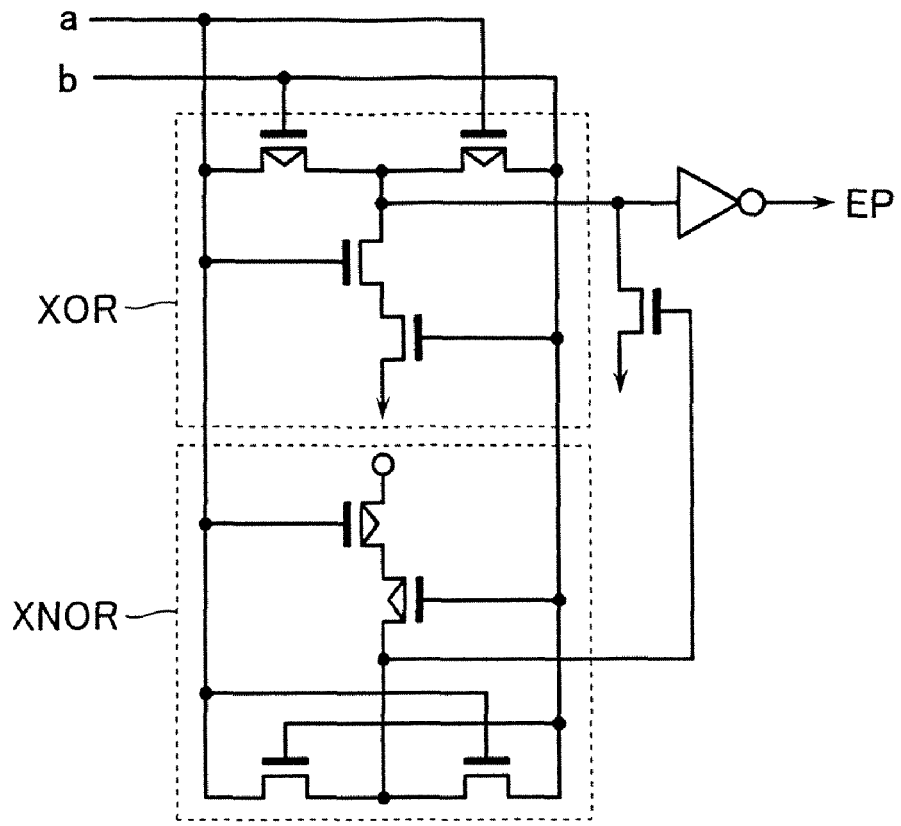
FIG. 5A is a diagram showing a 2-bit parity check circuit as used in an ECC circuit for performing even/odd judgment of "1"
Figure 5B:
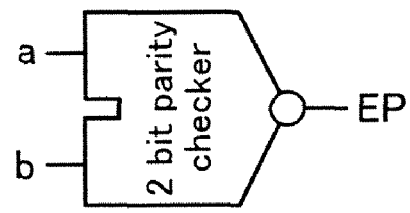
FIG. 5B is a diagram showing symbols of the parity checker circuit.

FIGS. 5A and 5B show a 2-bit parity check (PC) circuit and circuit symbol thereof. This PC circuit has an XOR circuit and an XNOR circuit for performing logic operations for input signals "a" and "b" to output "1" to the output node when the number of "1"s in the input signals is even.

Figure 6A:
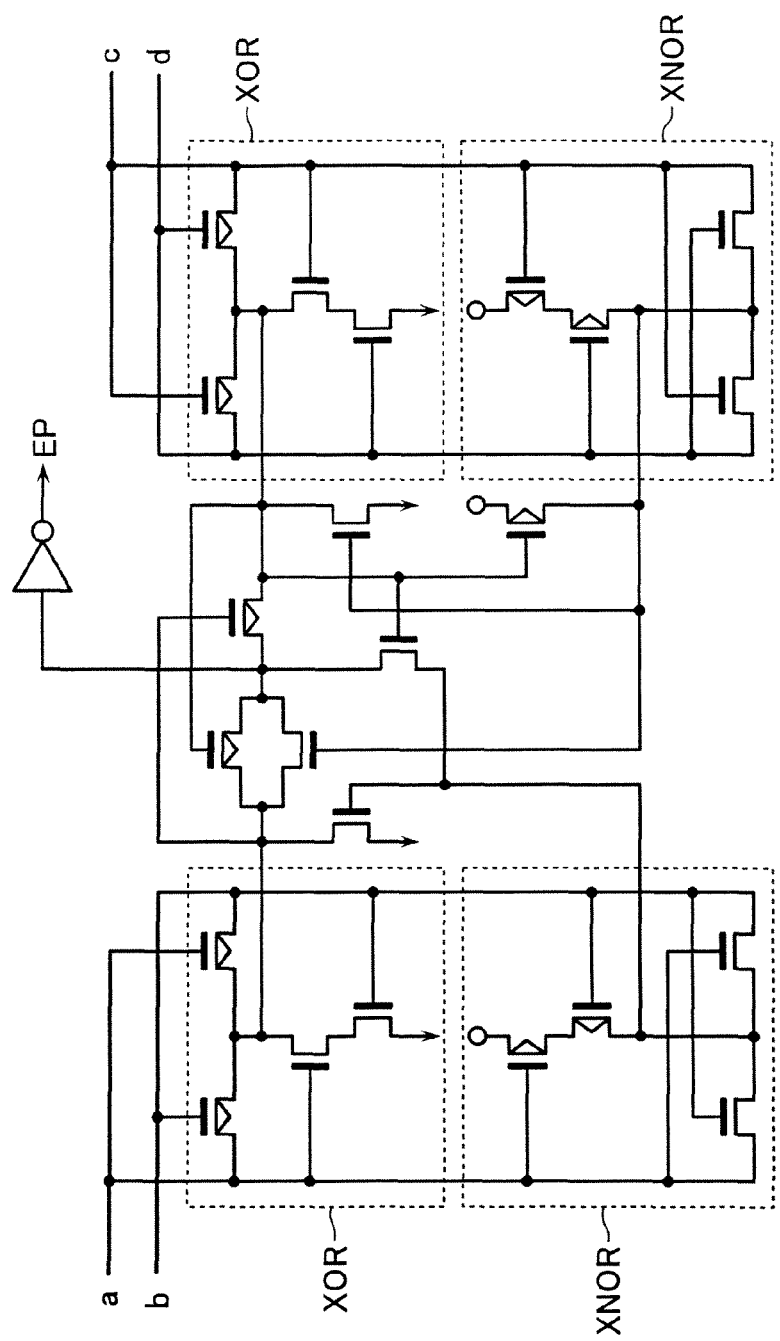
FIG. 6A is a diagram showing a 4-bit parity check circuit as used in an ECC circuit for performing even/odd judgment of "1"
Figure 6B:
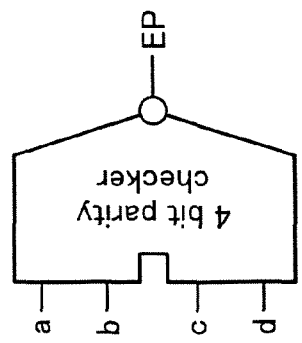
FIG. 6B is a diagram showing symbols of the parity checker circuit.

FIGS. 6A and 6B shows a 4-bit parity check (PC) circuit and circuit symbol thereof. This PC circuit has two XOR circuits and two XNOR circuits for performing logic operations for 4-bit input signals "a", "b", "c" and "d" to output "1" to the output node when the number of "1"s in the input signals is even.

Figure 7:
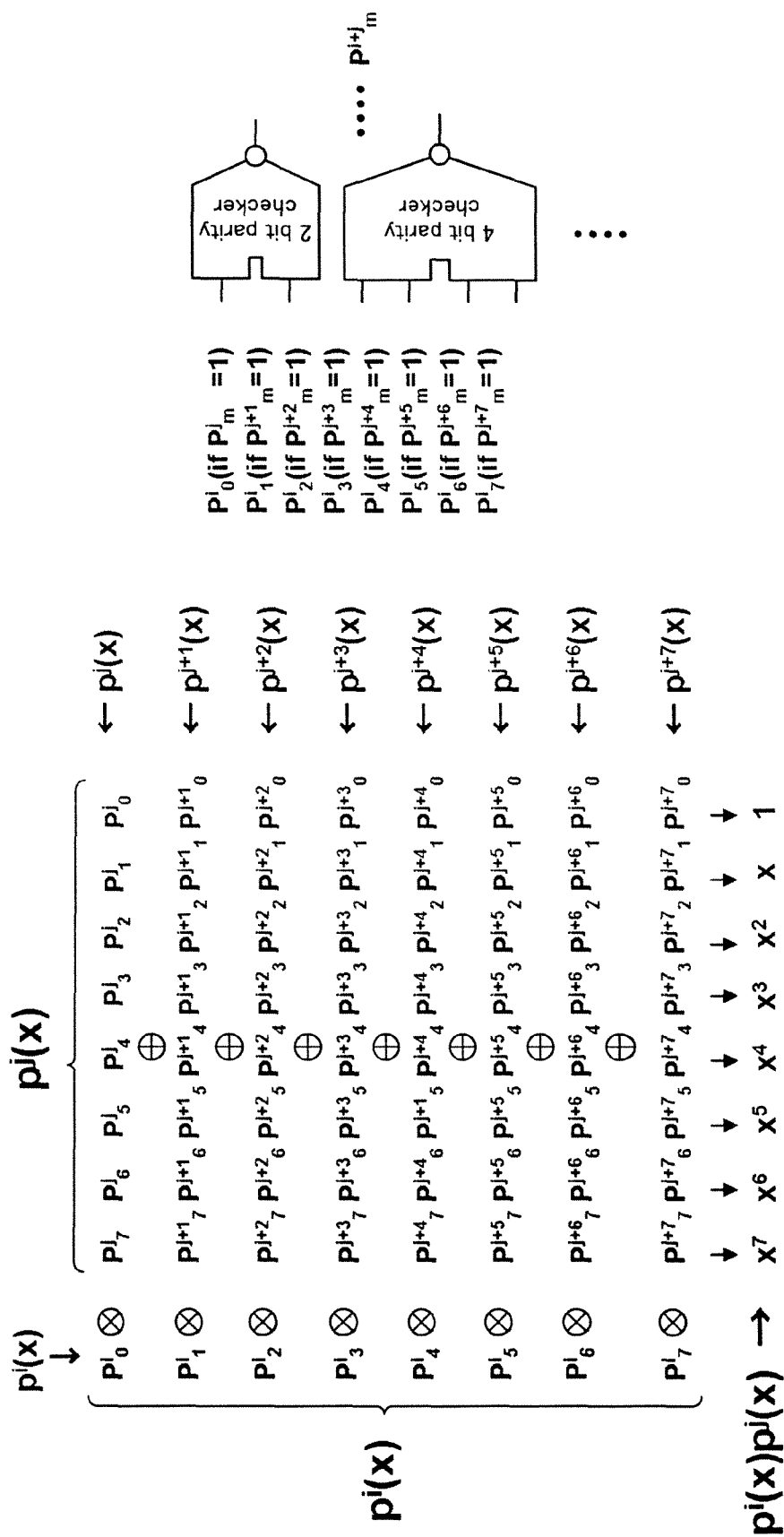
FIG. 7 is a diagram showing a product computation method of polynomials over GF(2).

A calculation method of a product in GF(2) of the polynomial in GF(256) using the above-described parity check circuits is shown in FIG. 7. Every arithmetic processing of the polynomial in GF(256) becomes computation between 7-degree polynomials p″(x) because the primitive polynomial is of degree 8. Thus, every calculation result of four basic operations—i.e., addition, subtraction, multiplication and division—becomes any one of the polynomials p″(x). Division $\{p''(x)\}^{-1}$ becomes a product of $p^{255-n}(x)$.

While letting the coefficient of m-degree term of p″(x) be represented by $P''_m$, a product of 7-degree polynomials $p^i(x)$ and $p^j(x)$ in Expression 16 below is calculated as shown in FIG. 7. Obviously, the coefficient $P''_m$ is either "0" or "1".

$$p^i(x)=P^i_7x^7+P^i_6x^6+P^i_5x^5+P^i_4x^4+P^i_3x^3+P^i_2x^2+P^i_1x+P^i_0$$

$$p^j(x)=P^j_7x^7+P^j_6x^6+P^j_5x^5+P^j_4x^4+P^j_3x^3+P^j_2x^2+P^j_1x+P^j_0 \quad \text{[Exp. 16]}$$

As $x^n \equiv p''(x) \pmod{m_1(x)}$, use such a rule that the 14-degree term is with $p^{j+7}$ appearing 7-item ahead of the multiplying $p^j(x)$. Then, the product of polynomials $p^i(x)$ and $p^j(x)$ is enabled by multiplication and addition (i.e., parity check) between the respective polynomial coefficients as shown in FIG. 7.

In other words, parity check is done which is per-degree addition of from 7 to 0 of 1- or 0-multiplied ones, and its result becomes the coefficient of each degree of $p^i(x)$, $p^j(x)$. Regarding the multiplying $p^j(x)$, there are required those polynomial coefficients up to a 7-degree ahead one.

The circuitry required here may be the parity check circuit only, with additional provision of a circuit for performing inputting unique to the coefficients of from the multiplying $p^j(x)$ to $p^{j+7}(x)$. This is because no parity check is needed when the coefficient $P^j_m=0$. The parity check circuit will be formed by combining 2-bit PC circuit(s) shown in FIG. 5A with 4-bit PC circuit(s) shown in FIG. 6A in accordance with input number needed.

This computation method is applied upon generation of the check bits during encoding, which will be explained below.

The check bit calculation is performed as follows: dividing data polynomial $f(x)x^{16}$ generated from information data by code generation polynomial g(x), thereby obtaining remainder polynomial r(x). To perform this arithmetic operation, precalculate coefficients of 15-degree remainder polynomial $r^i(x)$ which was obtained by dividing a single term $x^i$ by g(x), and use them in a similar way to the case of the multiplication of p″(x). The coefficient of $r^i(x)$ is referred to as $R^i_m$ (m=0, 1, 2, ..., 15), and the coefficient of $x^i$ of $f(x)x^{16}$, which serves as an information bit, is referred to as $a_i$.

Figure 8:
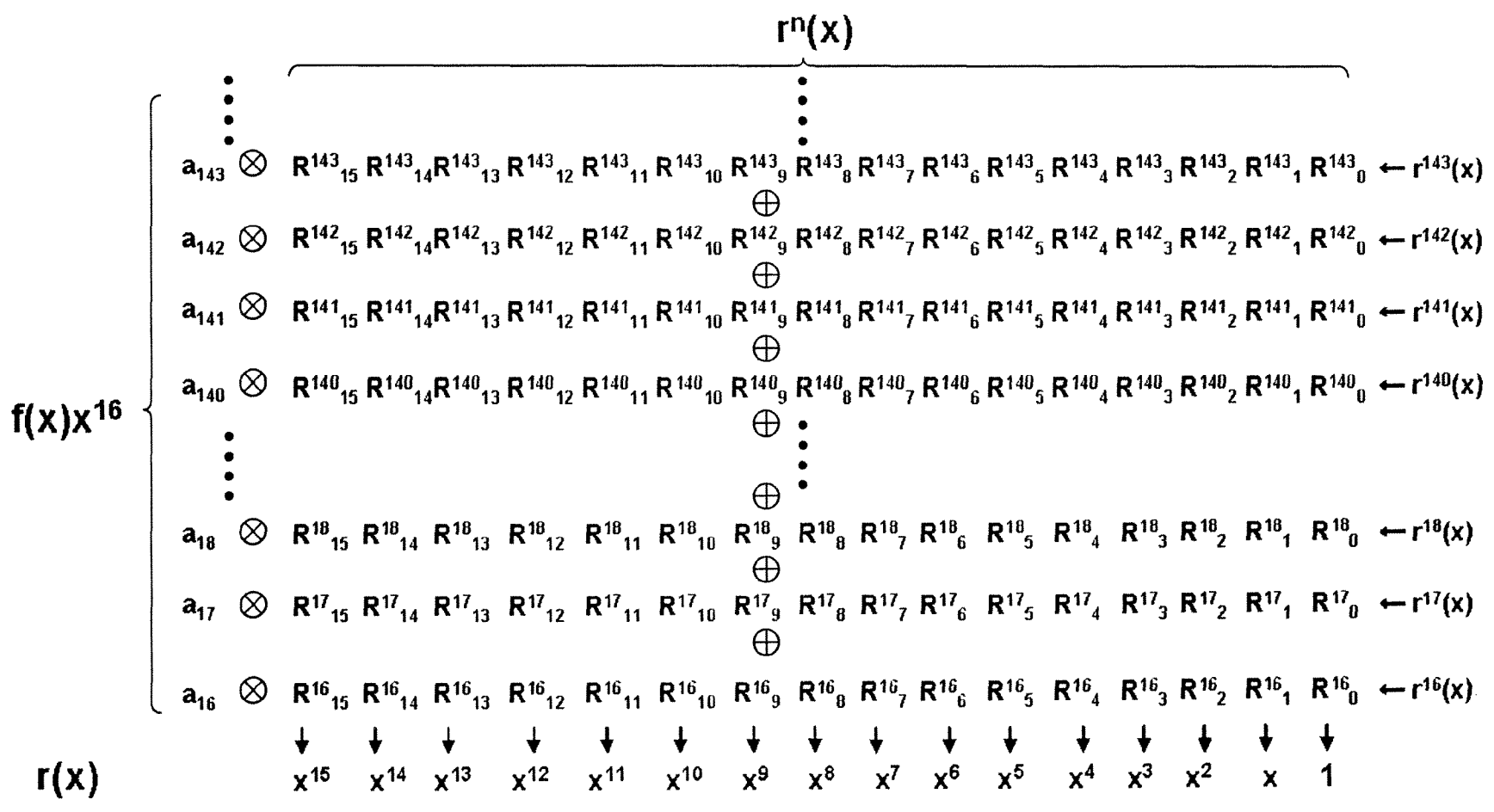

Actual calculation is performed as follows. Assuming that data bits are $a_{16}$ to $a_{254}$, 111 bits out of them are selected in a way such that the syndrome calculation scale to be done later becomes as small as possible, and then fixed to "0". Next, as shown in FIG. 8, perform multiplication of the data polynomial's coefficient $a_i$ and the remainder polynomial's coefficient Rim and addition (parity check) of those coefficients of terms of the same degree.

More specifically, perform addition—i.e., parity check—of the coefficient $R^i_m$ of a remainder $r^i(x)$ of specific degree with the data bit $a_i$ being at "1" in GF(2) per each m; then, let the result be a check bit $b_m$.

An explanation will next be given of a calculation method during decoding as required when performing the selection of "0"-fixed bit positions of 111 bits.

Firstly, the calculation of syndrome polynomial $S_1(x)$ is done, which is for obtaining a division remainder at $m_1(x)$ of polynomial $v(x)$ with data $d_i$ as read out of a memory cell being as its coefficient. This arithmetic operation is performed, as shown in FIG. 9, by multiplication of $d_i$ and the coefficient $P^i_m$ (m is 0, 1, ..., 7) of the remainder $p^i(x)$ that is obtained by dividing $x^i$ (i is 254, 253, ..., 0) by $m_1(x)$, and addition (parity check) of its result. In other words, let a parity check result of m-th degree coefficient $P^i_m$ of $p^i(x)$ with $d_i=$"1" be the m-degree coefficient of the syndrome polynomial $S_1(x)$.

In this calculation procedure, no calculations are done for portions of $d_i=$"0" and when $P^i_m$ is "0", so that the selection of out-of-use bits determines the calculation amount in the case where all of 239 information bits are not used.

A calculation method relating to another syndrome polynomial $S_3(x)$ will next be described below.

In relation to the syndrome polynomial $S_3(x)$, what is needed for searching the error location j is the syndrome polynomial $S_3(x^3)$. Note that $S_3(x)$ per se is a division remainder at $m_3(x)$ of $v(x)$. Between $v(x^3)$ and $S_3(x^3)$, a relationship shown in the following Expression 17 is establishable, where $P^i_m$ (m=0, 1, ..., 7) is the coefficient of remainder polynomial $p^i(x)$ obtained by dividing $x^i$ by $m_1(x)$, and $d_i$ is the coefficient of $x^i$.

$S_3(x) \equiv v(x) \mod m_3(x)$, $m_3(x^3) \equiv 0 \mod m_1(x)$, $S_3(x^3) \equiv v(x^3) \mod m_3(x^3) \equiv v(x^3) \mod m_1(x)$, $v(x) = \Sigma d_i x^i$, $v(x^3) = \Sigma d_i x^{3i}$, $x^i \equiv p^i(x) \mod m_1(x)$, $x^{3i} \equiv p^{3i}(x) \mod m_1(x)$, $S_3(x^3) \equiv v(x^3) \mod m_1(x) = \Sigma d_i p^{3i}(x) \mod m_1(x)$. [Exp. 17]

From the above-described Expression 17, $S_3(x^3)$ is calculable by the coefficient $d_i$ of $v(x)$ and the remainder $p^{3i}(x)$. Thus, what is needed here is the coefficient $P^i_m$ of $p^i(x)$ at $m_1(x)$ of $x^i$, and its practical calculation method is as shown in FIG. 10.

In this calculation process also, no calculations are done for $d_i=$"0" portions and when $P^{3i}_m$ is "0", so the selection of out-of-use bits determines the calculation quantity in case all of the 239 information bits are not used. As the decoding includes a process of performing computation for searching the error position(s) after completion of the syndrome polynomial calculation, the calculation amount is desirably minimized in order to shorten a time taken for such calculation. This is attainable by performing selection of 128 optimal terms (degrees) from the 238-degree information polynomial f(x). This selection method will next be described below.

For the syndrome polynomials $S_1(x)$ and $S_3(x^3)$ calculations are performed simultaneously in a parallel way. Calculation of each degree-term in each polynomial is the parity check of "1"; thus, the total calculation amount is expected to decrease if the coefficient of every degree is calculated without appreciable variations within almost the same length of time.

One preferred selection method thereof is arranged to include the steps of: obtaining, for each "n", a total sum of those with the coefficients being at "1" of these syndrome calculation-used 7-degree remainder polynomials $p^n(x)$ and $p^{3n}(x)$; and then selecting a specific number of "n"s corresponding to the required data bit number from the least side in number of the total sum. In this event, the first sixteen ones, i.e., the coefficients of $x^0$ to $x^{15}$, are used as the check bits to be fixed, and perform ascending-order selection of a total sum of "1"s of the coefficients to select 128 terms from the seventeenth one et seq.

Additionally, upon completion of the selection within a group of the same total-sum numbers, selection is done in order from the overlap of "1"s being less at the same degree terms as the reference while specifying n's as a reference with the coefficients "1" being uniformly distributed between respective degree terms within $p^n(x)$ and $p^{3n}(x)$ and then letting these n's be the reference. In other words, selection is done in order from the least side of the total sum of coefficients in the same terms as that of the reference with coefficients "1" of $p^n(x)$, $p^{3n}(x)$.

FIG. 11 shows 144 degrees "n" for use in the case of 144-bit data selected from 254 degrees in data polynomial $f(x)x^{16}$ as described above.

Although this selection method does not always minimize the greatest one of the number of the coefficients "1" of respective degrees of the polynomial for execution of parity checking, it is still a simple method capable of reducing a step number of syndrome calculation while at the same time reducing the scale of syndrome calculator circuitry without requiring large-scale calculation including search-up of a calculation step-minimized one from among all possible combinations.

Figure 12:
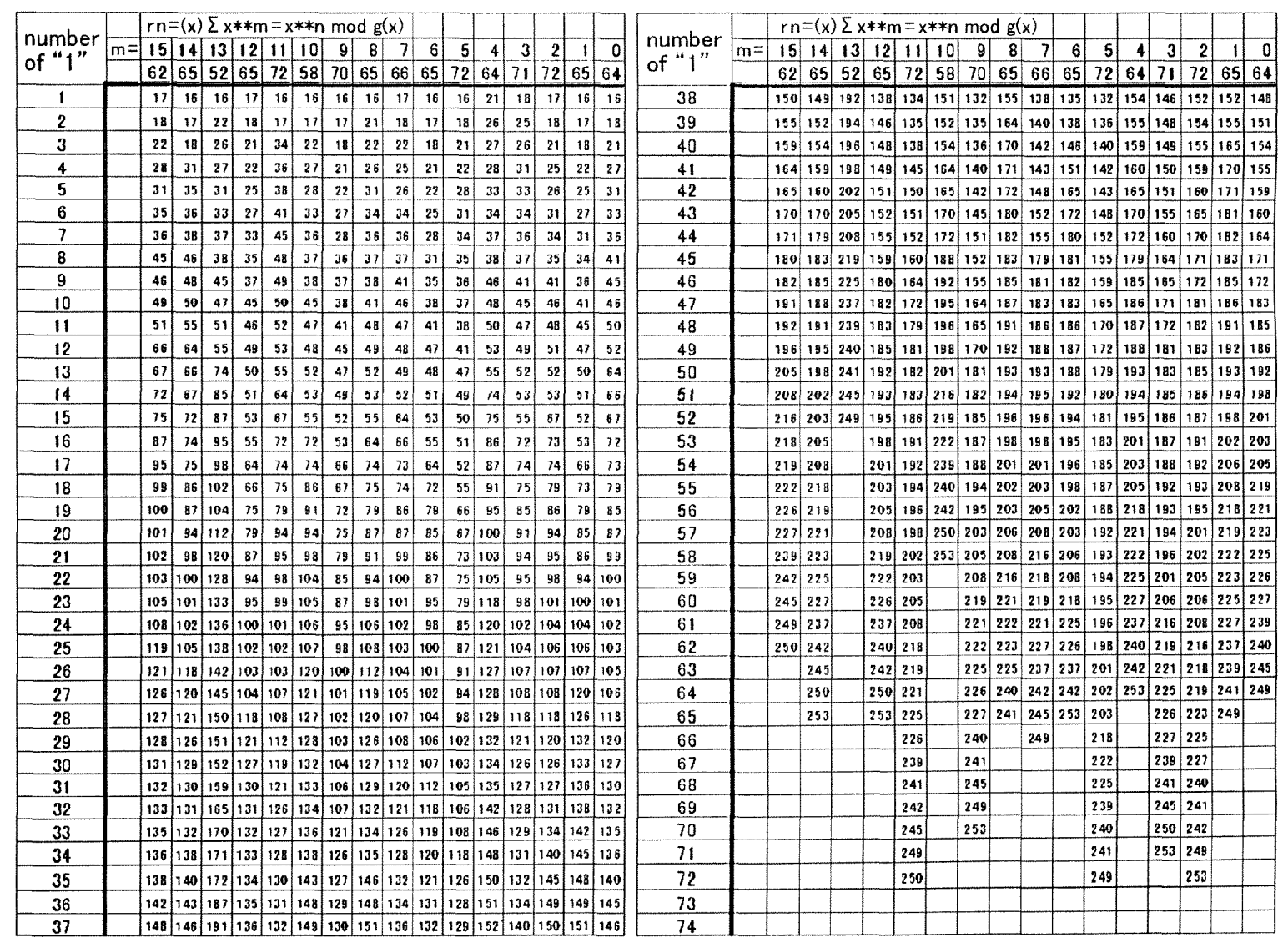

FIG. 12 shows a coefficient table of remainder polynomial $r^n(x)$ obtained by g(x), i.e., a table of degree number "n", at which the coefficient of remainder $r^n(x)$ for selected $x^n$ is "1".

For example, the degree number "n" of $r^n(x)$ with the coefficient of $x^{15}$ being "1" is 17, 18, 22, ..., 245, 249 and 250 written in fields defined by the number of coefficient "1" being from 1 to 62, in the column of m=15. Note that $b_{15}$ which is equivalent to the coefficient of a check bit $x^{15}$ is obtainable as a result of parity check of this selected n-degree terms' coefficients in the information data polynomial $f(x)x^{16}$.

Figure 13:
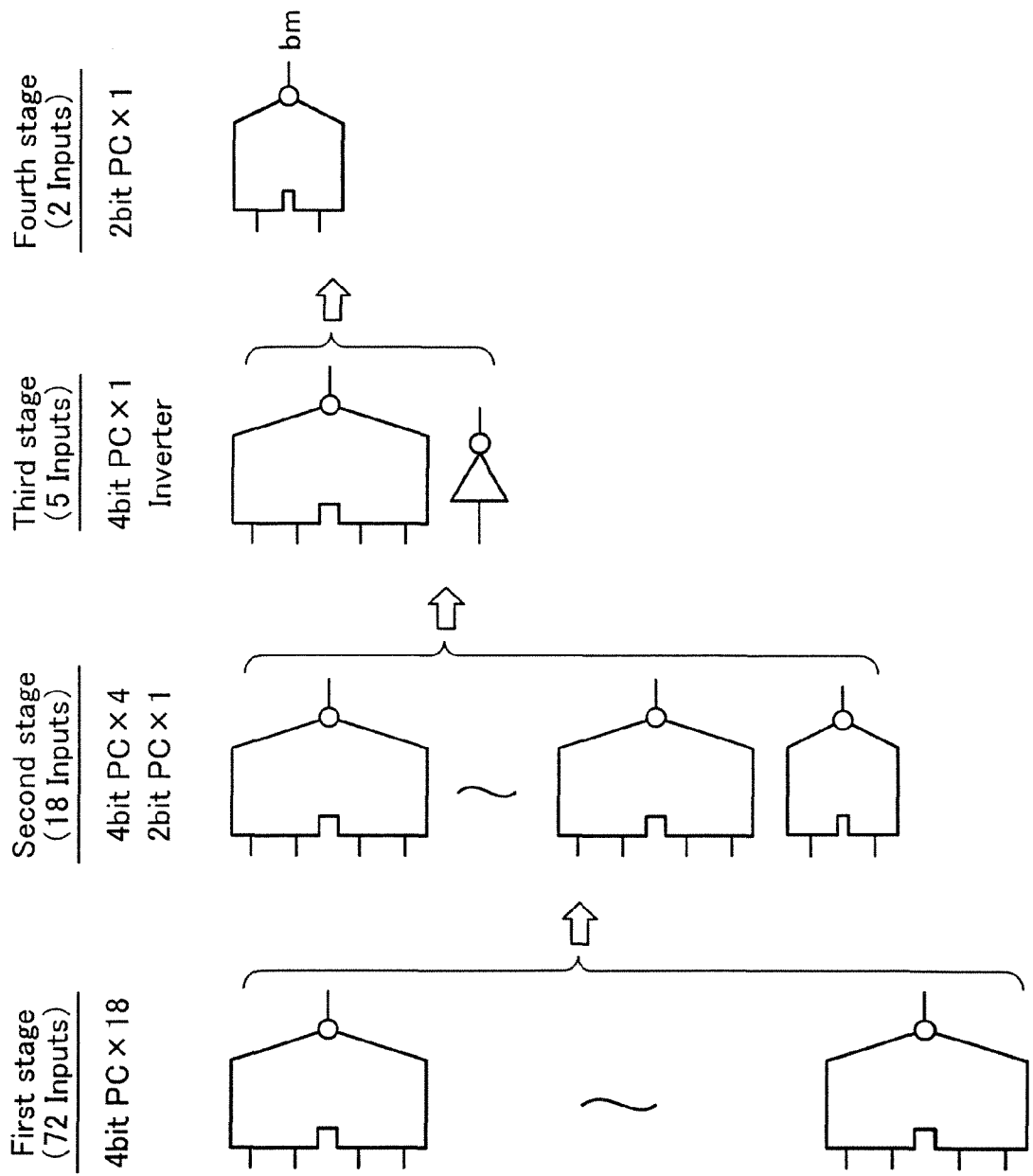
FIG. 13 is a diagram showing a configuration of a parity check circuit for use in check bit calculation.

FIG. 13 shows an exemplary circuit, which performs check bit calculation based on the table shown in FIG. 12. It is apparent from the table of FIG. 12 that for m=11, 5, 2 of $x^m$, there are a maximum of 72 bit numbers to be subjected to parity check. So, this case is shown as an example in FIG. 13. Since there are indicated in the table such the degree numbers "n" that the coefficient $R^n_m$ of m-degree term of remainder polynomial $r^n(x)$ is not "0", select "n" from the table for each "m", and then execute parity check using $a_n$ or $/a_n$.

An appropriate combination of parity check (PC) circuits to be used is determined depending on the number of inputs belonging to which one of the division remainder systems of four (4). More specifically, if it is dividable by 4, 4-bit PC is solely used. If such division results in presence of a remainder of 1, 2-bit PC, one input of which is applied with Vdd, i.e., an inverter, is added. If the remainder is 2, 2-bit PC is added. If 3 remains then 4-bit PC, one input of which is applied with Vdd, is added.

In the example of m=11, 5 and 2, there are 72 inputs. A check bit calculator circuit adaptable for use in this case is configurable from four stages of parity check (PC) circuits as shown in FIG. 13. A first stage consists of eighteen 4-bit PCs. The second stage is of 18 inputs, so let it be arranged by four 4-bit PCs and one 2-bit PC. The third stage becomes 5 inputs, so this is formed of one 4-bit PC and an inverter. The fourth stage becomes 2 inputs, so it is formed of a 2-bit PC. An output of the fourth-stage parity check circuit becomes a check bit $b_m$.

Similar calculation to that in the case of check bit calculation will be performed in the syndrome calculation, in a way set forth below.

FIG. 14 is a table of the number of degrees whose coefficient is "1" in 7-degree remainder polynomial $p''(x)$ for use in the calculation of the syndrome polynomial $S_1(x)$. For example, the degree number n of $p''(x)$ with the coefficient of $x^7$ being "1" is 7, 11, 12, ..., 237, 242, 245 written in fields defined by the number of coefficient "1" being from 1 to 56, in the column of m=7. The coefficient of $x^7$ of $S_1(x)$ is obtained as a result of parity check of the coefficient of this selected n-degree term in the data polynomial $v(x)$.

Figure 15:
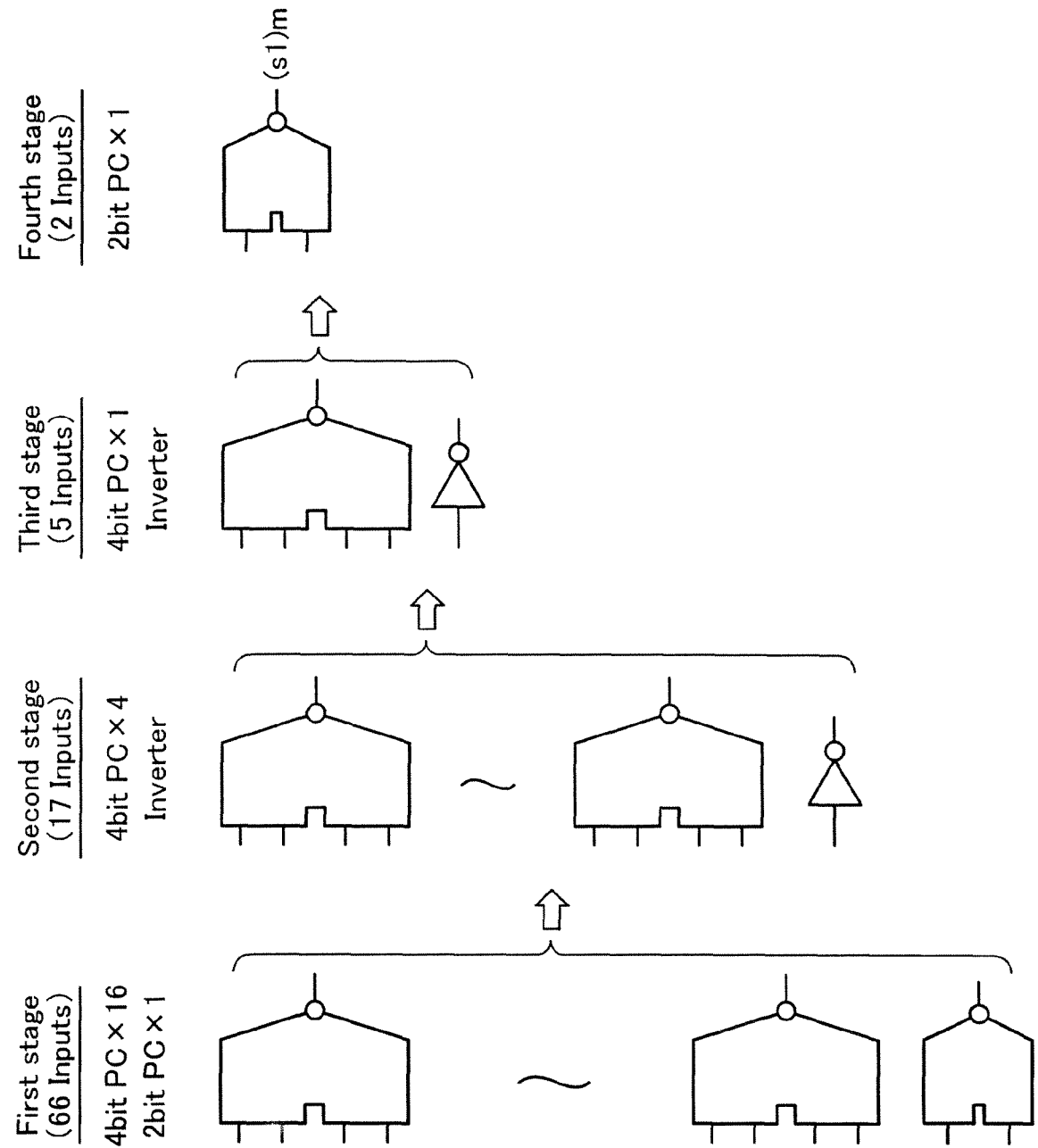
FIG. 15 shows an exemplary circuit for calculation of the syndrome polynomial $S_1(x)$.

An example of electrical circuitry for performing calculation of the syndrome $S_1(x)$ based on the table of FIG. 14 is shown in FIG. 15. It is apparent from FIG. 14 that in the case of m=6, 2, the number of bits to be parity-checked is 66 in maximum. This case is shown as an example in FIG. 15. As those degree numbers n with the coefficient $P''_m$ of m-degree term of remainder polynomial $p''(x)$ not being at "0" are listed in the table, select n from this table about each m and then execute parity check using data bit $d_n$.

A proper combination of parity checkers (PCs) used is determined depending on the number of inputs belonging to which one of the division remainder systems of 4. More precisely, if it is just dividable by 4, then 4-bit PC is solely used; if the division results in presence of a remainder 1, 2-bit PC, one input of which is applied with Vdd, i.e., an inverter, is added; if the remainder is 2, 2-bit PC is added; and, if 3 remains then 4-bit PC, one input of which is applied with Vdd, is added.

In the example of m=6, 2, there are 66 inputs. So in this case also, four stages of parity check (PC) circuits are used to configure the intended calculator circuitry. The first stage is made up of sixteen 4-bit PCs and one 2-bit PC. The second stage is of 17 inputs, so it is constituted from four 4-bit PCs and an inverter. The third stage is of 5 inputs and thus is arranged by one 4-bit PC and an inverter. The fourth stage is of 2-inputs and it is formed of one 2-bit PC. An output of the fourth stage becomes a coefficient $(s1)_m$.

The same goes with the calculation of the syndrome polynomial $S_3(x^3)$, and this will be discussed below.

FIG. 16 is a table of the number of degrees whose coefficient is "1" in the remainder $p^{3n}(x)$ for use in the calculation of syndrome polynomial $S_3(x^3)$.

For example, the degree number "n" of $p^{3n}(x)$ with the coefficient of $x^7$ being "1" is 4, 8, 14, ..., 241, 242 and 249 written in fields from 1 to 58 in the column of m=7. A data $(s3)_7$ that corresponds to the coefficient of $x^7$ of $S_3(x^3)$ is obtainable as a result of parity check of the coefficient of this selected n-degree term in the data polynomial $v(x)$.

Figure 17:
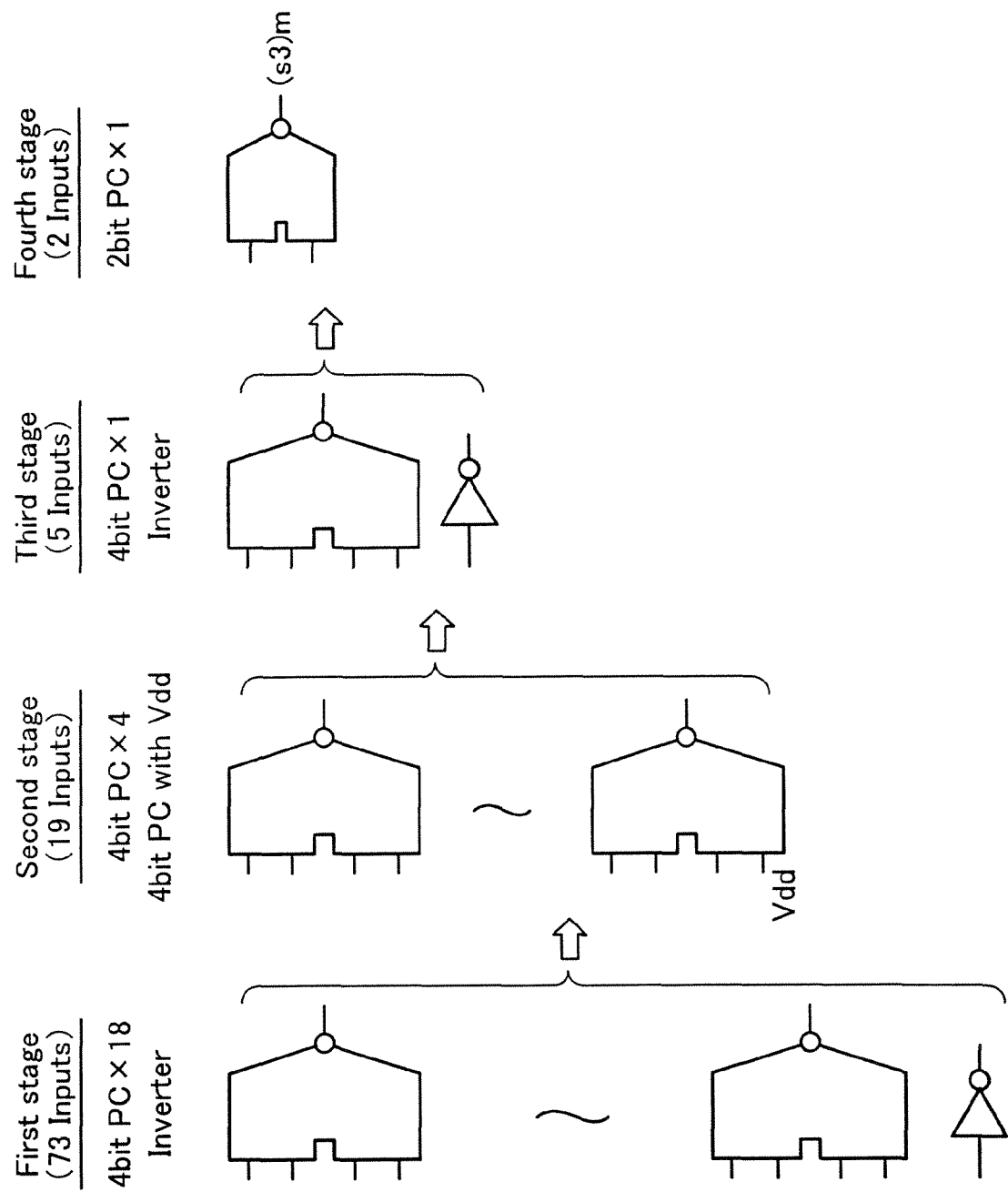
FIG. 17 shows an exemplary circuit for calculation of the syndrome polynomial $S_3(x^3)$.

An exemplary calculation circuit thereof is shown in FIG. 17. As the FIG. 16 table suggests that the number of bits to be parity-checked for m=5 of $x^m$ is 73 in maximum, this case is shown in FIG. 17 as an example. Since those degree numbers "n" with the coefficient $P^{3n}_m$ of m-degree term of remainder polynomial $p^{3n}(x)$ not being at "0" are shown in the table, select "n" from the table for each "m" and then execute parity check using $d_n$.

In the example of m=5, there are 73 inputs. Therefore, in this case also, four stages of parity check circuits are used to configure the calculation circuitry. The first stage is made up of eighteen 4-bit PCs and an inverter. As the second stage is of nineteen inputs, it is formed of five 4-bit PCs, in one of which one input is applied with Vdd. The third stage may be configured of one 4-bit PC and one inverter as it becomes five inputs. The fourth stage is formed of one 2-bit PC. An output of the fourth stage becomes the coefficient $(s3)_m$.

Next, it will be explained a method of making an error location searching circuit small in scale, which performs index comparison to search an error location(s).

A required calculation is to solve the index congruence shown in Expression 14. In detail, it is in need of solving two congruences. Firstly, obtain $y_n$ of $y^2+y+1=\alpha^{yn}$ based on the syndrome index. Then, find the index "n" of $y=\alpha^n$ corresponding to $y_n$ based on the corresponding relationship, and solve the index "i" of "x" based on $x=\alpha^{\sigma_1}y$.

The congruences each is formed in GF(256), i.e., mod 255. If directly executing this calculation as it is, it becomes equivalent to performing the comparison of 255×255, and resulting in that the circuit scale becomes large. In this embodiment, to make the circuit scale small, the calculation will be performed in parallel.

That is, $2^n-1=255$ is factorized into two prime factors M and N (i.e., first and second integers, respectively), and each congruence is divided into two congruences. Then, it will be used such a rule that in case a number satisfies simultaneously the divided congruences, it also satisfies the original congruence. In this case, to make the circuit scale and calculation time as small as possible when the congruence calculations are executed in parallel, it is preferred to make the difference between the two integers as small as possible.

In detail, 255 is dividable as 17×15, 51×5 or 85×3. In this embodiment, 17×15 is used, and two congruences will be solved simultaneously with modulo 17 and modulo 15.

First, to obtain $y_n$, congruences shown in Expression 18 are used. That is, addition/subtraction with modulo 17 between indexes multiplied by 15 and addition/subtraction with modulo 15 between indexes multiplied by 17 are performed simultaneously in parallel.

$$15y_n \equiv 15\sigma_3 - 45\sigma_1 \pmod{17}$$
$$17y_n \equiv 17\sigma_3 - 51\sigma_1 \pmod{15}$$
$$\rightarrow y_n \equiv \sigma_3 - 3\sigma_1 \pmod{15 \cdot 17}$$

[Exp. 18]

To obtain index "i", the following Expression 19 is used. Here also, addition/subtraction with modulo 17 between indexes multiplied by 15 and addition/subtraction with modulo 15 between indexes multiplied by 17 are performed simultaneously in parallel.

$$15i \equiv 15n + 15\sigma_1 \pmod{17}$$
$$17i \equiv 17n + 17\sigma_1 \pmod{15}$$
$$\rightarrow i \equiv n + \sigma_1 \pmod{17 \cdot 15}$$

[Exp. 19]

To execute addition and subtraction operations described above, a binary adder circuit is used, which is described later. By use of the above-described congruence division, the circuit scale is made small; and the calculation time shortened.

Next, the relationships between the respective indexes will be summarized below.

Figure 18:
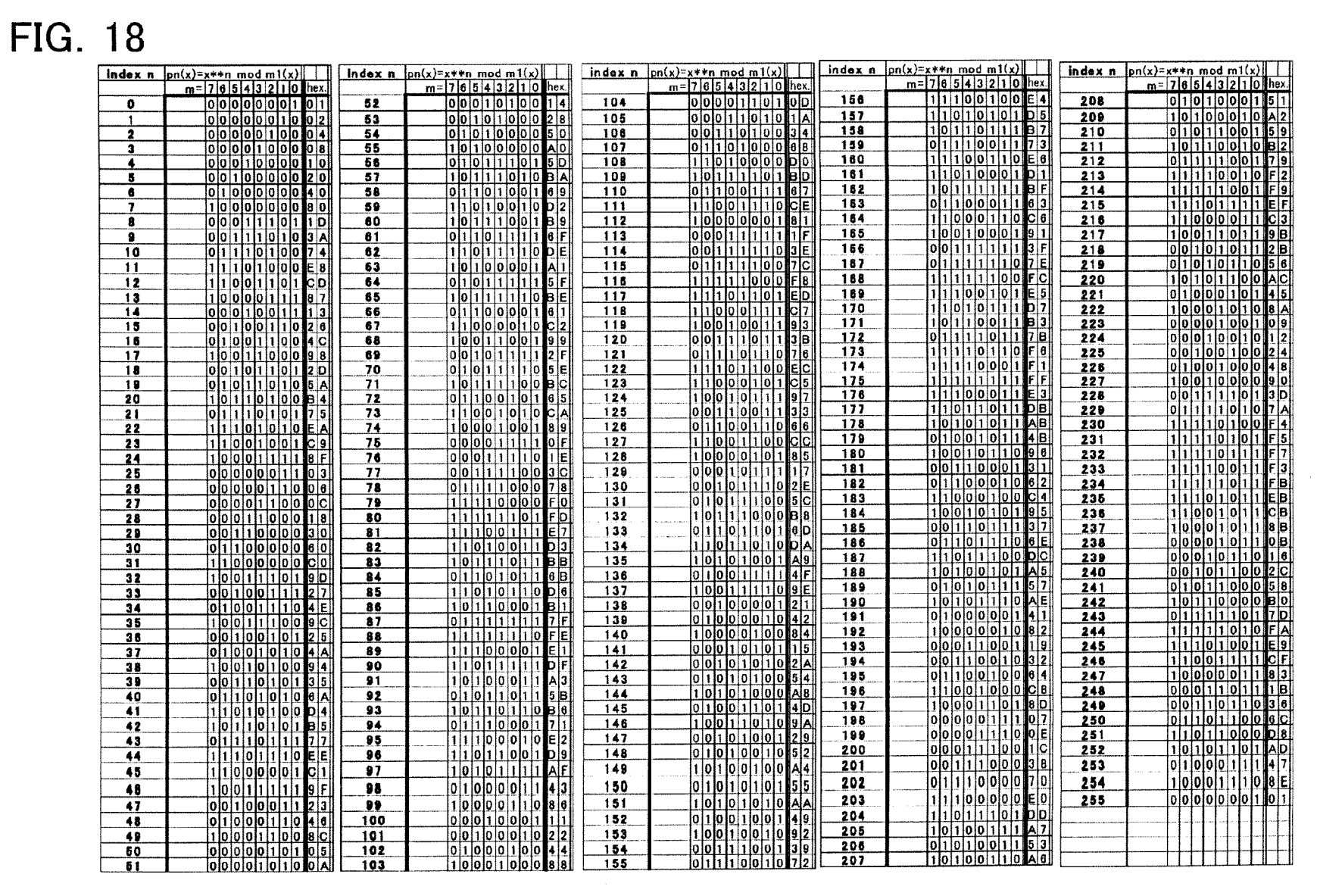

FIG. 18 shows the coefficient "1", "0" at every degree number "n" of polynomial $p''(x)$, which is the reminder of division of $x^n$ by $m_1(x)$, and hexadecimal indications thereof of degrees 0 to 3 and 4 to 7. All index relationship explained below will be calculated based on this table. That is, each of four basic operations for the root α of $m_1(x)$, which are performed by use of indexes, always corresponds to anywhere in this table with the relationship of one versus one.

Figure 19A:
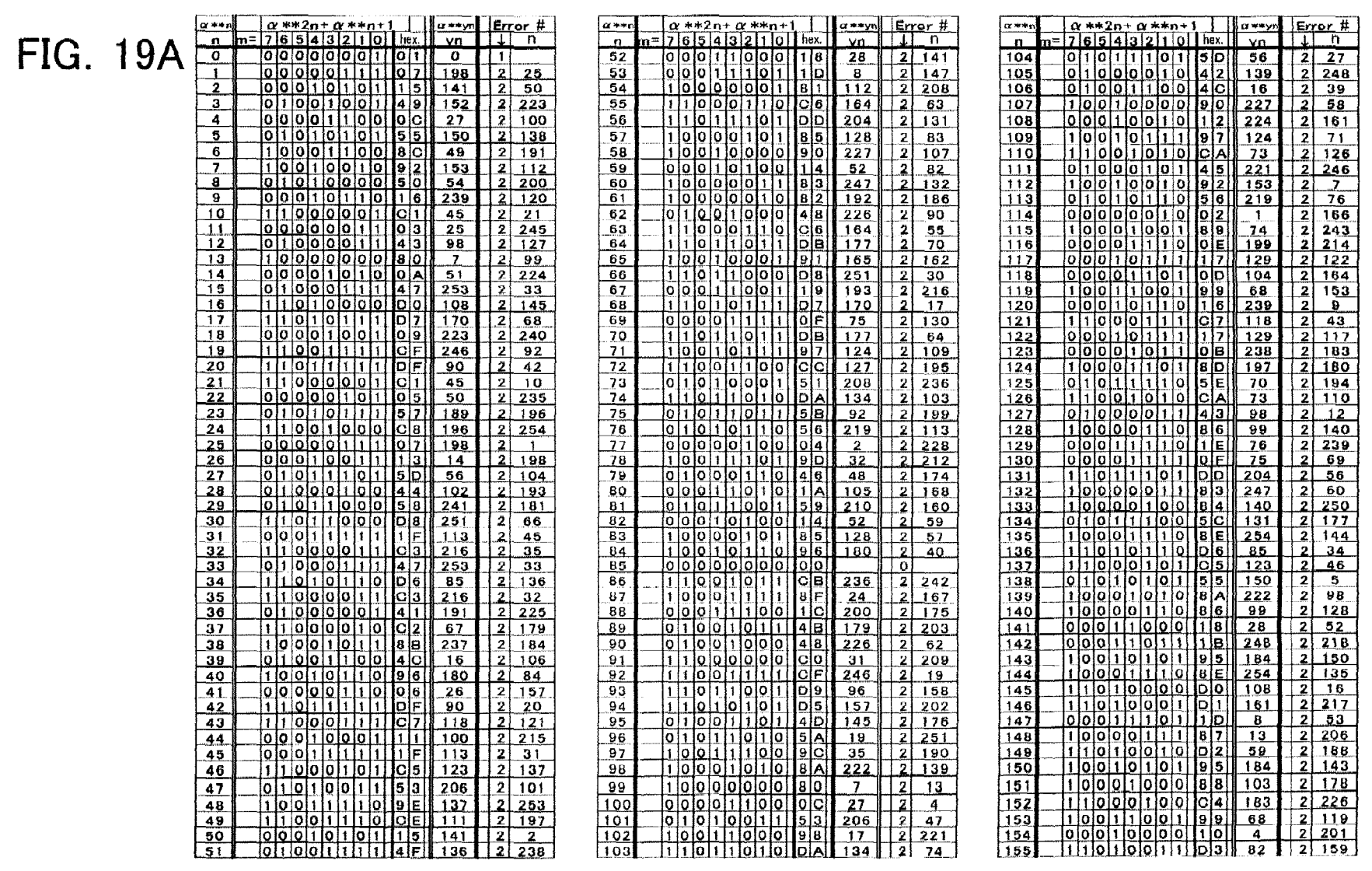

FIGS. 19A and 19B show, with respect to the index range of n=0 to 255, index $y_n$ of $y^2+y+1=\alpha^{y_n}$, coefficients of the corresponding polynomial and hexadecimal indications thereof. In case two "n"s correspond to the same $y_n$, the number of errors is 2 while in case one "n" corresponds to one $y_n$, there is one error. In case the number of errors is 2, it is shown that two indexes constituting a pair.

Note here that $y^2+y+1=0$ at indexes 85 and 170. This means that $S_3/S_1^3$ is 0 element of GF(256). In this case, there will be provided a control system, which directly controls an error correction circuit by use of the syndrome value.

Figure 20:
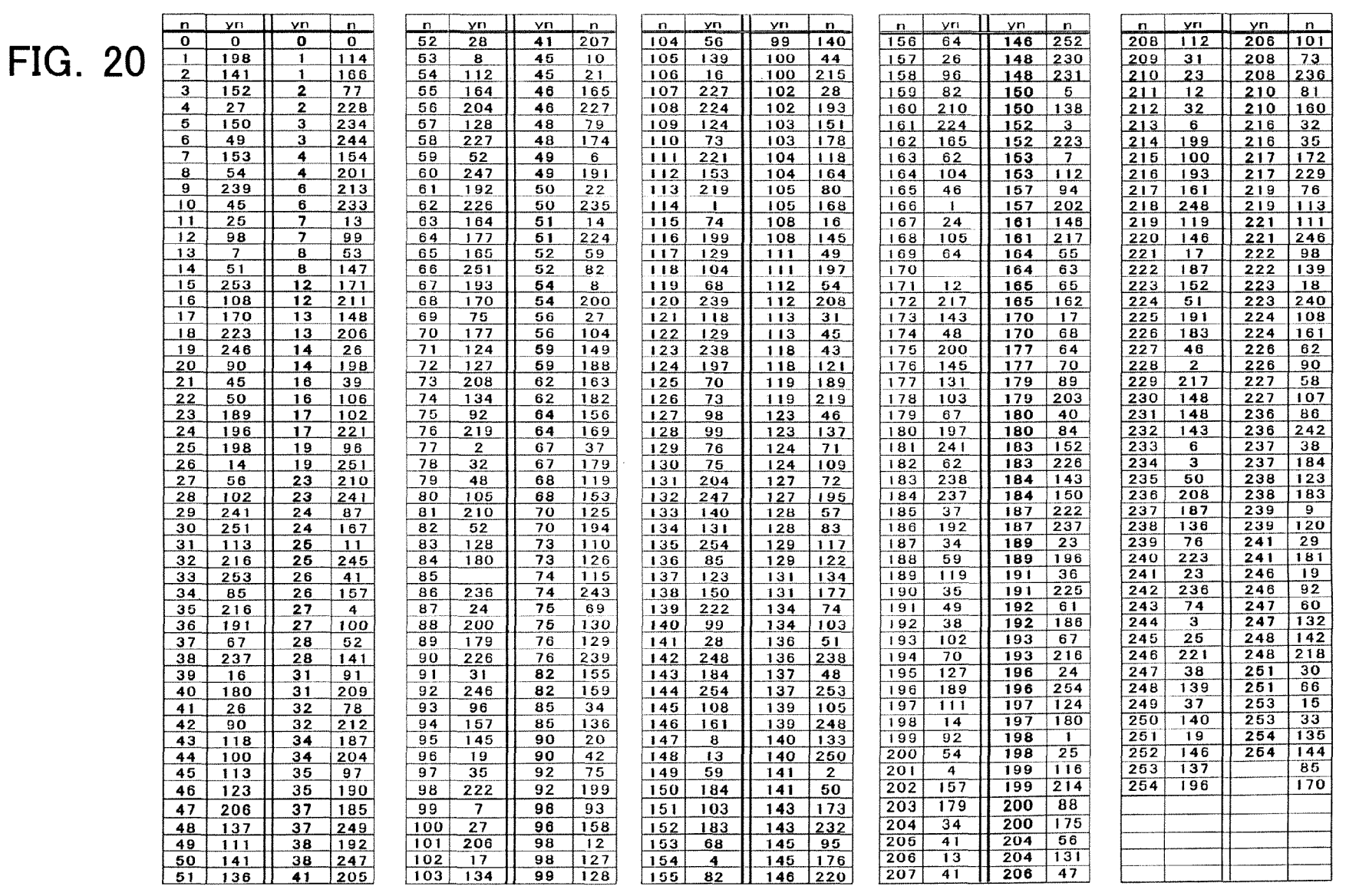

FIG. 20 shows summarized relationships between index "n" and "$y_n$" in which two tables are arranged in parallel as follows: in one table, "$y_n$" is arranged in order of "n"; in the other, "n" is arranged in order of "$y_n$". In the latter table, it is shown that two "n"s correspond to the same $y_n$ except $y_n=0$. At n=85 and n=170, there is no corresponding $y_n$ (i.e., corresponding to element 0 of Galois field).

Figure 21:
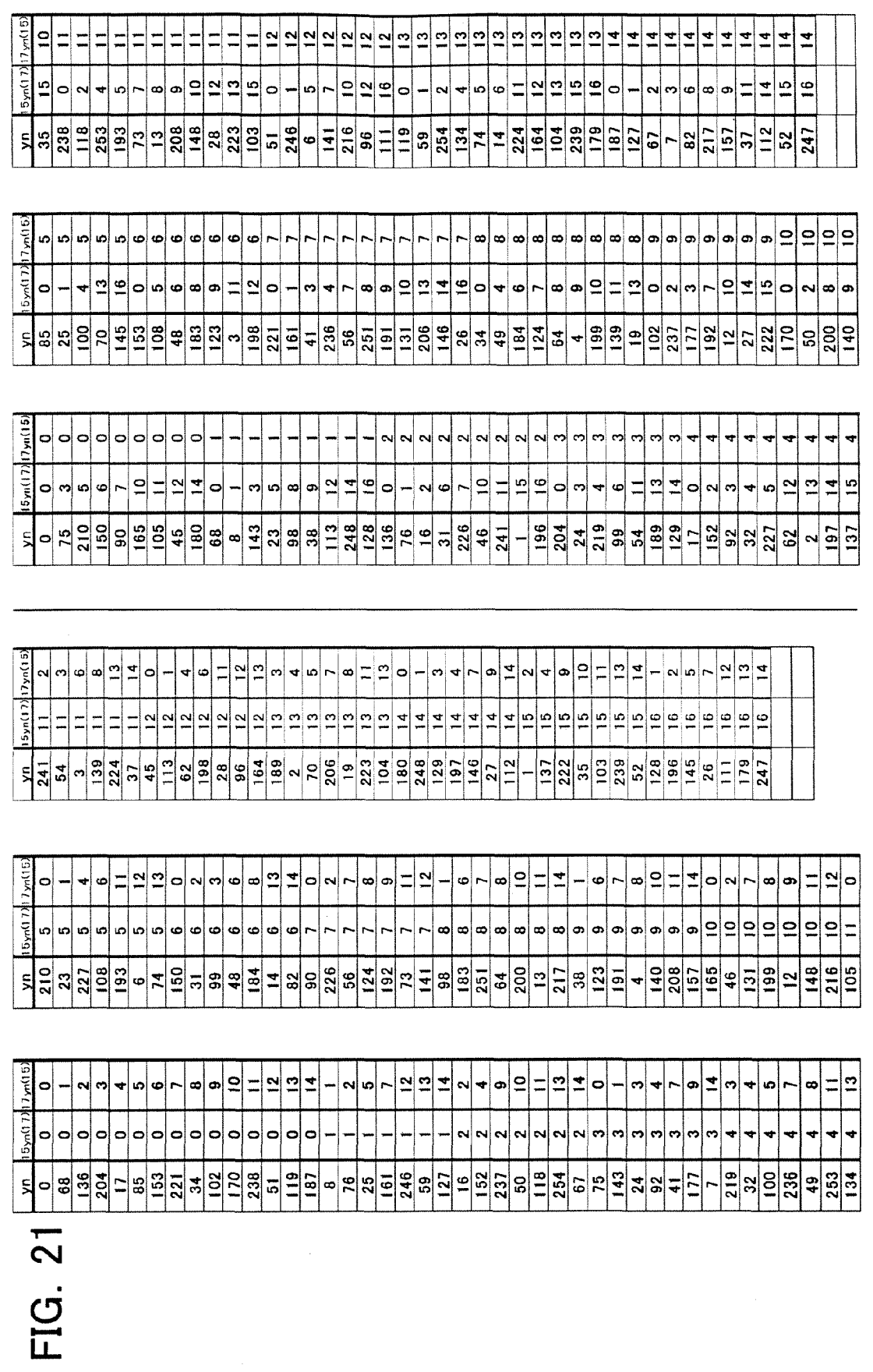

FIG. 21 shows that each index "$y_n$" is uniquely classified by $15y_n$(mod 17) and $17y_n$(mod 15). In the left half of FIG. 21, "$y_n$" is arranged from the least side of $15y_n$(mod 17) while in the right half, "$y_n$" is arranged from the least side of $17y_n$(mod 15).

It will be apparent from the table shown in FIG. 21 that congruence's paralleling as shown in Expression 18 leads to reduction of the calculation scale. The calculations for the congruences of $15y_n$(mod 17) and $17y_n$(mod 15) bring a common element, that becomes "$y_n$" obtained from the syndrome index.

Figure 22:
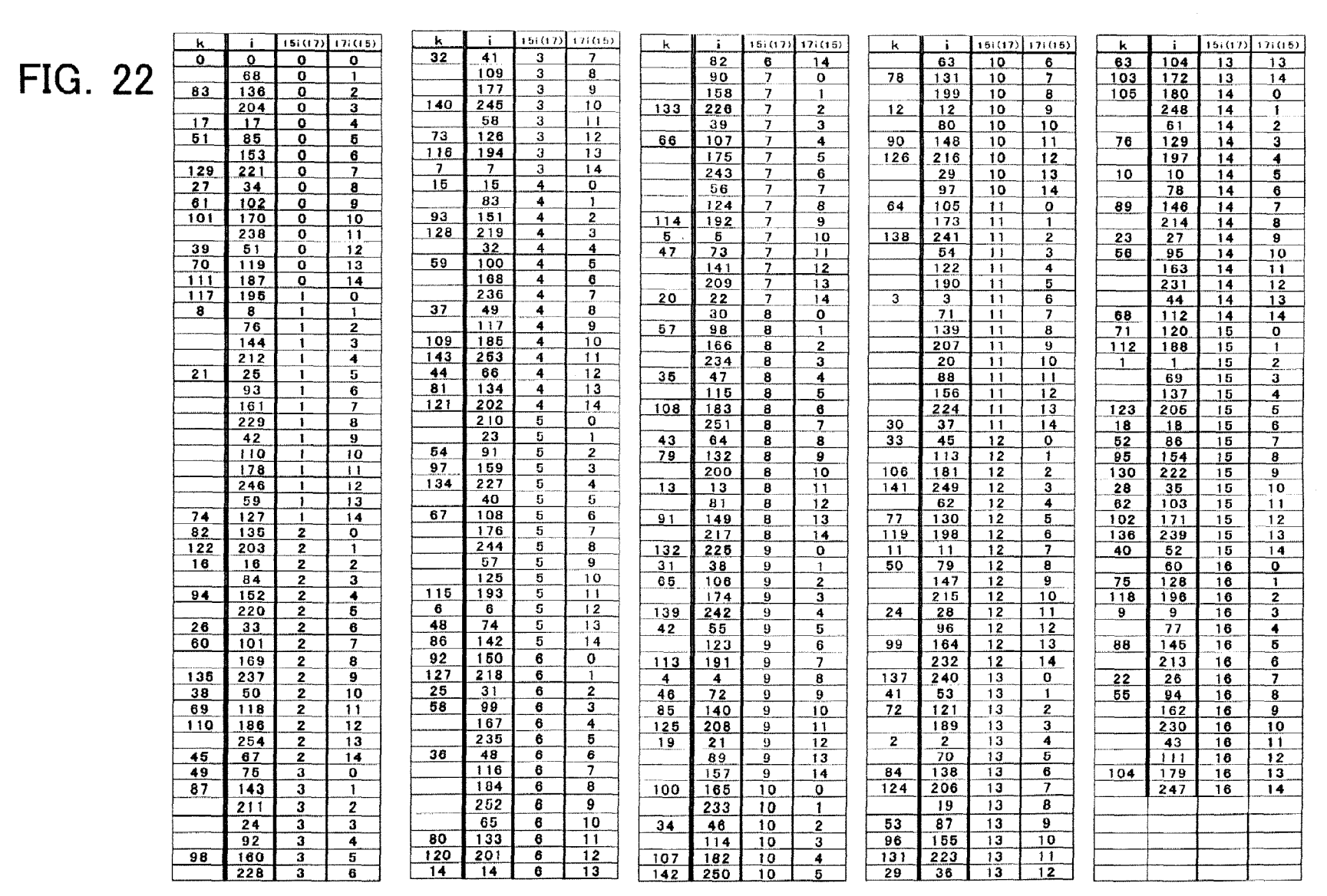

FIG. 22 shows the relationship between indexes "i" selected as data bits and the corresponding physical bit locations "k", and the index classification by 15i(mod 17) and 17i(mod 15). It is apparent from FIG. 22 that index "i" is classified into a pair defined by 15i(mod 17) and 17i(mod 15). It will be apparent from the table shown in FIG. 22 that congruence's paralleling as shown in Expression 19 leads to reduction of the calculation scale.

The calculations for the congruences of 15i(mod 17) and 17i(mod 15) bring a common element, that becomes "i" (i.e., "k") obtained from index "n" and that of syndrome $S_1$ when the physical bit location is calculated.

Next, it will be explained an adder for performing addition/subtraction between indexes, which designate remainder classes.

Figure 23A:
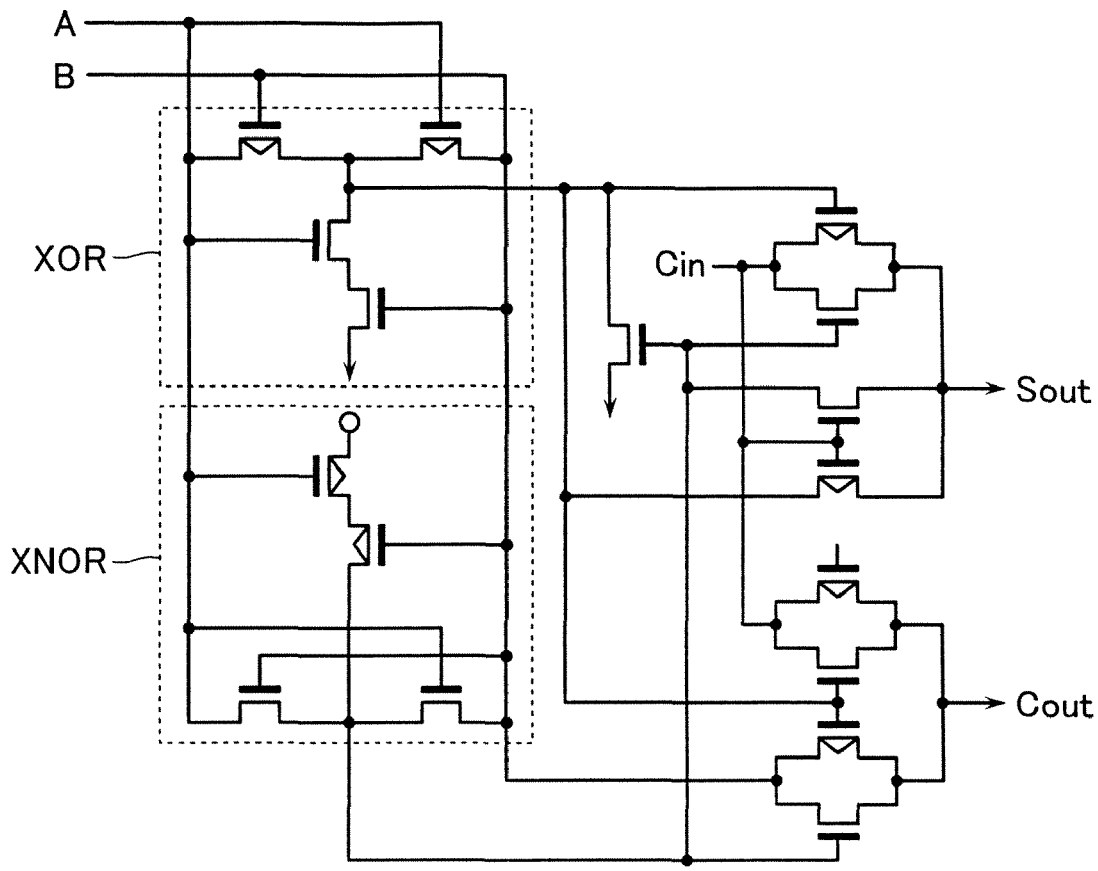
FIG. 23A shows a full adder for performing addition/subtraction of indexes.
Figure 23B:
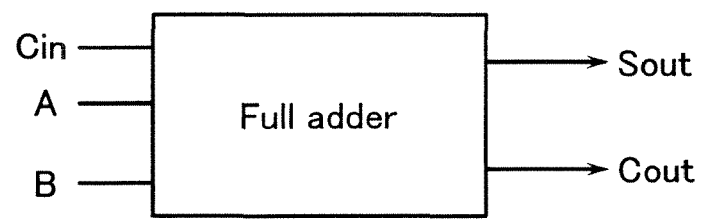
FIG. 23B circuit symbol thereof.

FIGS. 23A and 23B show a full adder and circuit symbol thereof, which serves as a basic unit for adding binary data. The full adder has an XOR circuit and an XNOR circuit for performing logic operations between to-be-added bits A and B, and logic operations between the result and carry signal Cin, thereby outputting the sum Sout of A, B and Cin and carry signal Cout.

With this full adder, there are provided for the purpose of error location searching adder circuits used for the congruence calculation as follows.

Figure 24:
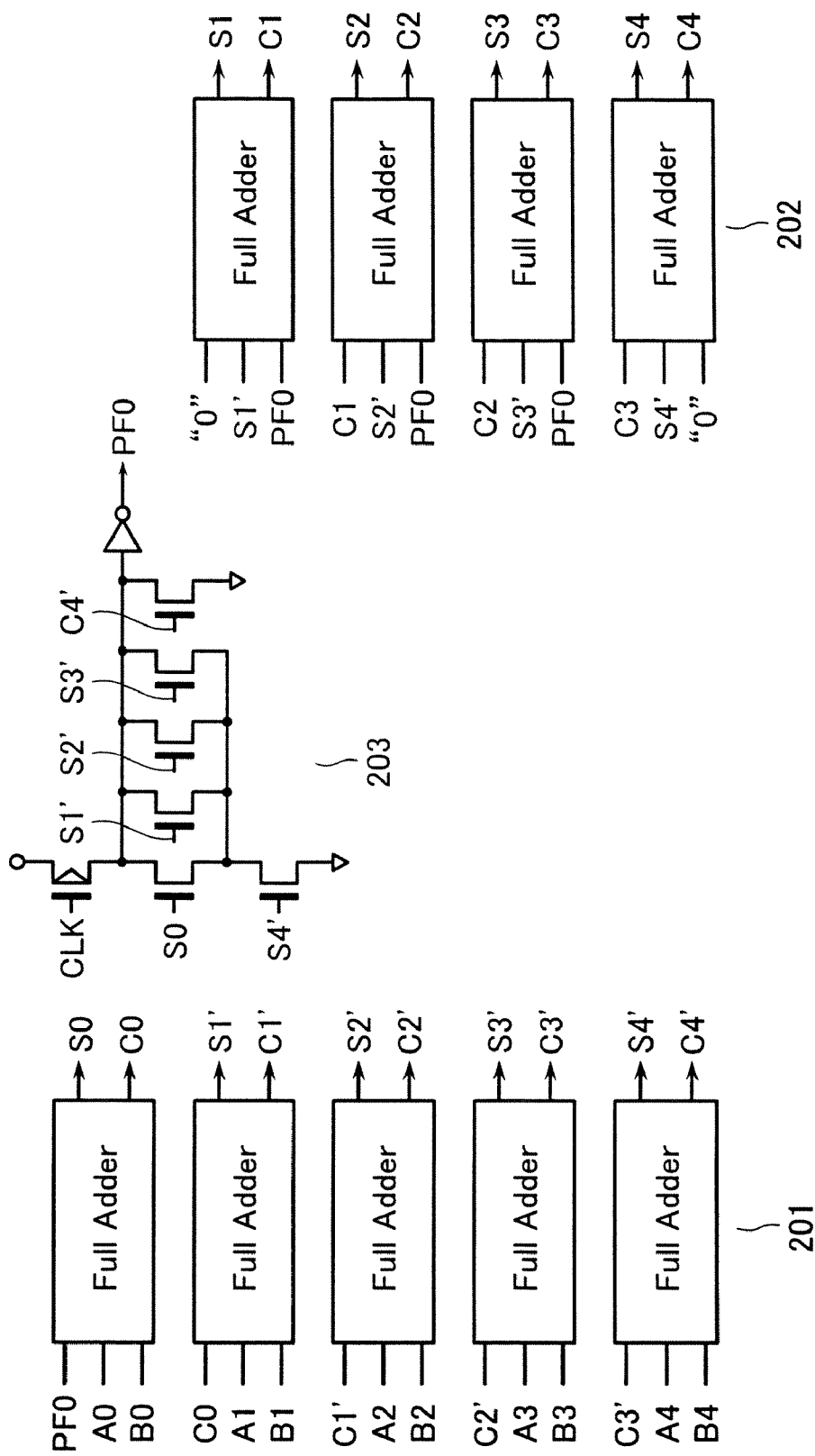
FIG. 24 shows a configuration of 5-bit adder(mod 17).
Figure 25:
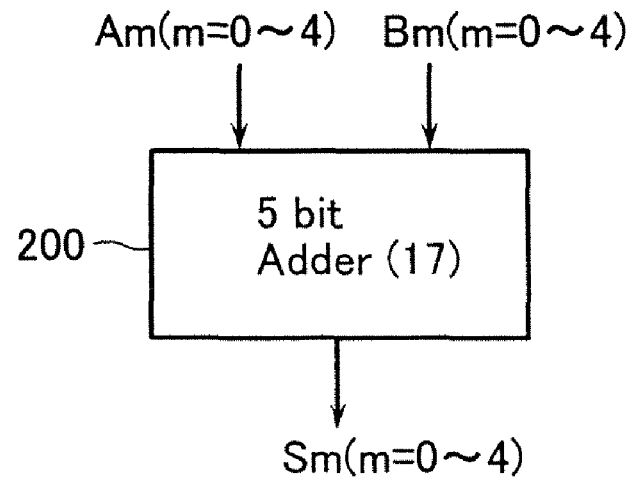
FIG. 25 shows the circuit symbol of the adder shown in FIG. 24.

FIG. 24 shows a 5-bit adder(mod 17) 200, which obtains a sum defined as a remainder obtained by modulo 17; and FIG. 25 shows circuit symbol thereof. This binary adder 200 has a first stage 5-bit adder 201; a carry correction circuit 203 for detecting that the sum of the first state is 17 or more to carry; and a second stage adder 202 for adding a complement of the sum for 32, i.e., 15 (=32−17), when the sum is 17 or more, together with the carry correction circuit 203.

The carry correction circuit 203 has a node, which is precharged by clock CLK generated at each operation cycle, and outputs signal PF0 in accordance with whether the node is discharged or not in response to the output state of the first stage adder 201. In detail, the carry correction circuit 203 detects that the uppermost bit S4' is "1", and at least one of other bits S0, S1' to S3 is "1", thereby detecting that the sum is 17 or more to output signal PF0="1".

The second stage, 4-bit adder circuit 202 receives the second to fifth bits, S1' to S4', of outputs of the first stage adder circuit 201, output signal PF0 of the carry correction circuit 203 and "0" as adding inputs to execute desirable complement addition. Explaining in detail, to add complement (01111) to the sum of the first stage adder circuit 201 when it becomes 17, (00001) is added to the result of the first stage adder circuit 201, and (01110) is further added in the second stage adder circuit 202.

Figure 27:
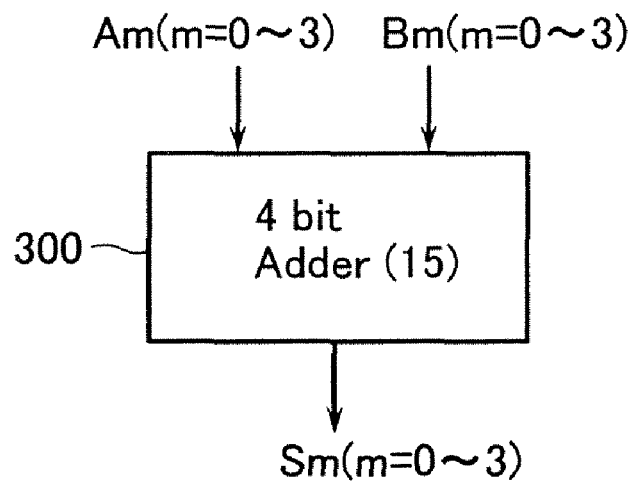
FIG. 27 shows the circuit symbol of the adder shown in FIG. 26.
Figure 26:
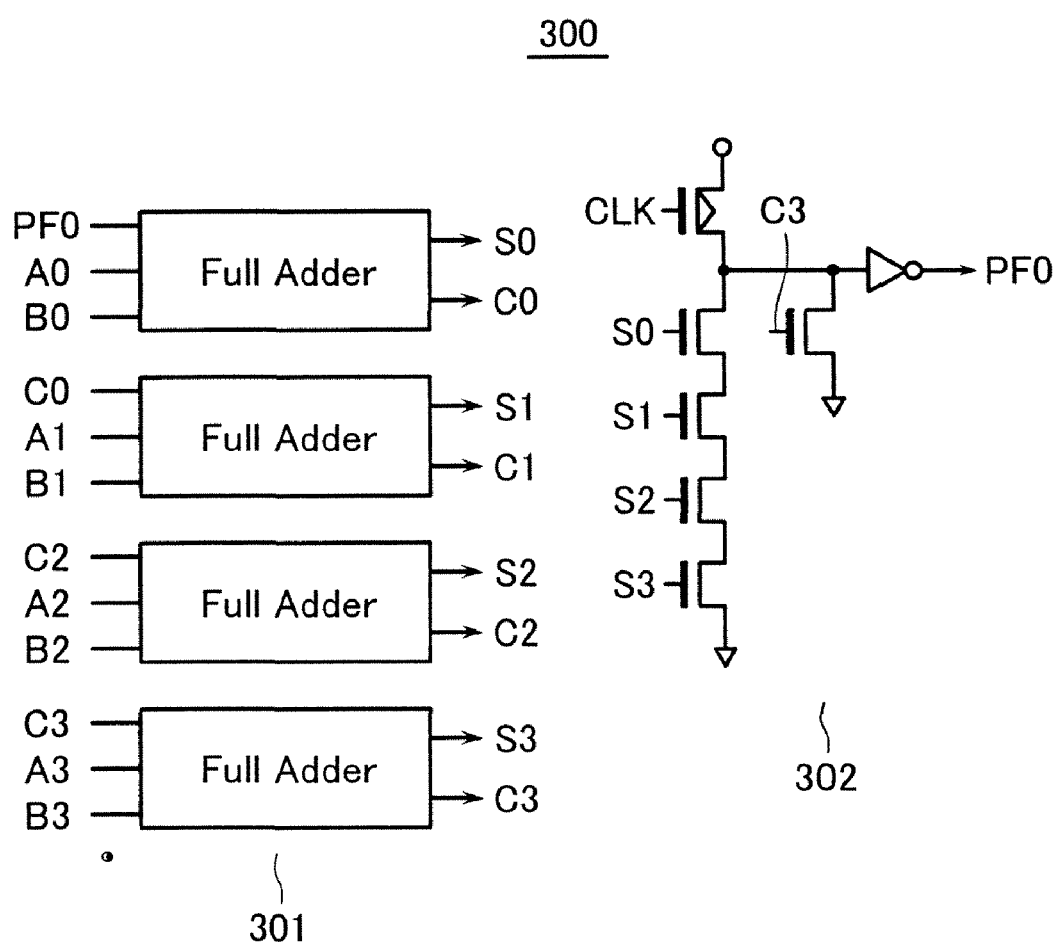
FIG. 26 shows a configuration of 4-bit adder(mod 15).

FIG. 26 shows a 4-bit adder(mod 15) 300, which obtains a sum defined as a remainder obtained by modulo 15; and FIG. 27 shows circuit symbol thereof. This binary adder 300 has a first stage 4-bit adder 301; and a carry correction circuit 302 for detecting that the sum of the first state is 15 or more to add a complement of the sum for 16, i.e., 1 (=16−15). The carry correction circuit 302 detects that all of the outputs S0 to S3 is "1" (i.e., the sum is 15) to output signal PF0="1". As described above, the 4-bit adder is configured as one of modulo 15.

Next, it will be explained examples adapted practically to an error location searching part.

Figure 28:
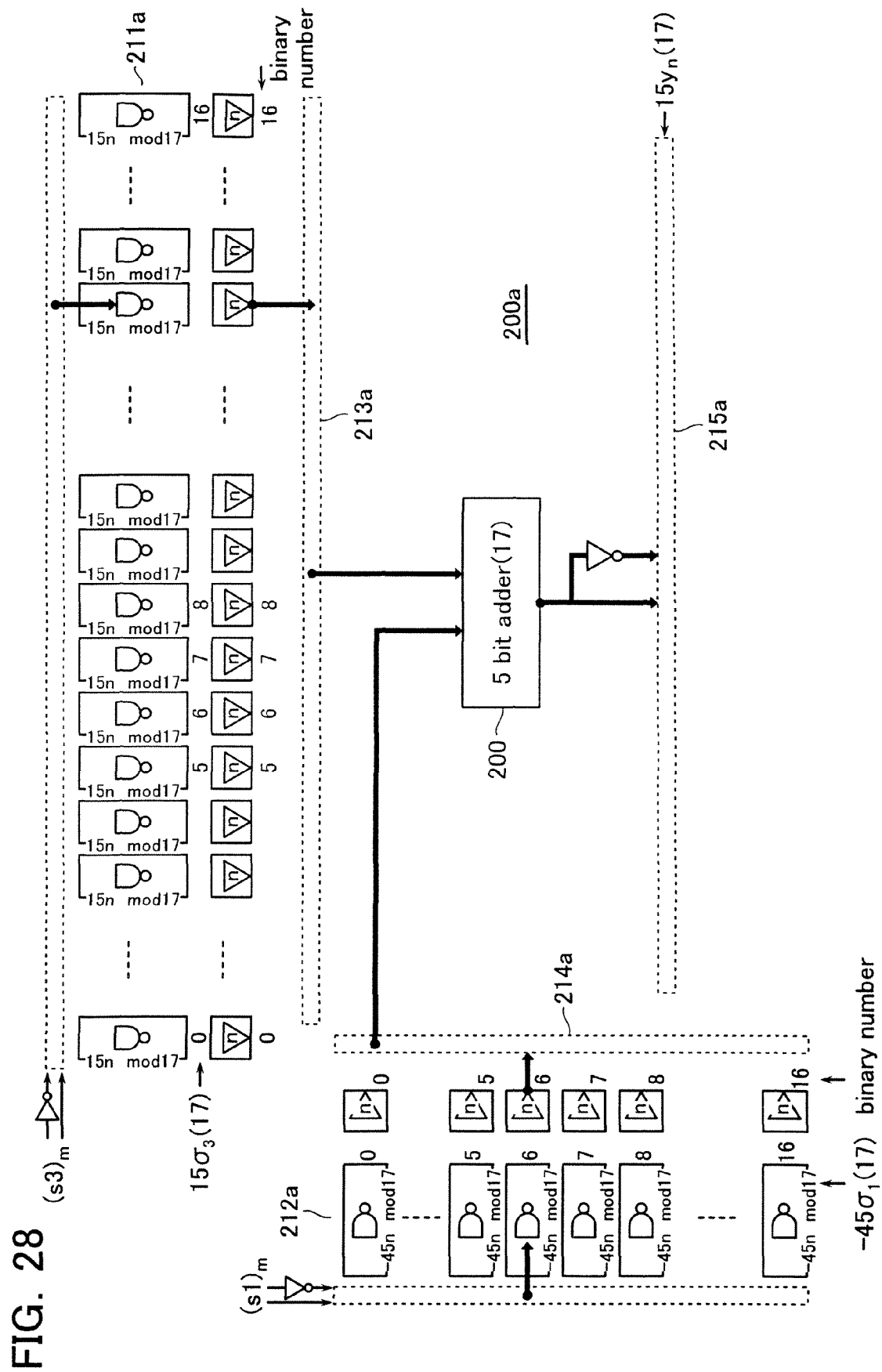
FIG. 28 is the index adder circuit for performing index operation of the first congruence in Expression 18.

FIG. 28 shows index adder circuit 200a, which has above-described 5-bit adder(mod 17) 200, for performing an index operation for the right side of the first congruence in Expression 18, i.e., $15y_n \equiv 15\sigma_3 - 45\sigma_1$ (mod 17).

Disposed on one input side of $\sigma_3$ are 17 decode circuits 211a, which decode coefficients $(s3)_m$ (m=0 to 7) of 7-degree syndrome polynomial obtained by syndrome calculation; select an input signal corresponding to an index position of $15\sigma_3$ (mod 17); and convert the index to 5-bit binary number and output it to data bus 213a.

Disposed on the other input side of $\sigma_1$ are 17 decode circuits 212a, which decode coefficients $(s1)_m$ (m=0 to 7) of 7-degree polynomial obtained by the syndrome calculation; select an input signal corresponding to an index position of $-45\sigma_1$(mod 17); and convert the index to 5-bit binary number and output it to data bus 214a.

The binary numbers on the data buses 213a and 214a are input to the 5-bit adder(mod 17) 200, and the sum of modulo 17 is output to data bus 215a. This output is indicated as binary number for designating the remainder class of $15y_n$ (17) in the above-described table.

Figure 29:
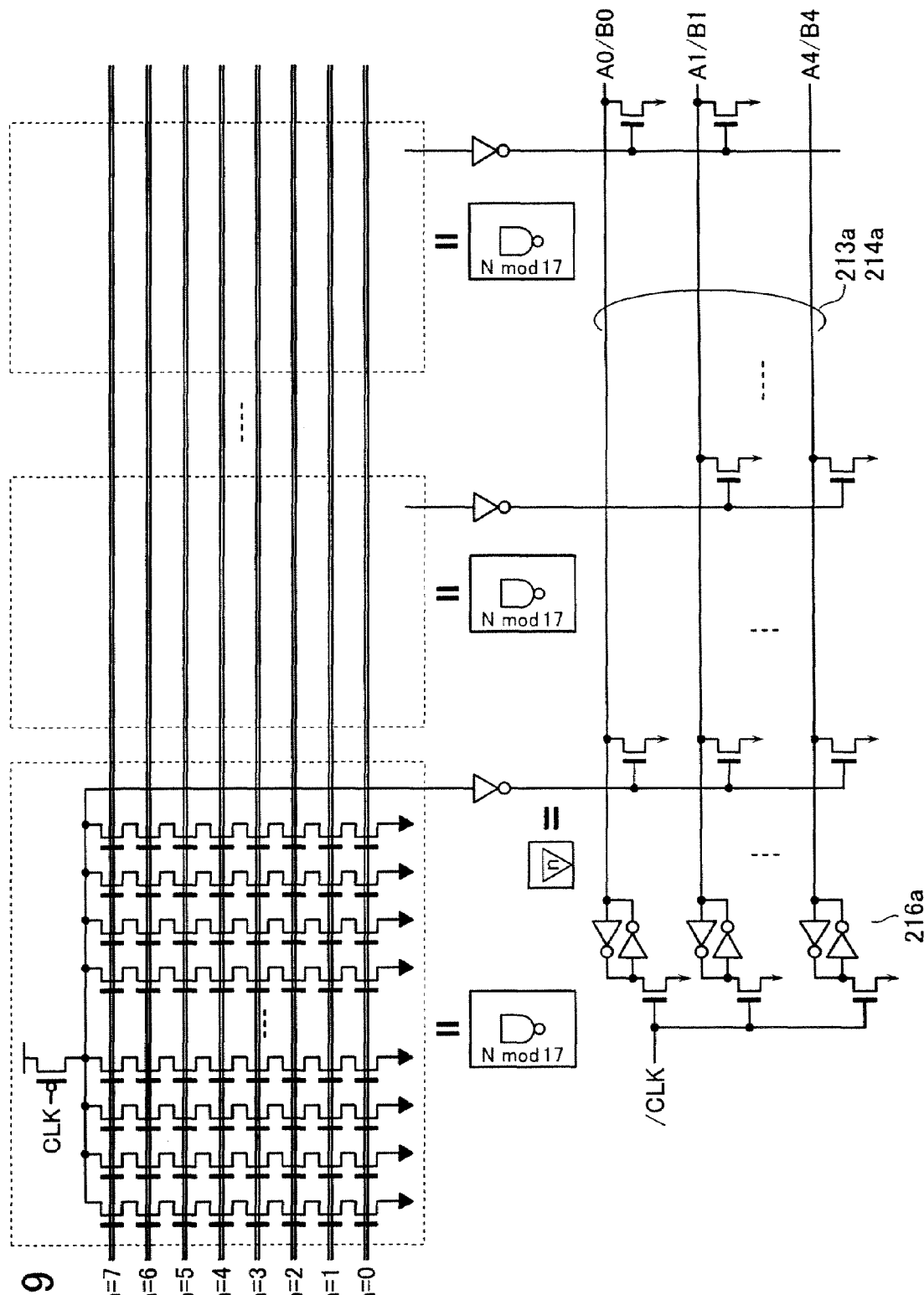
FIG. 29 is a decoder circuit used in FIG. 28.

FIG. 29 shows a configuration of the decode circuits 211a and 212a shown in FIG. 28. That is, the decoder is formed of NAND circuits arranged in parallel in number of the irreducible remainder polynomials p"(x) belonging to each remainder class. Each NAND circuit is formed of transistors connected in series with gates thereof being selectively applied with syndrome coefficients of m=0 to 7.

Precharge transistors are driven by clock CLK to precharge the corresponding common nodes. Whether the common nodes are discharged or not will serve as index signals of the remainder classes. Coefficient signal wirings and the inverted signal ones are disposed so as to constitute pairs, and these are selectively coupled to the gates of transistors in the NAND circuits in accordance with decoding codes.

The number of NAND nodes coupled in parallel is: 15 in case modulus of the remainder class is 17; and 17 in case that is 15.

The signal designating the remainder class index is decoded as an inverted binary number. In this case, digits Ai/Bi of the binary number are kept on the data bus 213a (or 214a) with latches 216a, which are reset by clock /CLK.

Figure 30:
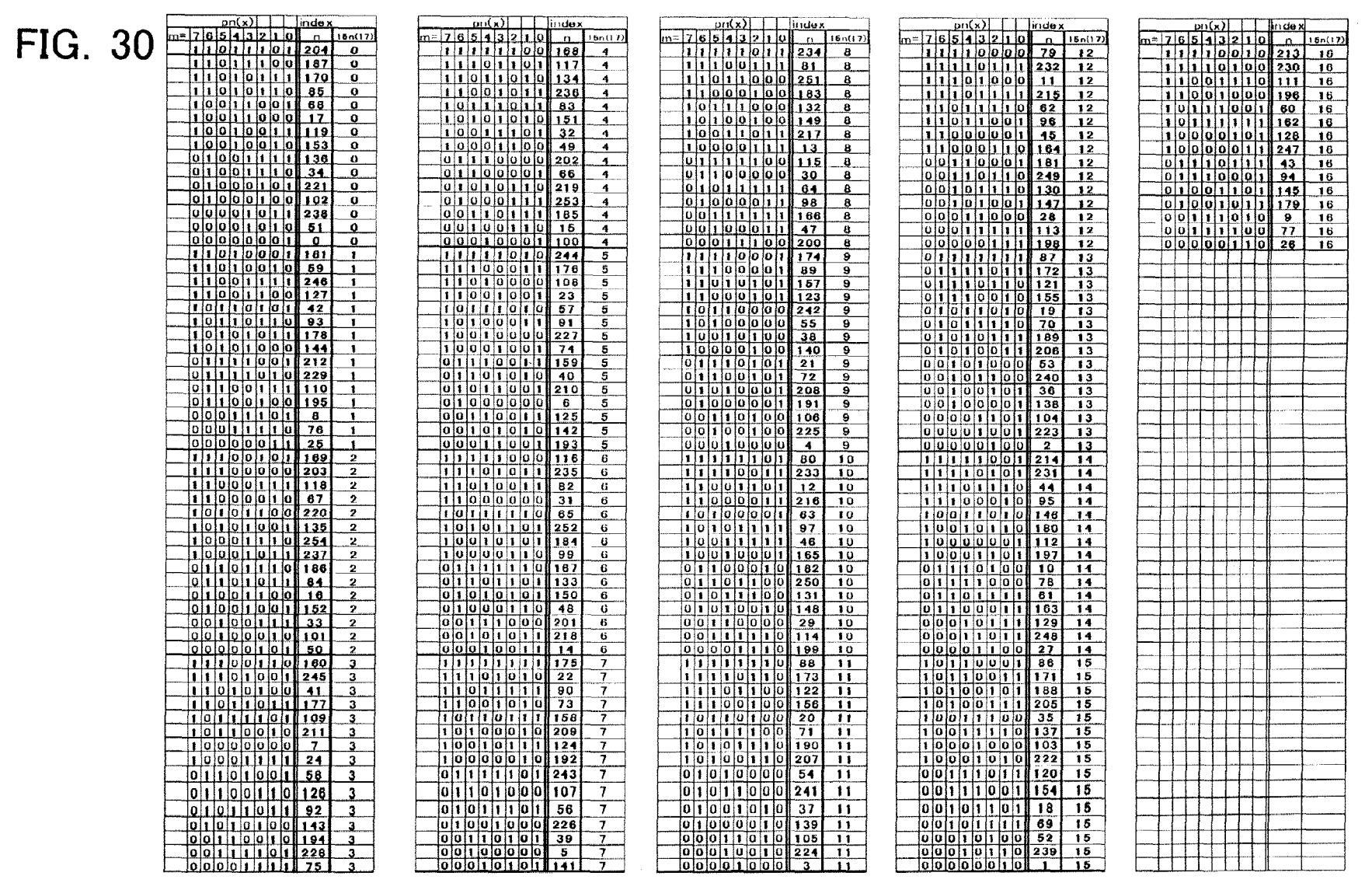

Similar decode circuit is also disposed on the other input node side. FIG. 30 is a decoder code table. In this table, indexes n of the irreducible remainder polynomial p″(x) are classified into the remainder classes 15n(17), which are obtained by modulo 17 with n being multiplied by 15. The remainders are classified by indexes 0 to 16, each of which includes 15 n's. In accordance with these coefficients of indexes of the corresponding p″(x), it will be determined which signal wirings are coupled to decode transistor gates.

For example, in case of index 1, NAND nodes to be coupled in parallel are those of: n=161, 59, 246, 127, 42, 93, 178, 144, 212, 229, 110, 195, 8, 76 and 25.

Figure 31:
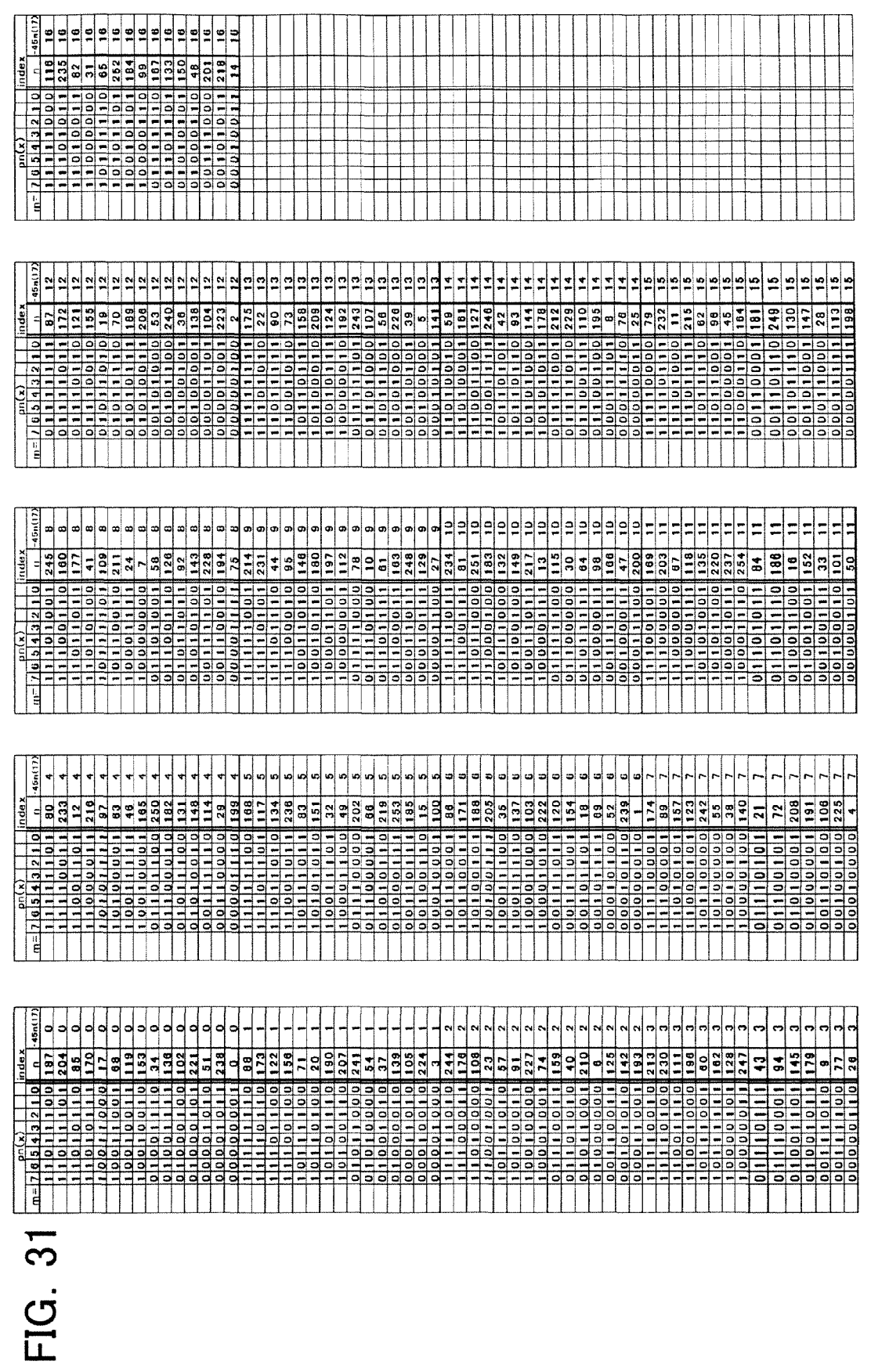

FIG. 31 shows such a table that indexes n of the irreducible remainder polynomial p″(x) are classified into the remainder classes −45n(17), which are obtained by modulo 17 with n being multiplied by −45. The remainders are classified by indexes 0 to 16, each of which includes 15 n's. In accordance with these coefficients of indexes of the corresponding p″(x), it will be determined which signal wirings are coupled to decode transistor gates.

For example, in case of index 1, NAND nodes to be coupled in parallel are those of: n=88, 173, 122, 156, 71, 20, 190, 207, 241, 54, 37, 139, 105, 224 and 3.

Figure 32:
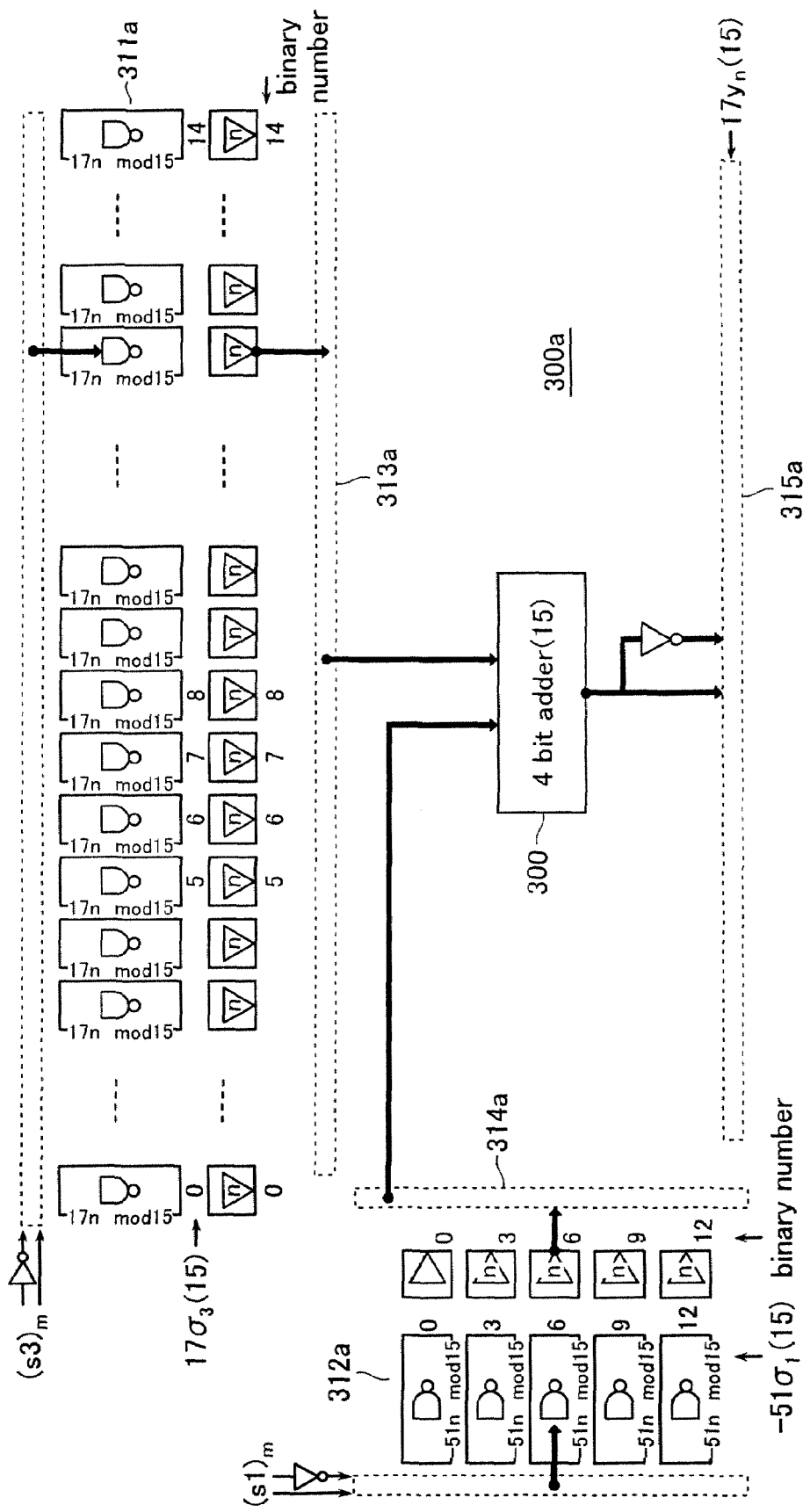
FIG. 32 shows the index adder circuit for performing index operation of the second congruence in Expression 18.

FIG. 32 shows index adder circuit 300a with 4-bit adder (mod 15) 300, which is for operating the right side of the second congruence (i.e., $17y_n \equiv 17\sigma_3 - 51\sigma_1$ (mod 15)) in Expression 18. That is, this is for obtaining $17\sigma_3 - 51\sigma_1$ (mod 15) from indexes $\sigma_3$ and $\sigma_1$.

Disposed on one input side of $\sigma_3$ are 15 decode circuits 311a, which decode coefficients $(s3)_m$ (m=0 to 7) of 7-degree syndrome polynomial obtained by syndrome calculation; select an input signal corresponding to an index position of $17\sigma_3$ (mod 15); and convert the index to binary number and output it to data bus 313a.

Disposed on the other input side of $\sigma_1$ are 5 decode circuits 312a, which decode coefficients $(s1)_m$ (m=0 to 7) of 7-degree syndrome polynomial obtained by syndrome calculation; select an input signal corresponding to an index position of $-51\sigma_1$ (mod 15); and convert the index to binary number and output it to data bus 314a. Since modulus is 15, 51 and 15 have a common prime 3. Therefore, remainder class number is 5 that is obtained by dividing 15 by 3, and the indexes of the remainder by modulo 15 are 0, 3, 6, 9, and 12. As a result, the number of decoders 312a is 5; and that of inputs also is 5.

Output to the output nodes are indexes, which designate the classes corresponding $17y_n(15)$ in the above-shown table.

Decode circuits are the same as shown in FIG. 29 except that input code is different from it.

Figure 33:
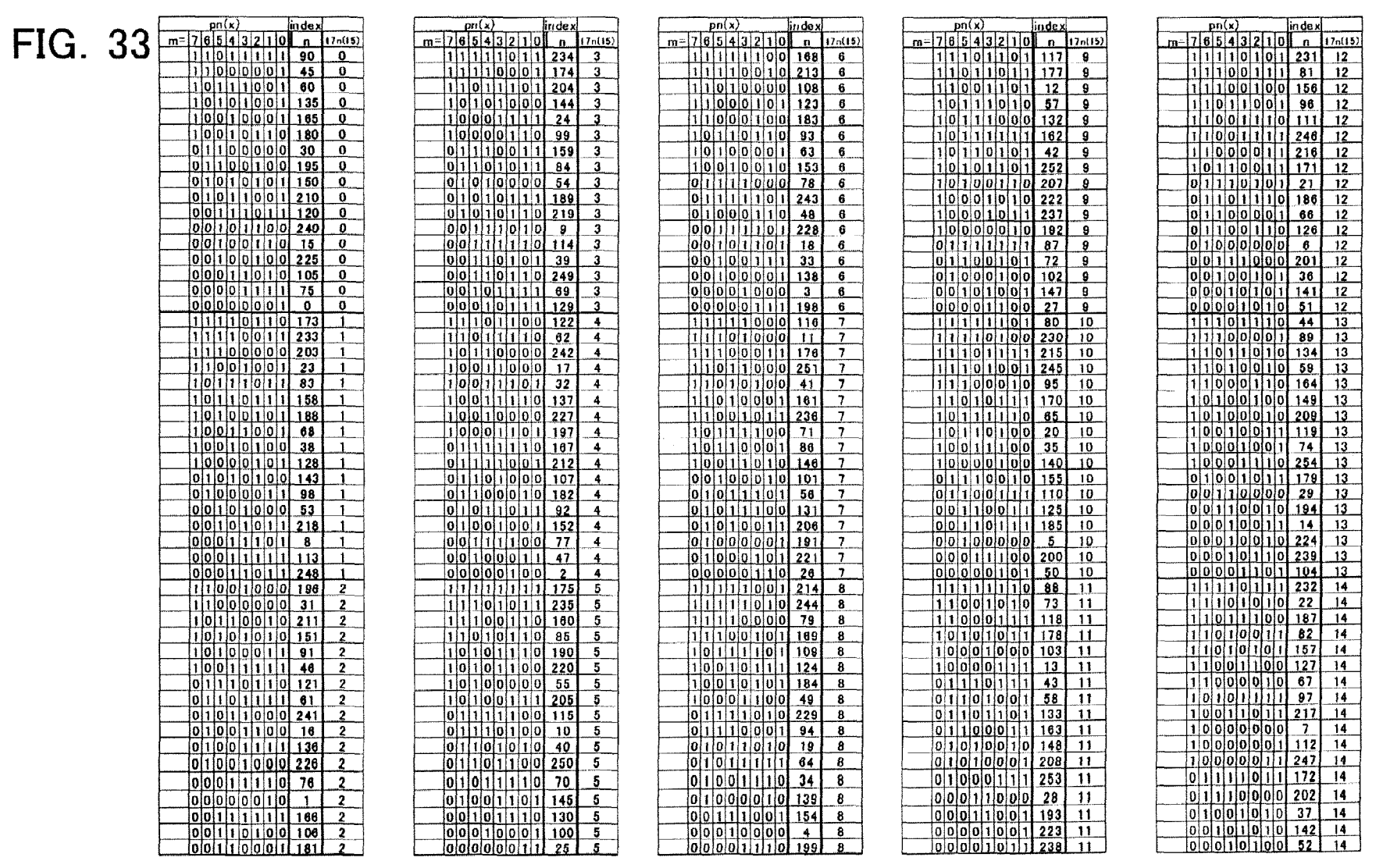

FIG. 33 shows such a table that indexes "n" of the irreducible remainder polynomial p″(x) are classified into the remainder classes 17n(15), which are obtained by modulo 15 with "n" being multiplied by 17. The remainders are classified by indexes 0 to 14, each of which includes 17 n's. In accordance with these coefficients of indexes of the corresponding p″(x), it will be determined which signal wirings are coupled to decode transistor gates.

For example, in case of index 1, NAND nodes to be coupled in parallel are those of: n=173, 233, 203, 23, 83, 158, 188, 68, 38, 128, 143, 98, 53, 218, 8, 113 and 248.

Figure 34:
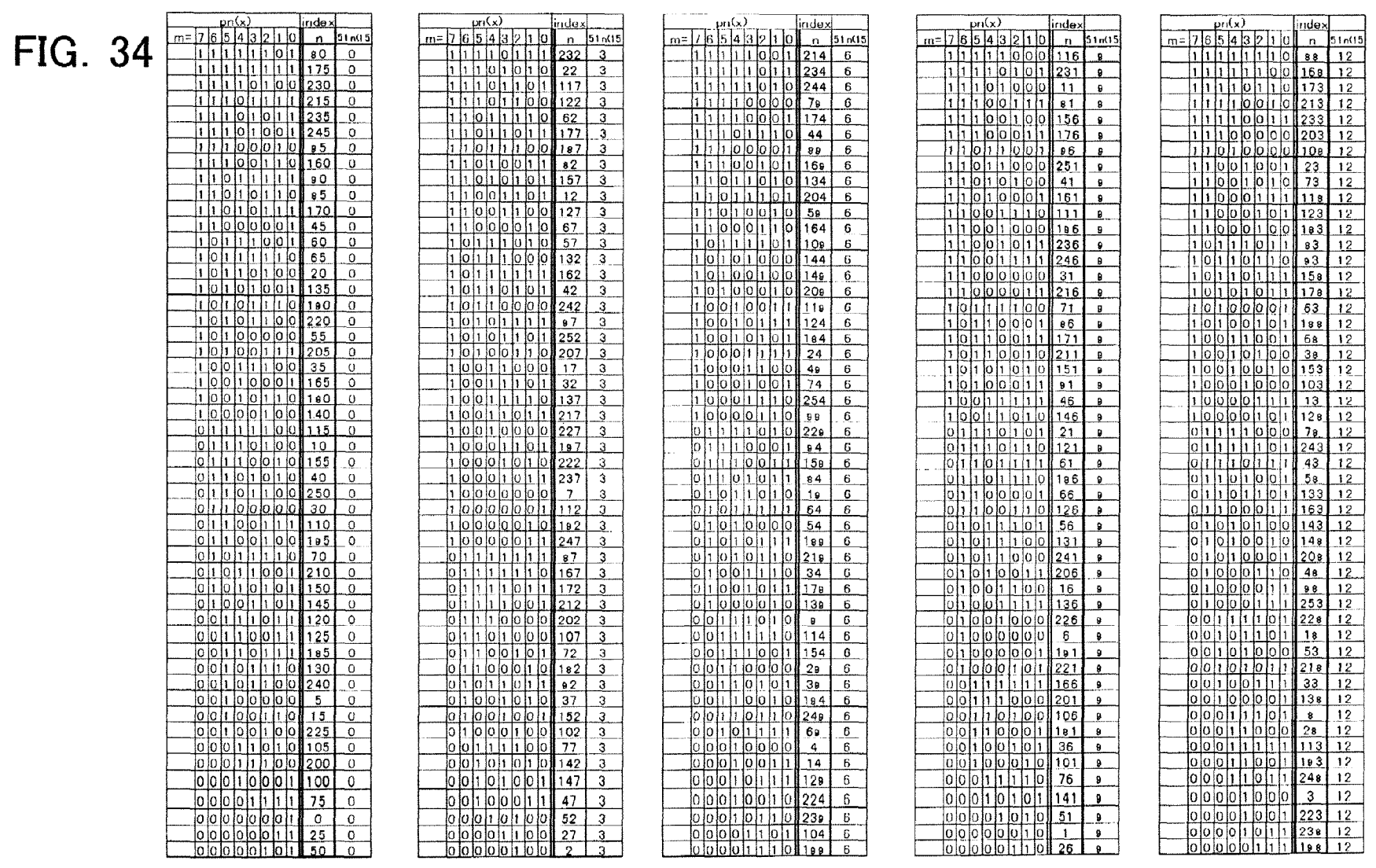

FIG. 34 shows such a table that indexes "n" of the irreducible remainder polynomial p″(x) are classified into the remainder classes −51n(15), which are obtained by modulo 15 with "n" being multiplied by −51. The remainders are classified by indexes 0, 3, 6, 9 and 12, each of which includes 51 n's. In accordance with these coefficients of indexes of the corresponding p″(x), it will be determined which signal wirings are coupled to decode transistor gates.

For example, in case of index 3, NAND nodes to be coupled in parallel are those of: n=232, 22, 117, 122, 62, . . . , 47, 52, 27 and 2.

Figure 35:
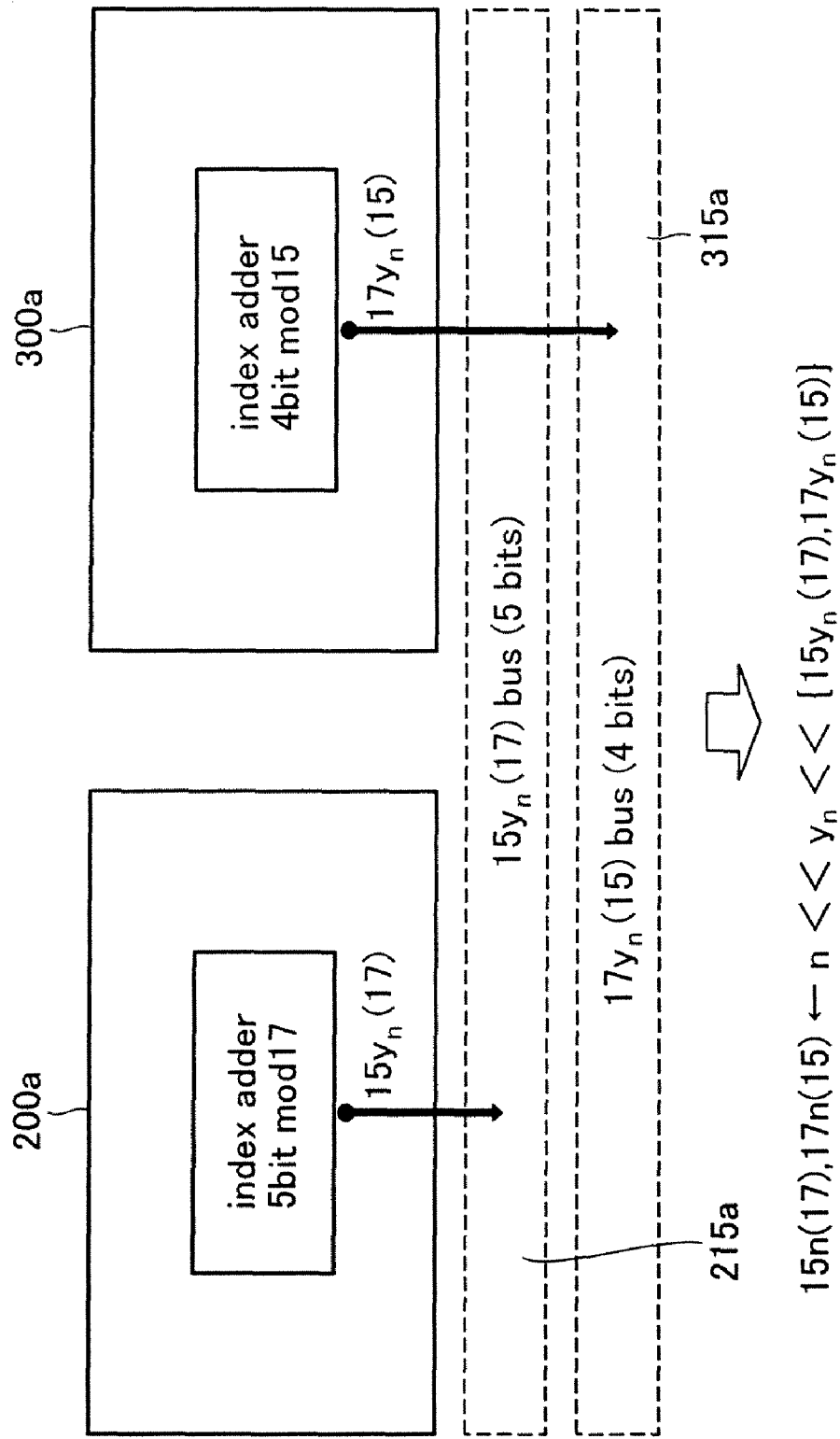
FIG. 35 shows output buses for integrating outputs of the index adders shown in FIGS. 28 and 32.

FIG. 35 shows a bus structure, which integrates the operation results of the above-described two index adder circuits 200a and 300a to output operation signals to the following stage. To output the output signals of the rotators 200a and 300a, there are prepared output buses 215a and 315a, which are formed of 5 and 4 wirings, respectively.

Based on the signals on these buses 215a and 315a, such a decoding is performed as: from $\{15y_n(17), 17y_n(15)\}$ to $y_n$; from $y_n$ to n; and from n to 15n(17), 17n(15), and the next stage calculation is followed.

Figure 36:
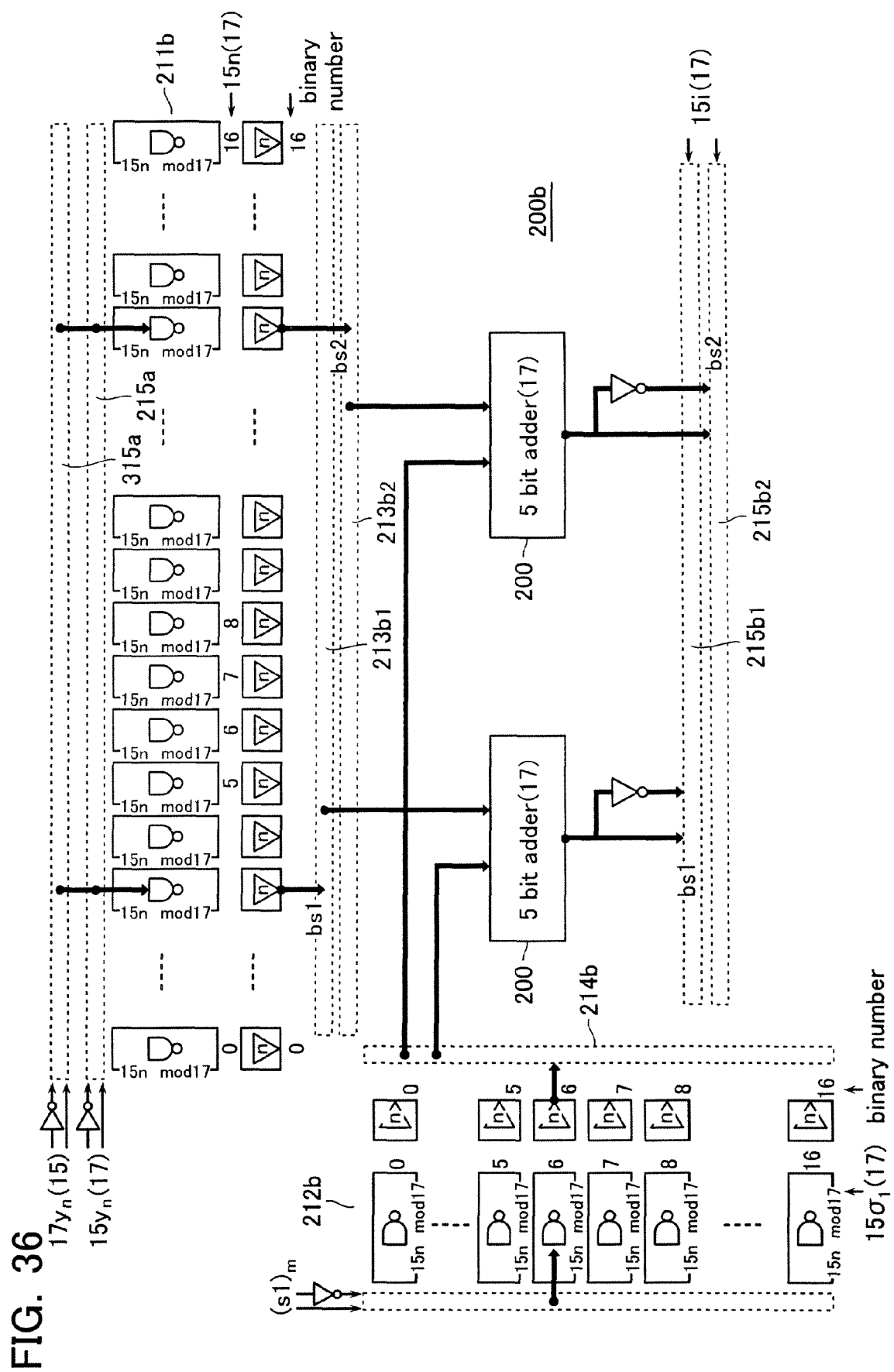
FIG. 36 shows the index adder circuit for operating the first congruence in Expression 19.

FIG. 36 shows index adder circuit 200b, which operates the right side of the first congruence (i.e., $15i \equiv 15n + 15\sigma_1$ (mod 17)) in Expression 19. One inputs are signals on buses 215a and 315a. To decode these signals and input indexes of 15n by modulo 17, 17 decoder circuits 211b are disposed.

Since a maximum of two indexes of 15n(17) are obtained from $15y_n(17)$ and $17y_n(15)$, it is in need of preparing two 5-bit adders(17) 200. To prevent these two inputs from being in collision with each other, decode circuits 211b have two output buses 213b1 and 213b2, which are independent of each other.

The other inputs are $\sigma_1$. Disposed on these input nodes are 17 decoder circuits 212b, which decode coefficients $(s1)_m$ (m=0 to 7) of 7-degree polynomial obtained by the syndrome calculation to drive an input signal at an index position of $15\sigma_1(17)$, i.e., the remainder class of $15\sigma_1$ obtained by modulo 17. These decoder circuits 212b have a common output bus 214b.

Obtained from the respective adders 200 are binary indicated indexes designating the remainder class of 15i by modulo 17 corresponding to 15i(17), which are output to data buses 215b1 and 215b2.

Figure 37:
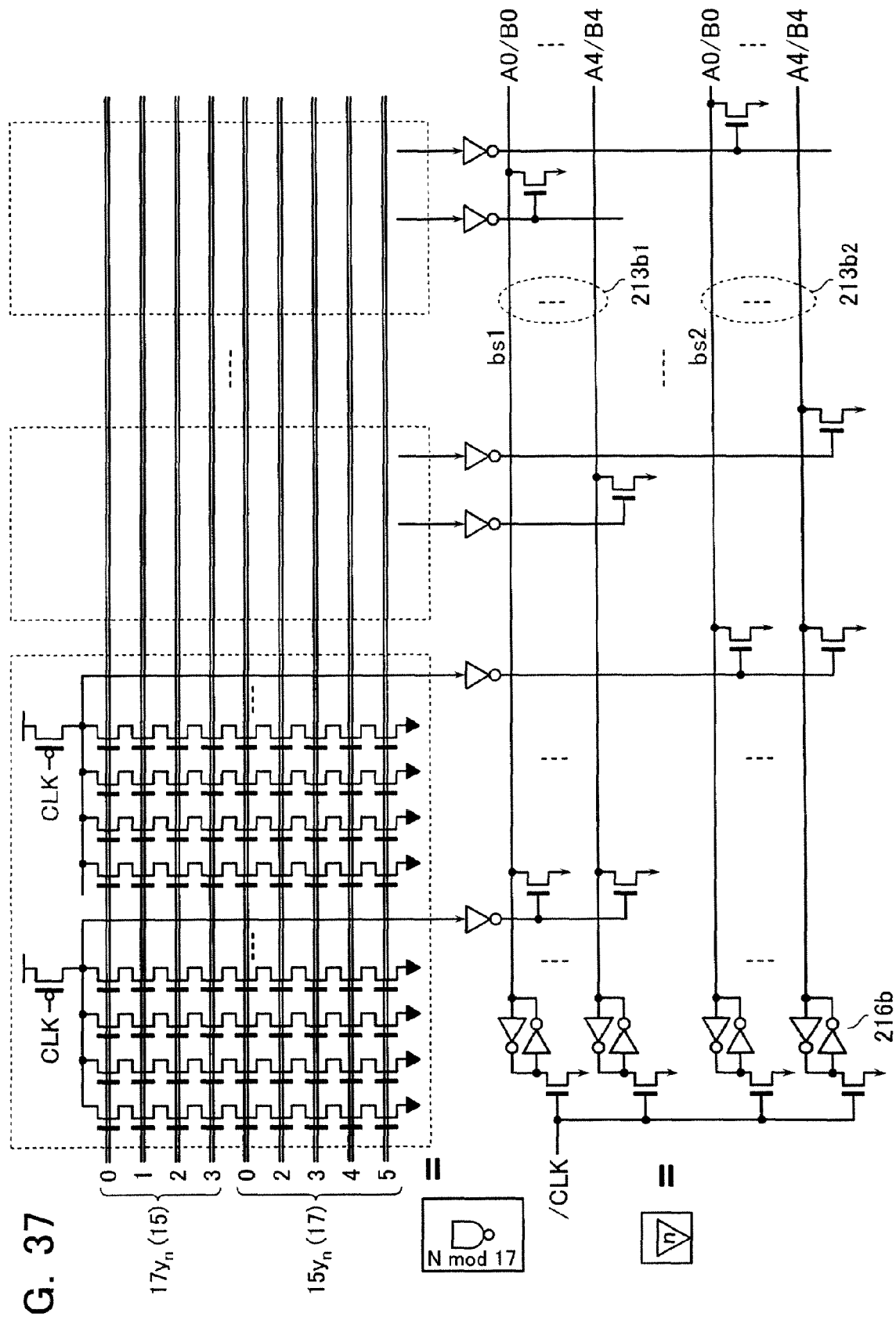
FIG. 37 shows the decode circuit used in FIG. 36.

FIG. 37 shows the configuration of the decode circuit 211b. there are disposed a certain number of NAND circuits coupled in parallel with transistors connected in series, the number being determined in accordance with the relationships between the remainder classes. The gates of the NAND circuits are selectively applied with the signals corresponding to the remainder class indexes $17y_n(15)$ and $15y_n(17)$, which are output from the preceding index adder circuits 200a and 300a. Each common node of NAND circuits connected in parallel, is precharged by precharge transistor driven by control signal CLK. Whether the common node is discharged or not serves as the index signal of a selected remainder class.

As apparent from a decoder table referred to later, two remainder classes are selected. Even if the two remainder classes are the same, it is necessary to prevent the two selected signals from being output to the same bus. Therefore, bus (bs1) 213b1 and bus (bs2) 213b2 are disposed independent of each other. On each transistor of NAND circuit, pair wirings are disposed, on which the remainder index $17y_n(15)$ or $15y_n(17)$ and the inverted signal are transmitted to be selectively coupled to the gate in accordance with decoding code. Each remainder index will be inverted and output as binary data. Two indexes are distributed to the bus 213b1 and 213b2. Each digit Ai/Bi is kept on the corresponding bus with latch 216b, which is reset by clock /CLK.

The decode circuit on the other input side may be formed with the same configuration as described above.

Next, the relationships between remainder classes and codes serving as decoder inputs will be explained below.

Figure 38:
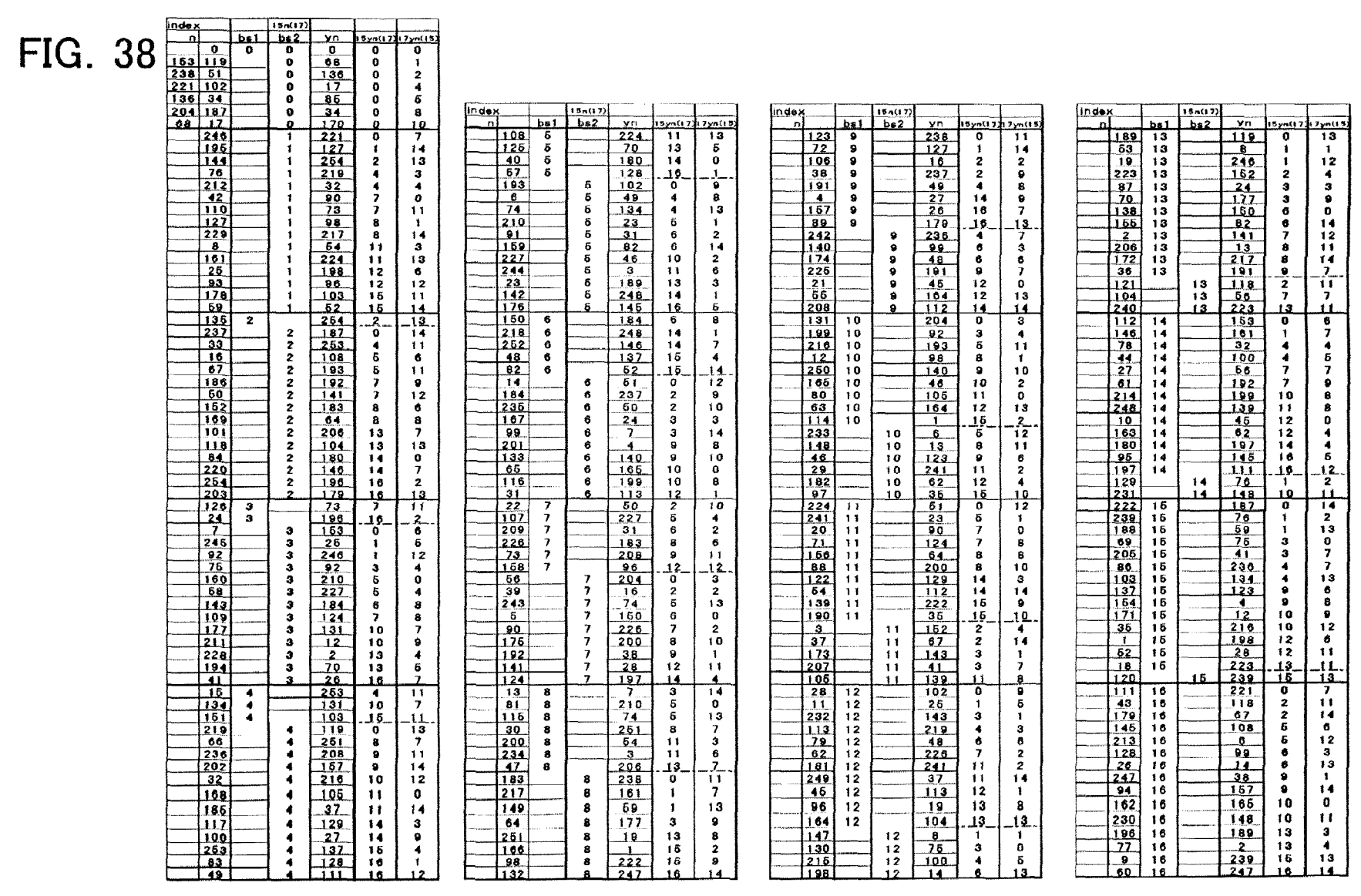

FIG. 38 shows the relationships between the remainder class indexes $15y_n(17)$, $17y_n(15)$ and $15n(17)$, and classes of $y_n$ and n corresponding thereto. Actually used for decoding are the remainder indexes only.

With respect to the remainder class $15n(17)$, components coupled to buses bs1 and bs2 are shown. This means that two $15n(17)$ simultaneously selected by each pair of $\{15y_n(17), 17y_n(15)\}$ belong to different buses. There is an exception to this rule. In case of $\{15y_n(17), 17y_n(15)\}=\{0,0\}$, "0" are output simultaneously to buses bs1 and bs2 because this case is 1-bit error. In this case, two adders execute the same calculation, and it will be avoidable to erroneously detect 2-bit error.

Except the above-described exception, for example, $\{15y_n(17), 17y_n(15)\}$ corresponding to the remainder class $15n(17)=5$ is as follows: $\{11, 13\}$, $\{13, 5\}$, $\{14, 0\}$, $\{16, 1\}$, $\{0, 9\}$, $\{4, 8\}$, $\{4, 13\}$, $\{5, 1\}$, $\{6, 2\}$, $\{6, 14\}$, $\{10, 2\}$, $\{11, 6\}$, $\{13, 3\}$, $\{14, 1\}$ and $\{16, 5\}$. Since $\{11, 13\}$, $\{13, 5\}$, $\{14, 0\}$ and $\{16, 1\}$ are coupled to bus bs1; and the remaining bs2, the decoder circuits are classified into two groups.

That is, the gate wirings designated by $\{15y_n(17), 17y_n(15)\}$ in the NAND circuit in FIG. 37 are selectively coupled to gates in accordance with binary indexes shown in the above-described table, so that binary data of $15n(17)$ will be output to buses 213b1 and 213b2.

Figure 39:
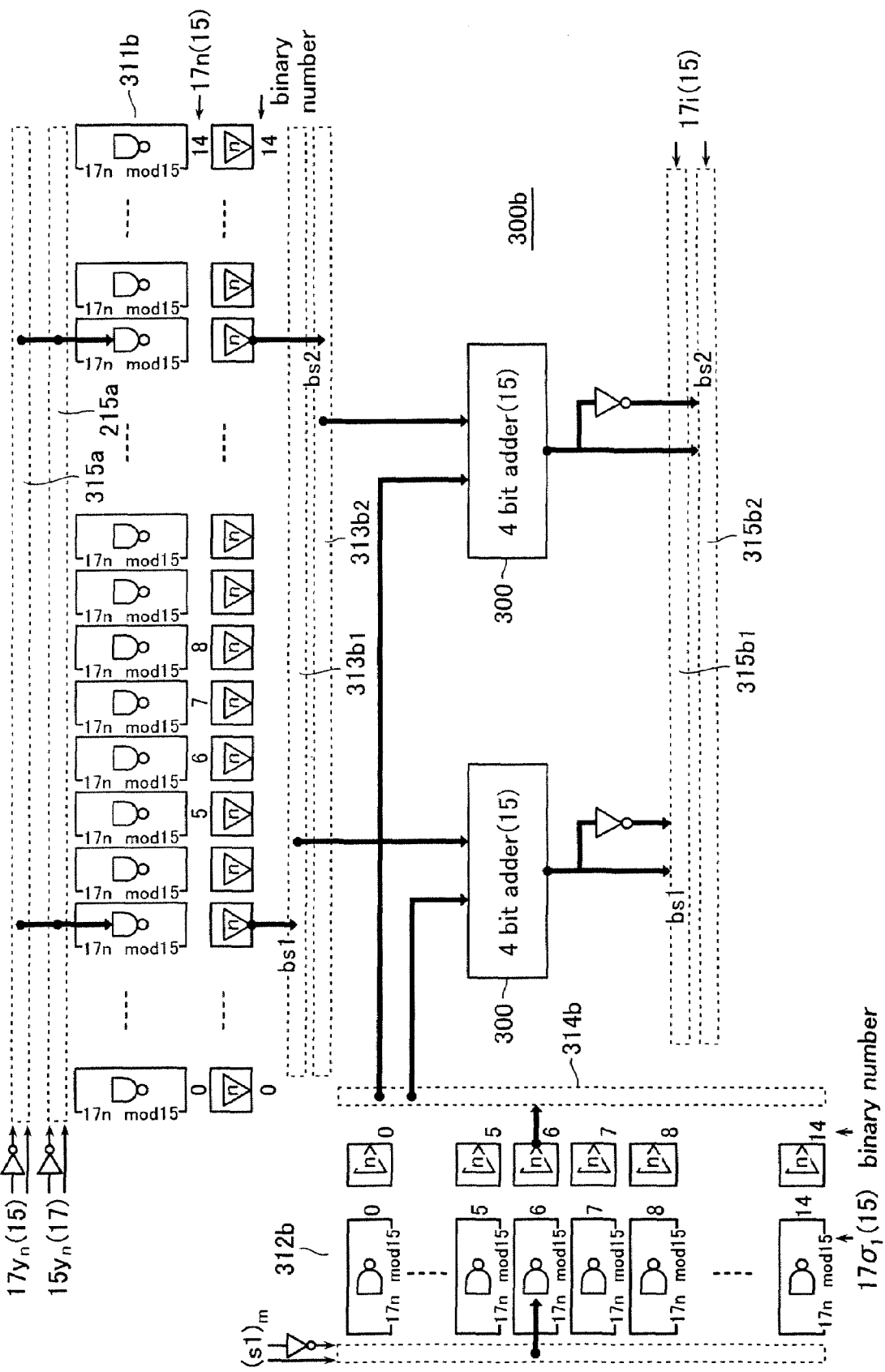
FIG. 39 shows the index adder circuit for operating the second congruence in Expression 19.

FIG. 39 shows index adder circuit 300b, which operates the right side of the second congruence (i.e., $17i=17n+17\sigma_1$ (mod 15)) in Expression 19. One inputs are signals on the index buses 215a and 315a. To decode these signals and obtain the binary-indicated remainder index of 17n by modulo 15, 15 decoder circuits 311b are disposed.

Since a maximum of two indexes of $17n(15)$ are obtained from $17y_n(15)$ and $15y_n(17)$, it is in need of preparing two 4-bit adders(15) 300. To prevent these two inputs from being in collision with each other, decode circuits 311b have two output buses (bs1) 313b1 and (bs2) 213b2, which are independent of each other.

Disposed on the other input side of $\sigma_1$ are 15 decoder circuits 312b, which decode coefficients $(s1)_m$ (m=0 to 7) of 7-degree polynomial obtained by the syndrome calculation to select a remainder class index position, i.e., the remainder class of $17\sigma_1$ obtained by modulo 15, thereby converting the index to binary data and outputting it to bus 314b.

Binary data corresponding to index $17i(15)$ obtained from the respective adders 200 are output to buses 315b1 and 315b2.

Figure 40:
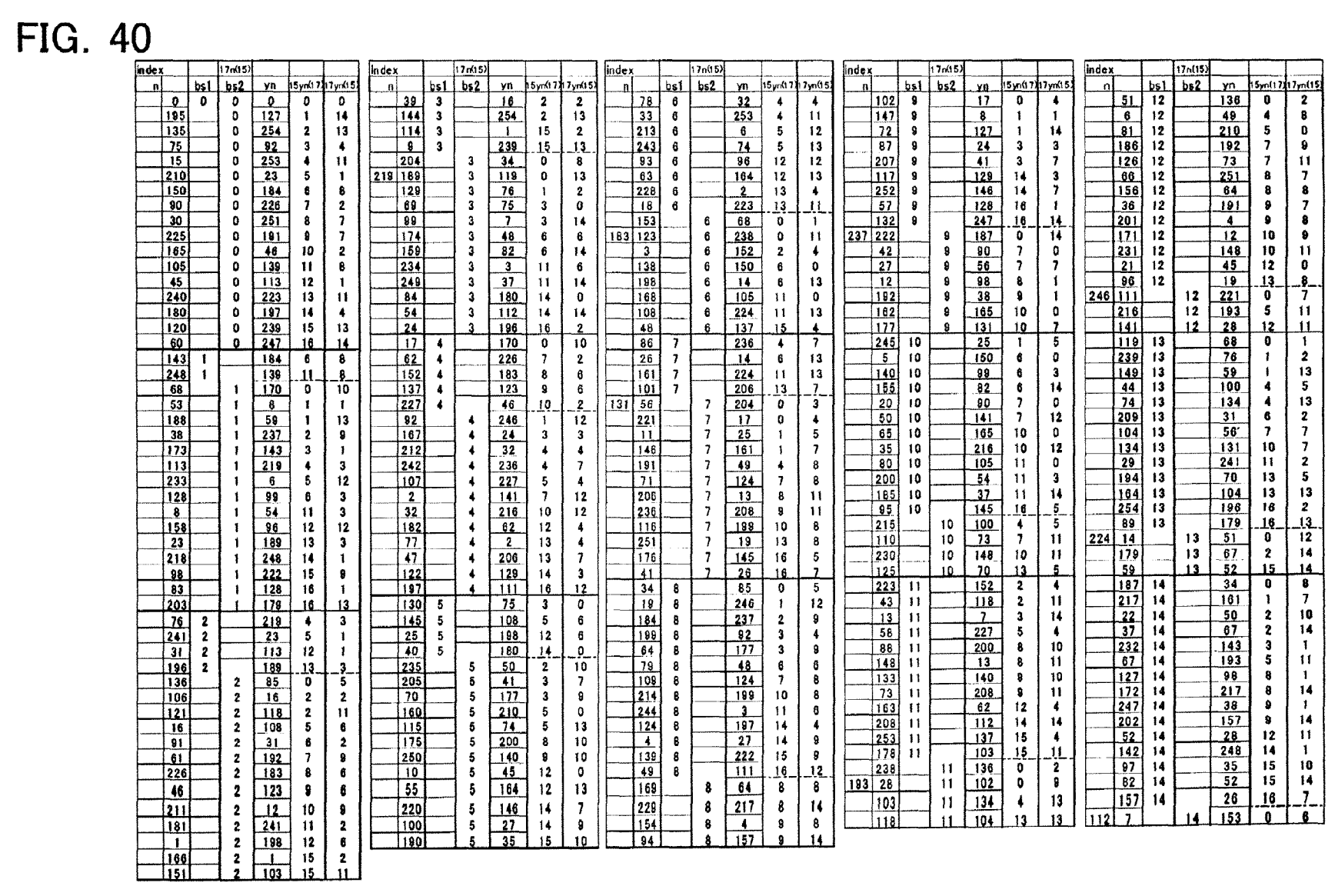

Four buses bs1 and bs2 are disposed on one input signal side decoder circuit 311b. FIG. 40 shows the decoder code. That is, FIG. 40 is a table showing the relationships between the remainder class indexes $15y_n(17)$, $17y_n(15)$ and $17n(15)$, and classes of "$y_n$" and "n" corresponding thereto. Actually used for decoding are the remainder indexes only.

With respect to the remainder class $15n(17)$, components coupled to buses bs1 and bs2 are shown. This means that two $17n(15)$ simultaneously selected by each pair of $\{15y_n(17), 17y_n(15)\}$ belong to different buses. There is an exception to this rule. In case of $\{15y_n(17), 17y_n(15)\}=\{0,0\}$, "0" are output to buses bs1 and bs2 simultaneously because this case is 1-bit error. In this case, two adders execute the same calculation, and it will be avoidable to erroneously detect 2-bit error.

Except the above-described exception, for example, $\{15y_n(17), 17y_n(15)\}$ corresponding to the remainder class $15n(17)=3$ is as follows: $\{2, 2\}$, $\{2, 13\}$, $\{15, 2\}$, $\{15, 13\}$, $\{0, 8\}$, $\{0, 13\}$, $\{1, 2\}$, $\{3, 0\}$, $\{3, 14\}$, $\{6, 6\}$, $\{6, 14\}$, $\{11, 14\}$, $\{14, 0\}$, $\{14, 14\}$ and $\{16, 2\}$. Decode outputs are output to buses as follows: $\{2, 2\}$, $\{2, 13\}$, $\{15, 2\}$ and $\{15, 13\}$ are coupled to bus bs1; and the remaining bs2.

That is, the gate wirings designated by $\{15y_n(17), 17y_n(15)\}$ in the NAND circuit in FIG. 39 are selectively coupled to gates in accordance with binary indexes shown in the above-described table, so that binary data of $17n(15)$ will be output to buses 315b1 and 315b2.

Figure 41:
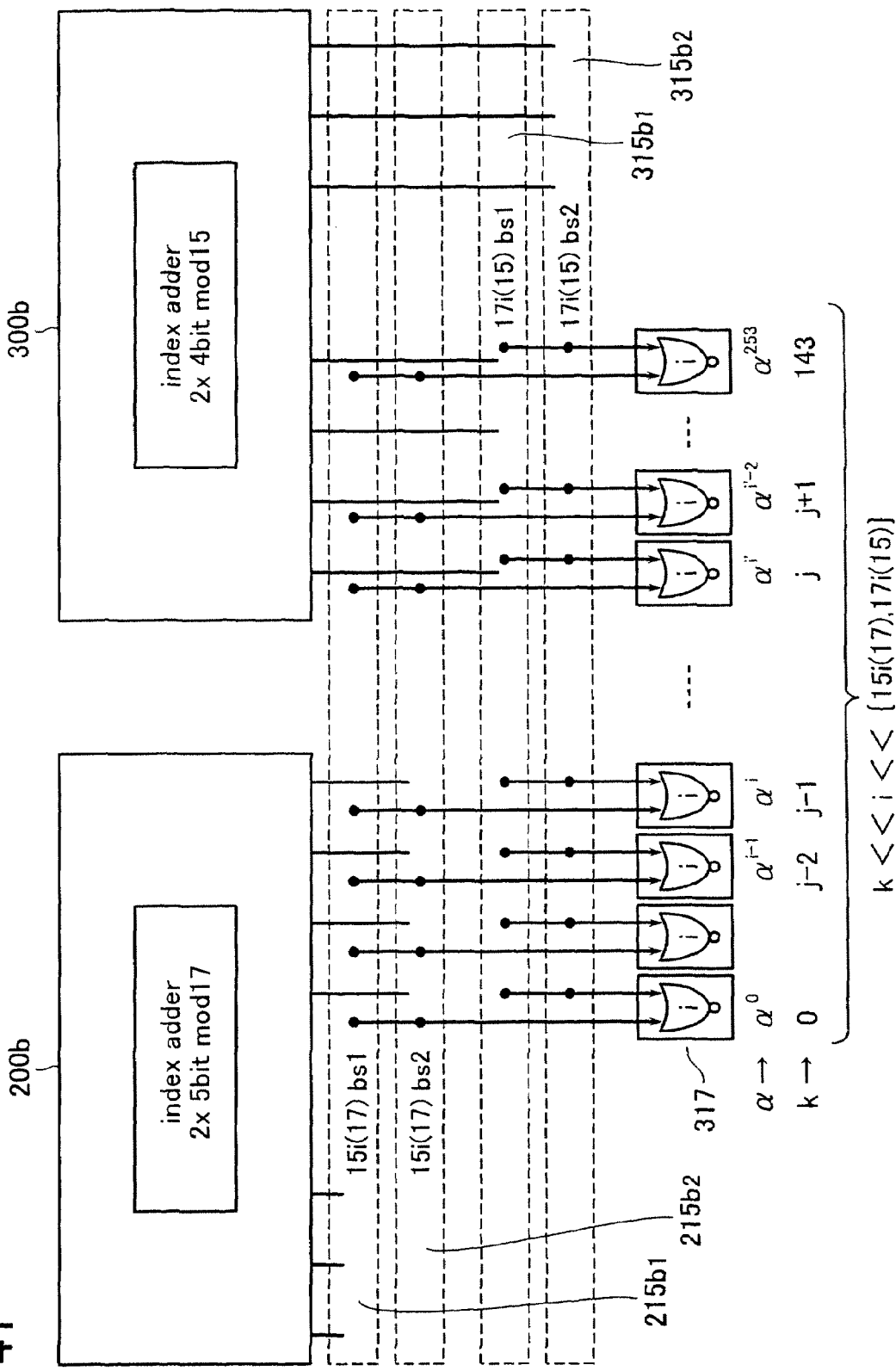
FIG. 41 shows error correction part for integrating the outputs of index adders shown in FIGS. 36 and 39 to output error bit location signals.

FIG. 41 shows such a part that integrates the operation results of the index adders 200b and 300b, and detecting error location "y" as a bit position. Outputs of the index adders 200b and 300b are output to $15i(17)$ buses 215b1, 215b2 and $17i(15)$ buses 315b1, 315b2, respectively.

It is apparent from the table as described above, which shows the relationship between "k", "i", $15i(17)$ and $17i(15)$, that "i" is uniquely designated by a pair of signals on these buses. Since it is possible to specify "k" from the combination of $\{15i(17), 17i(15)\}$, there is prepared decoder circuit 317 to detect "k". $\alpha^i$ becomes the final output of the operation result. One or two "k" is selected, and it designates error locations up to 2 bits.

Figure 42:
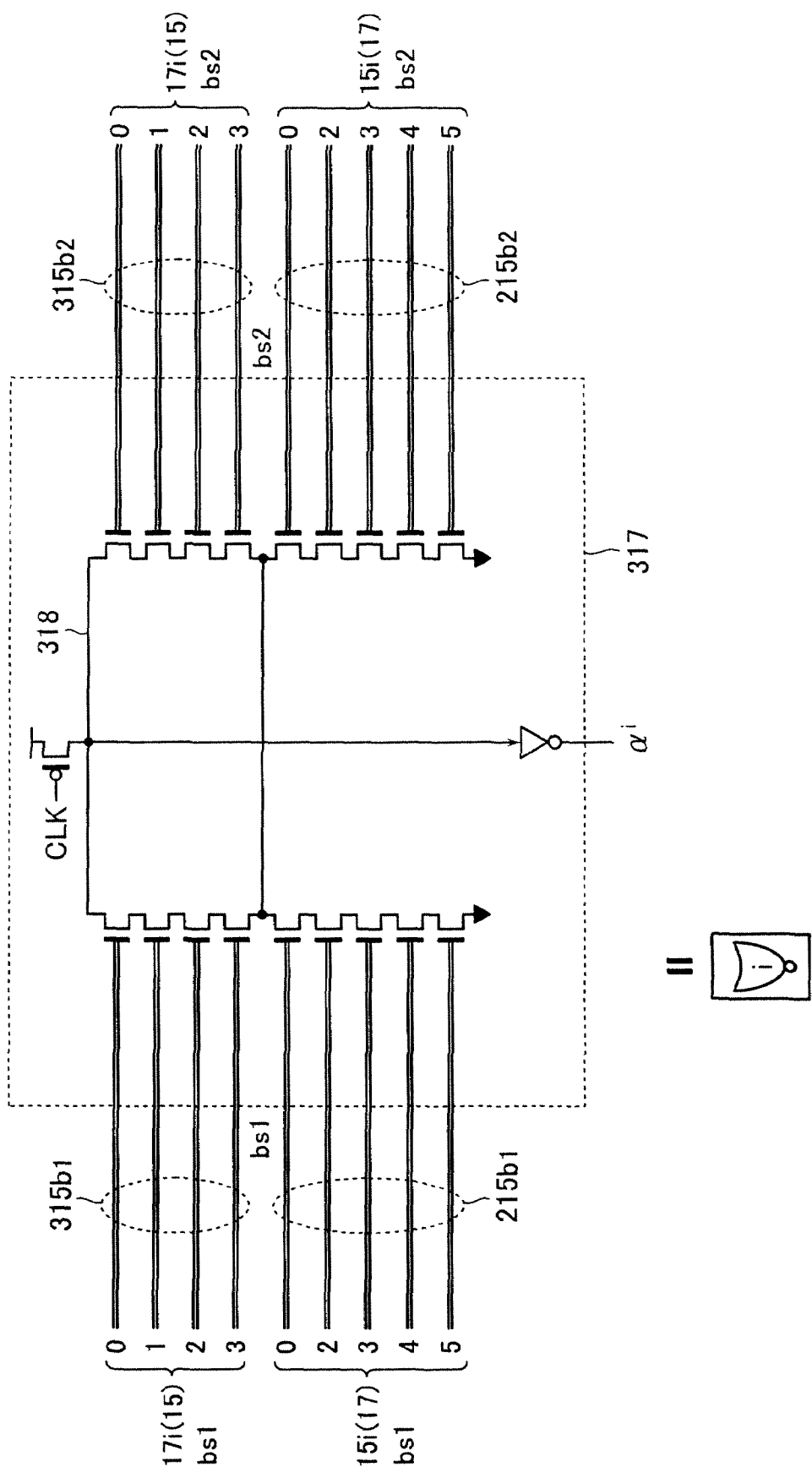
FIG. 42 shows the decoder used in FIG. 41.

FIG. 42 shows an example of the decoder circuit 317. NAND strings are disposed in parallel for two buses 315b1 and 315b2 corresponding to $17yn(15)$, and signal wirings corresponding to "i" are coupled to gates thereof. Further disposed in parallel with this NAND strings are other NAND strings, and signal wirings corresponding to "i" are coupled to gates thereof. This so-called OR-NAND circuit detects whether the CLK precharged node 318 is discharged or not, thereby selecting "i". The signal at node 318 is inverted and output as $\alpha^i$.

FIG. 43 shows a summarized relationship between $15i(17)$, $17i(15)$, "i" and "k", in which bit position indexes "i" are arranged in order of physical bit positions "k", and remainder class indexes $15i(17)$ and $17i(15)$ also are shown as corresponding to the respective "i".

Figure 44:
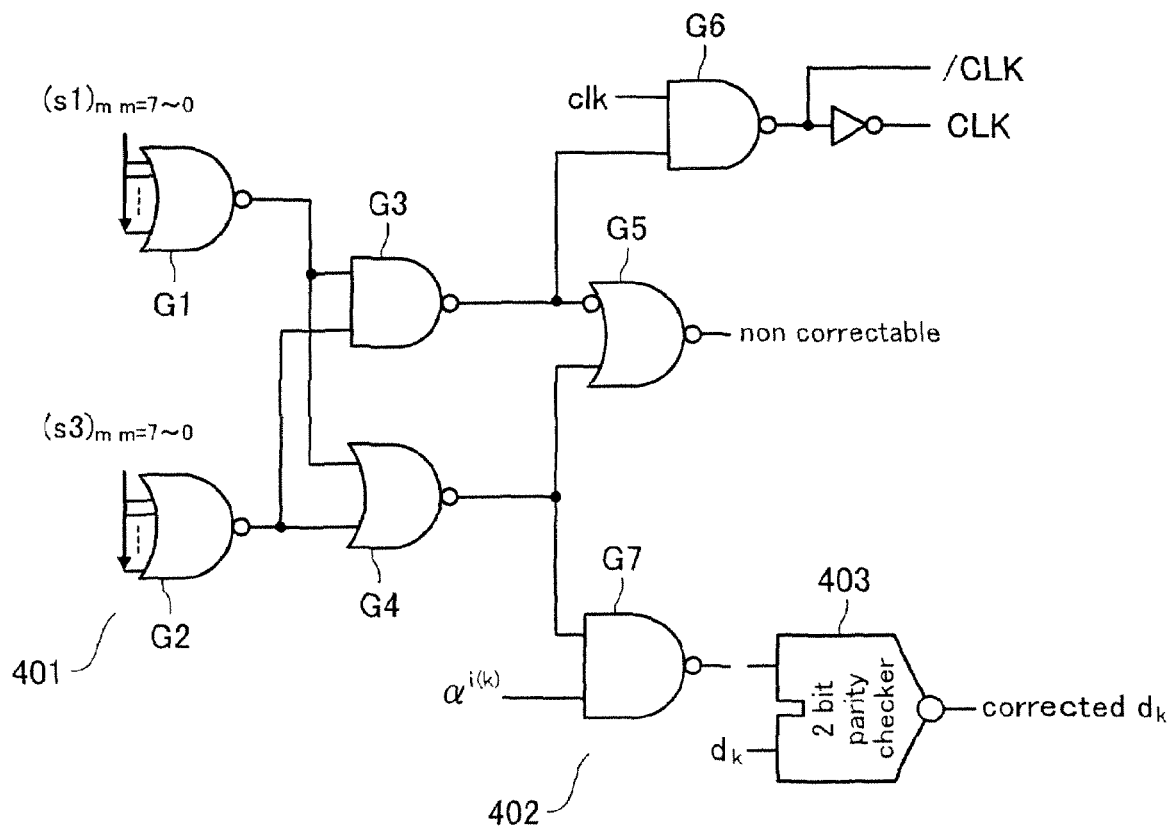
FIG. 44 shows the error correction circuit.

A circuit for finally error-correcting based on the above-described operation result is shown in FIG. 44. The error correction circuit has different operations from each other in accordance with the syndrome operation results. In case $S_1 \times S_3$ is not 0, one or two errors has been generated, and error correction is performed. In case of $S_1 \times S_3=0$, there are two modes as follows: if $S_1=S_3=0$, there is no error, and it is no need of error-correcting; and if either one of $S_1$ and $S_3$ is 0, there are three or more errors, and it is not correctable.

To judge these situations, a judge circuit 401 with NOR gates G1 and G2 is prepared for detecting such a situation that all of the coefficients $(s1)_m$ and $(s3)_m$ of the syndrome polynomials is "0". In case there are three or more error bits, one of the outputs of NOR gate G1 and G2 becomes "0", and in response to it, NOR gate G5 outputs "1" that designates a non correctable state. In this case, NOR gate G4 outputs "0", and this makes the error-correction use decode circuit 402 inactive.

In case there is no error, both outputs of NOR gates G1 and G2 are "1", and NOR gates G4 and G5 also output "0", thereby making the decode circuit 402 with NAND gate G7 inactive.

If there is one bit error or two bit errors, both gates G1 and G2 output "0", and output "1" of NOR gate G4 makes the decode circuit 402 active. To invert dada $d_k$ at the bit position "k" selected by $a_i$, an inverting circuit 403 is prepared, which uses a two-bit parity check circuit. With this inverting circuit 403, in case there is no error, data $d_k$ is output as it is while data $d_k$ is inverted to be output at the error position.

To make the error location searching operation circuitry active only when it is required, there is disposed a NAND gate G6 for controlling clock transmission. In case of no error ($S_1=S_3=0$), i.e., the highest possibility, this NAND gate G6 is fixed to output clock CLK="L". That is, when NAND gate G3 outputs "L", NAND gate G6 becomes inactive, and clock CLK is set to be "L". With this control, wasteful charge/discharge in each decoder in the error location searching circuit will be inhibited.

According to this embodiment, the calculation scale and time of the ECC circuit with 2EC-BCH code will be effectively made less. That is, to perform error location searching in this embodiment, product and quotient operations of elements in GF(256) are executed as addition and subtraction operations with respect to indexes of the elements. In this case, 255 is divided into prime factors 15 and 17, and object numbers multiplied by 15 are subjected to addition/subtraction with modulo 17; other object numbers multiplied by 17 are subjected to addition/subtraction with modulo 15. These addition/subtraction operations are performed in parallel, and the final addition/subtraction result with modulo 255 will be obtained from the results of two systems of the addition/subtraction operations.

As a result, the circuit for performing addition/subtraction of indexes will be effectively reduced in the circuit scale.

Figure 45:
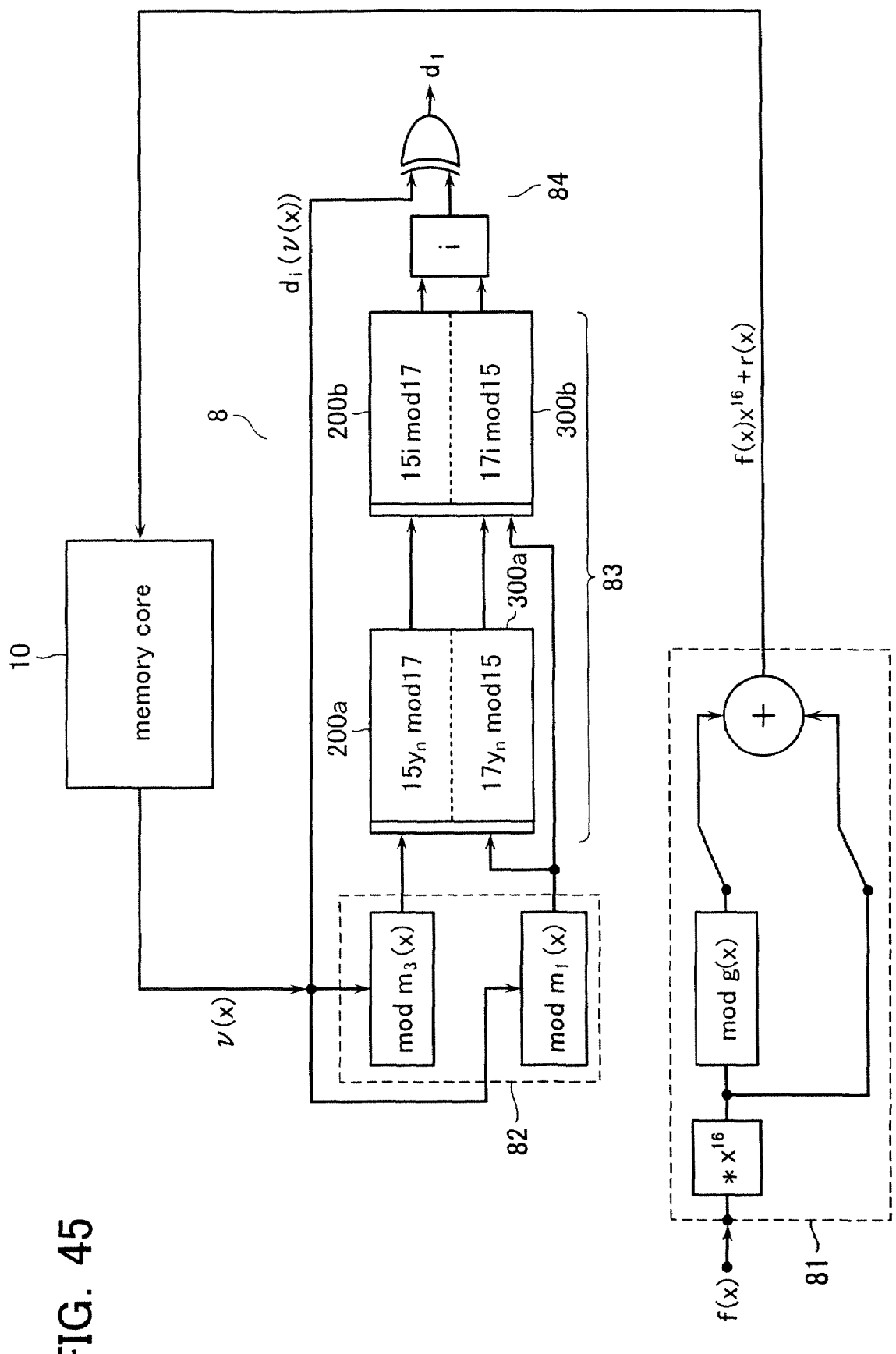
FIG. 45 is a diagram showing a configuration of the ECC system relating to one block memory core.

FIG. 45 shows a functional block configuration of ECC system 8 in the embodiment described above, in which memory core 10 is shown as one block. In encoding part 81, data polynomial $f(x)x^{16}$ based on the information polynomial $f(x)$ is divided by code generation polynomial $g(x)$ to generate check bits as coefficients of the remainder polynomial $r(x)$, which are written into the memory core 10 together with to-be-written data.

Read out data from the memory core 10, which is expressed by $v(x)$, are input to syndrome operation part 82 to be subjected to syndrome operations. In the index calculation part 83 for searching error location(s) based on the obtained syndrome coefficients, parallel operations are performed with index adders 200a and 300a; and parallel operations for the operation results are further performed with index adders 200b and 300b.

Error correcting part 84 inverts bit data at the error position.

This invention is applicable to any types of electrically erasable programmable semiconductor memory devices other than the flash memory as discussed in the above-noted embodiment.

Figure 46:
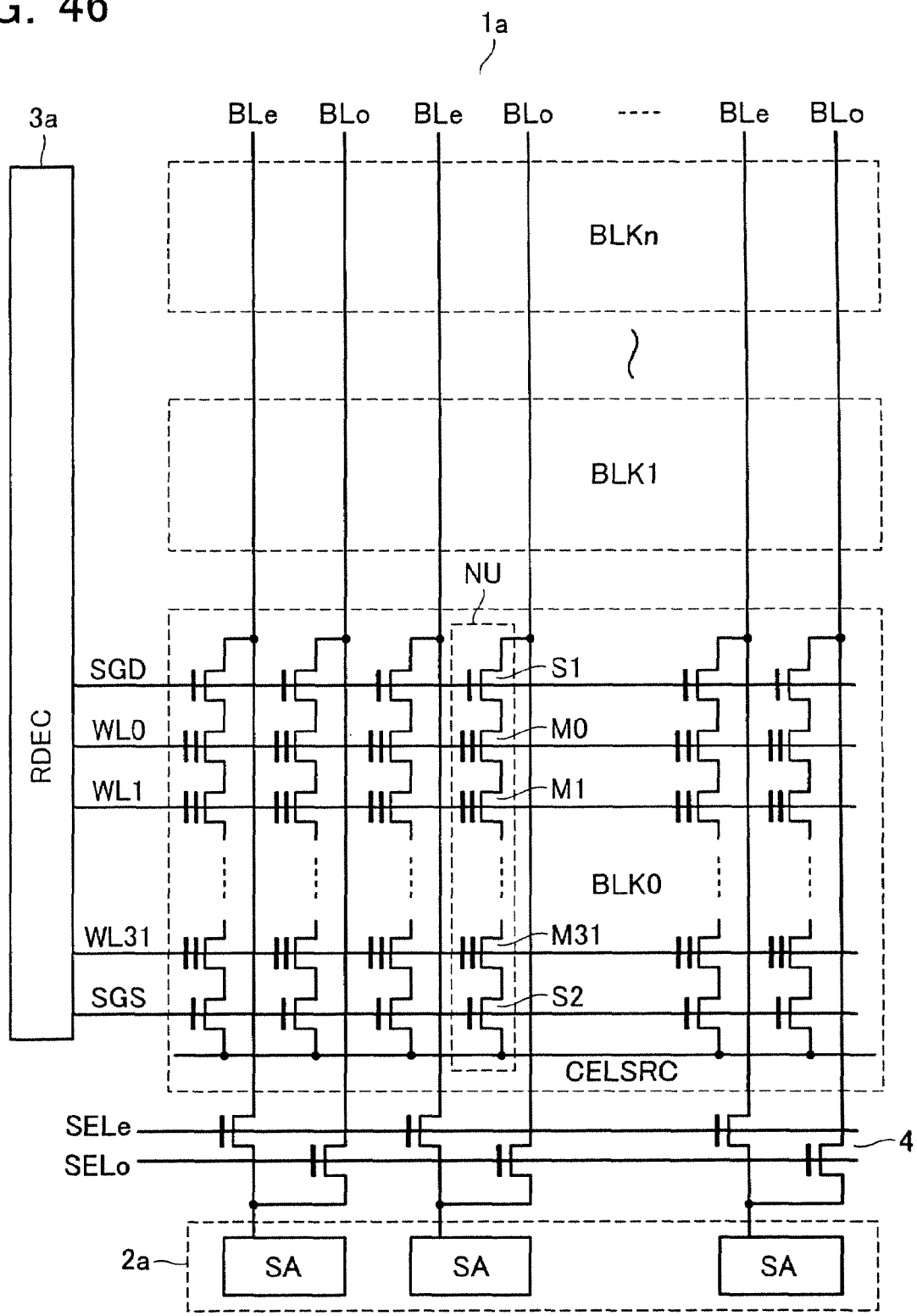
FIG. 46 shows another memory core configuration.

FIG. 46 shows a configuration of one typical memory core circuit in a standard NAND flash memory, to which this invention is adaptable. This memory core circuit includes cell array 1a, sense amplifier circuit 2a and row decoder 3a. Cell array 1a is configured from parallel combination of NAND cell units (NAND strings) each having a serial connection of memory cells M0 to M31. NAND cell unit NU has one end connected to an associated bit line BLe (BLo) through a select gate transistor S1 and the other end coupled a common source line CELSRC via another select gate transistor S2.

The memory cells have control gates, which are connected to word lines WL0-WL31. The select gate transistors S1-S2 have their gates coupled to select gate lines SGD and SGS, respectively. Word lines WL0-WL31 and select-gate lines SGD-SGS are driven by the row decoder 3a.

The sense amp circuit 2a has one page of sense units SA for performing "all-at-a-time" writing and reading. Each sense unit SA is associated with a bit line selector circuit 4, which selects either one of adjacent bit lines BLe-BLo for connection thereto. With such an arrangement, memory cells simultaneously selected by a single word line WLi and a plurality of even-numbered bit lines BLe (or odd-numbered bitlines BLo) constitute a page (one sector), which is subjected to a collective writing/reading. Bit lines on the non-select side are used as shield lines with a prespecified potential being given thereto. This makes possible to suppress unwanted interference between the presently selected bit lines.

A group of NAND cell units sharing the word lines WL0-WL31 makes up a block, i.e., a unit for data erasure. As shown in FIG. 46, a predetermined number, n, of blocks BLK0-BLKn are laid out in the extending direction of the bit lines.

In the NAND flash memory with the core circuit also, the need grows for on-chip realization of correction of 2 bits or more errors with advances in the miniaturization and in per-cell multi-level storage scheme. The error correction system incorporating the principles of this invention is capable of reducing or minimizing the calculation scale for error detection and correction, thereby enabling successful achievement of computation at high speeds. Thus it can be said that the ECC architecture unique to the invention offers advantages upon application to memory chips of the type stated supra.

Since the above-described parallel operation method uses a general property with respect to the remainder class of the finite Galois field, it is not limited to 2EC-BCH system on GF(256), but is able to be adapted to other systems. For example, t(>=2)-error correcting BCH code may be used in general. In this case, it becomes such a BCH code on GF(256) that has t-element of $\alpha, \alpha^3, \ldots, \alpha^{2t-1}$ as roots thereof.

[Application Devices]

As an embodiment, an electric card using the non-volatile semiconductor memory devices according to the above-described embodiments of the present invention and an electric device using the card will be described bellow.

Figure 47:
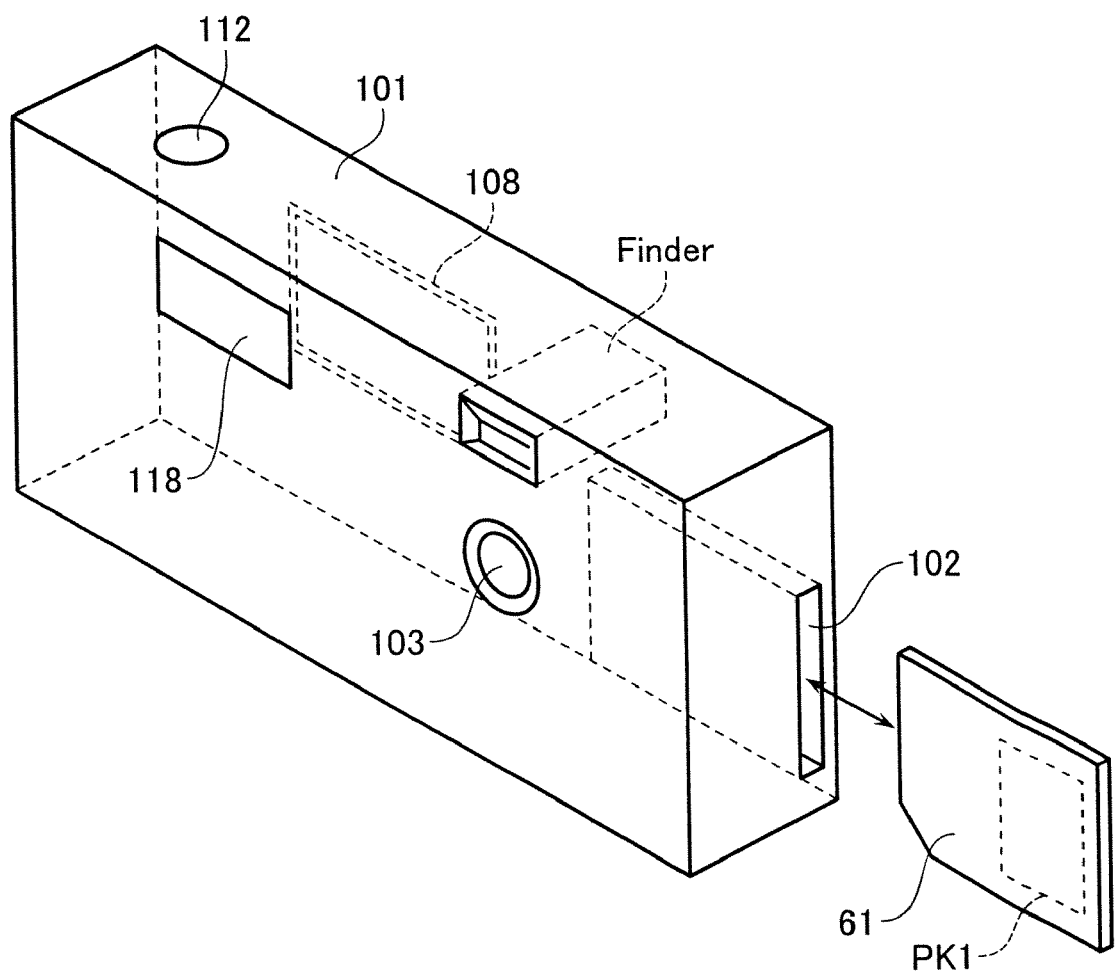
FIG. 47 shows another embodiment applied to a digital still camera.

FIG. 47 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 48:
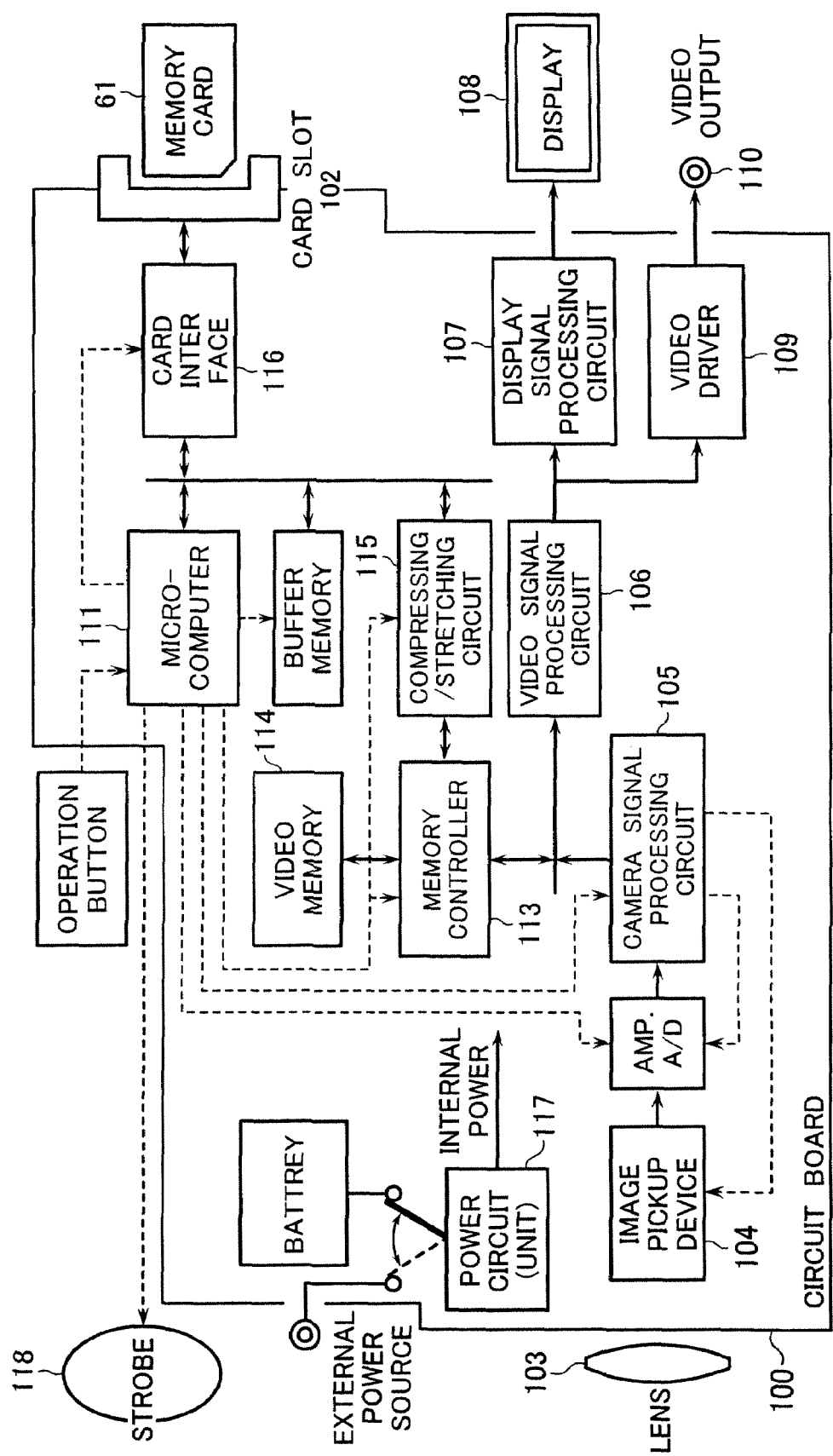
FIG. 48 shows an internal configuration of the digital still camera.
Figure 49A:
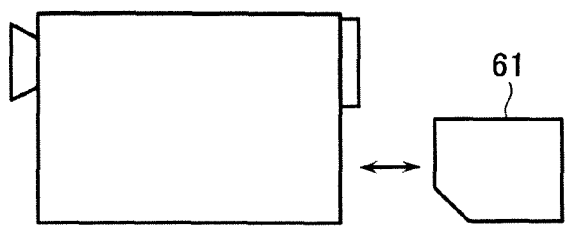
FIGS. 49A to 49J show other electric devices to which the embodiment is applied.
Figure 49F:
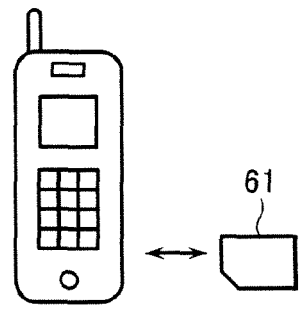
Figure 49B:
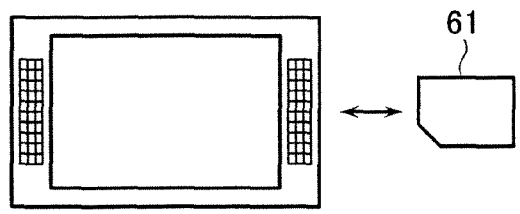
Figure 49G:
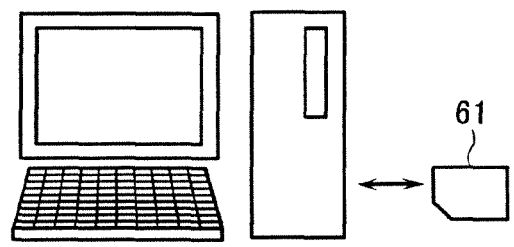
Figure 49C:
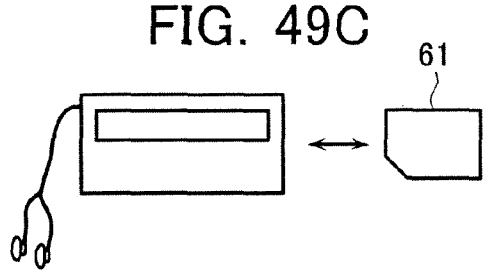
Figure 49H:
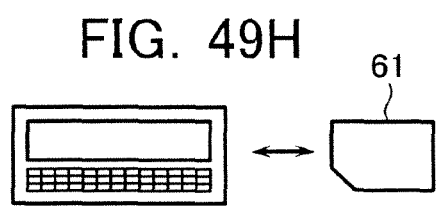
Figure 49D:
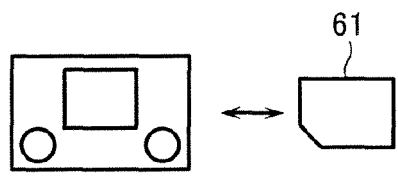
Figure 49I:
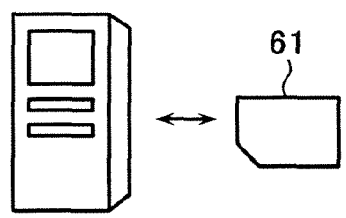
Figure 49E:
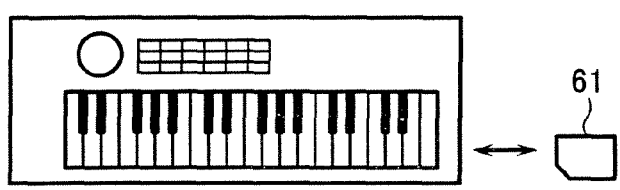
Figure 49J:
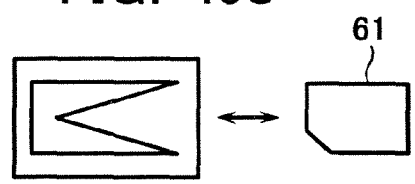

FIG. 48 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance (AWB) control, color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 49A to 49J, as well as in portable electric devices. That is, the electric card can also be used in a video camera shown in FIG. 49A, a television set shown in FIG. 49B, an audio apparatus shown in FIG. 49C, a game apparatus shown in FIG. 49D, an electric musical instrument shown in FIG. 49E, a cell phone shown in FIG. 49F, a personal computer shown in FIG. 49G, a personal digital assistant (PDA) shown in FIG. 49H, a voice recorder shown in FIG. 49I, and a PC card shown in FIG. 49J.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising an error detection and correction system with an error correcting code over Galois field $GF(2^n)$, wherein the error detection and correction system includes an operation circuit configured to execute addition/subtraction with modulo $2^n-1$, and wherein the operation circuit includes a first operation part for performing addition/subtraction with modulo M and a second operation part for performing addition/subtraction with modulo N (where M and N are integers, which are prime with each other as being obtained by factorizing $2^n-1$, the first and second operation parts being for performing addition/subtraction simultaneously in parallel with each other to output an operation result of the addition/subtraction with modulo $2^n-1$, and wherein the first and second operation parts each comprises an adder circuit, which is configured to output a sum of two numbers to-be-added as a remainder of modulus thereof, and wherein the adder circuit includes a correction circuit for adding a complement to the sum when it becomes modulus number thereof or more.

2. The semiconductor memory device according to claim 1, wherein the error detection and correction system is formed to have a 2-bit error correction BCH code, which is configured in such a manner that a certain number of degrees are selected as information bits to be simultaneously error-correctable in the memory device from the entire degree of an information polynomial with degree numbers corresponding to error-correctable maximum bit numbers.

3. The semiconductor memory device according to claim 1, wherein the error detection and correction system is formed to have a 2-bit error correction BCH code over Galois field GF(256), and wherein the operation circuit is configured in an error location searching circuit, which searches index "n" of root $\alpha^n$ in GF(256) satisfying an error searching equation of: $x^2 + S_1 x + (S_3 + S_1^3)/S_1 = 0$ (where, $S_1$ and $S_3$ are syndrome coefficients decoded from read out data of the memory device).

4. The semiconductor memory device according to claim 3, wherein the error location searching circuit comprises first and second operation circuits serially coupled in such a way that operation results of the former are input to the latter, and wherein the first operation circuit is for comparing index $\sigma_3 - 3\sigma_1$ obtained from syndromes and index $y_n$ obtained based on the variable conversion of $x = \alpha^{\sigma_1} y$, thereby searching the index $y_n$ corresponding to an error location, the first operation circuit comprising:

a first adder circuit for adding $15\sigma_3$ to $-45\sigma_1$ with modulo 17; and a second adder circuit for adding $17\sigma_3$ to $-51\sigma_1$ with modulo 15 simultaneously in parallel with the first adder circuit, thereby calculating a congruence of: $y_n \equiv \sigma_3 - 3\sigma_1$ (mod 255) together with the first adder circuit, and wherein the second operation circuit is for restoring the index $y_n$ to real index "i" corresponding to the error location, the second operation circuit comprising:

a third adder circuit for adding 15n to $15\sigma_1$ with modulo 17; and a fourth adder circuit for adding 17n to 17σ₁ with modulo 15 simultaneously in parallel with the third adder circuit, thereby calculating another congruence of: i≡n+σ₁ (mod 255) together with the third adder circuit.

5. The semiconductor memory device according to claim 4, wherein the first to fourth adder circuits are binary adders, and wherein the first operation circuit further comprises first and second decoder circuits disposed on the input sides of the first and second adder circuits, respectively, which decode input data and convert them to binary data, and the second operation circuit further comprises third and fourth decoder circuits disposed on the input sides of the third and fourth adder circuits, respectively, which decode input data and convert them to binary data.

6. The semiconductor memory device according to claim 1, wherein the memory device is a non-volatile semiconductor memory, in which electrically rewritable and non-volatile memory cells are arranged.

7. The semiconductor memory device according to claim 6, wherein the non-volatile semiconductor memory includes a cell array with NAND cell units arranged therein, the NAND cell unit having a plurality of memory cells connected in series.

8. The semiconductor memory device according to claim 6, wherein the non-volatile semiconductor memory stores such multi-level data that two or more bits are stored in each memory cell.

9. A semiconductor memory device comprising a cell array with electrically rewritable and non-volatile memory cells arranged therein, and an error detection and correction system, which is correctable up to 2-bit errors for read out data of the cell array by use of a BCH code over Galois field GF(256), wherein the error detection and correction system comprises:

an encoding part configured to generate check bits to be written into the cell array together with to-be-written data;

a syndrome operating part configured to execute syndrome operation for read out data of the cell array;

an error location searching part configured to search error locations in the read out data based on the operation result of the syndrome operating part; and an error correcting part configured to invert an error bit in the read out data detected in the error location searching part, and output it, and wherein the error location searching part includes an operation circuit configured to execute index addition/subtraction with modulo 255, and wherein the operation circuit includes a first adder circuit for performing addition/subtraction with modulo 17 and a second adder circuit for performing addition/subtraction with modulo 15, which perform addition/subtraction simultaneously in parallel with each other to output an operation result of the index addition/subtraction with modulo 255, and wherein the first and second adder circuits each comprises a correction circuit for adding a complement to the sum when it becomes modulus number thereof or more.

10. The semiconductor memory device according to claim 9, wherein the BCH code is configured in such a manner that a certain number of degrees are selected as information bits to be simultaneously error-correctable in the memory device from the entire degree 254 of an information polynomial with degree numbers corresponding to error-correctable maximal bit numbers so as to make a calculation scale of syndrome polynomials as small as possible.

11. The semiconductor memory device according to claim 9, wherein the error location searching part is for searching index "n" of root $\alpha^n$ over GF(256) satisfying an error searching equation of: $x^2 + S_1 x + (S_3 + S_1^3)/S_1 = 0$ (where, $S_1$ and $S_3$ are syndrome coefficients decoded from read out data of cell array).

12. The semiconductor memory device according to claim 11, wherein the error location searching part comprises first and second operation circuits serially coupled in such a way that operation results of the former are input to the latter, and wherein the first operation circuit is for comparing index $\sigma_3 - 3\sigma_1$ obtained from syndromes and index $y_n$ obtained based on the variable conversion of $x = \alpha^{\sigma_1} y$, thereby searching the index $y_n$ corresponding to an error location, the first operation circuit comprising:

a first adder circuit for adding 15σ₃ to −45σ₁ with modulo 17; and a second adder circuit for adding 17σ₃ to −51σ₁ with modulo 15 simultaneously in parallel with the first adder circuit, thereby calculating a congruence of: $y_n \equiv \sigma_3 - 3\sigma_1$ (mod 255) together with the first adder circuit, and wherein the second operation circuit is for restoring the index $y_n$ to real index "i" corresponding to the error location, the second operation circuit comprising:

a third adder circuit for adding 15n to 15σ₁ with modulo 17; and a fourth adder circuit for adding 17n to 17σ₁ with modulo 15 simultaneously in parallel with the third adder circuit, thereby calculating another congruence of: i≡n+σ₁ (mod 255) together with the third adder circuit.

13. The semiconductor memory device according to claim 12, wherein the first, second, third and fourth adder circuits are binary adders, and wherein the first operation circuit further comprises first and second decoder circuits disposed on the input sides of the first and second adder circuits, respectively, which decode input data and convert them to binary data; and wherein the second operation circuit further comprises third and fourth decoder circuits disposed on the input sides of the third and fourth adder circuits, respectively, which decode input data and convert them to binary data.

14. The semiconductor memory device according to claim 9, wherein the cell array has NAND cell units arranged therein, the NAND cell unit having a plurality of memory cells connected in series.

15. The semiconductor memory device according to claim 9, wherein the cell array stores such multi-level data that two or more bits are stored in each memory.

* * * * *